(12) United States Patent
Shino

(10) Patent No.: US 7,795,658 B2
(45) Date of Patent: Sep. 14, 2010

(54) SEMICONDUCTOR MEMORY DEVICE AND MANUFACTURING METHOD THEREOF

(75) Inventor: Tomoaki Shino, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 358 days.

(21) Appl. No.: 11/677,329

(22) Filed: Feb. 21, 2007

(65) Prior Publication Data

US 2007/0200157 A1  Aug. 30, 2007

(30) Foreign Application Priority Data

Feb. 28, 2006  (JP)  .............................. 2006-053460
Oct. 11, 2006  (JP)  .............................. 2006-277743

(51) Int. Cl.
*H01L 29/94* (2006.01)

(52) U.S. Cl. ...................... 257/296; 257/347

(58) Field of Classification Search ............. 257/66–71, 257/72, 311–326, 328, 347, 350–351, E29.17, 257/E27.084–E27.097, E27.075, E27.078, 257/E29.3–E29.309, E27.076, E27.098–E27.101, 257/E27.077, 296–309, 905–908, 225–234, 257/390; 438/238–239, 386, 399

See application file for complete search history.

(56) References Cited

U.S. PATENT DOCUMENTS

| | | | |
|---|---|---|---|
| 6,121,661 A * | 9/2000 | Assaderaghi et al. | 257/355 |
| 7,075,820 B2 | 7/2006 | Yamada et al. | |
| 7,187,594 B2 * | 3/2007 | Shibata et al. | 365/189.05 |
| 7,385,251 B2 * | 6/2008 | Chang et al. | 257/347 |
| 2004/0227248 A1 | 11/2004 | Fukuzumi et al. | |
| 2005/0121710 A1 | 6/2005 | Shino | |
| 2005/0133843 A1 | 6/2005 | Shino | |
| 2006/0081930 A1 * | 4/2006 | Maegawa et al. | 257/347 |
| 2006/0289918 A1 * | 12/2006 | McDaniel et al. | 257/296 |

FOREIGN PATENT DOCUMENTS

| | | |
|---|---|---|
| JP | 8-78692 | 3/1996 |
| JP | 2004-266190 | 9/2004 |
| JP | 2005-158869 | 6/2005 |
| JP | 2005-175090 | 6/2005 |
| JP | 2005-191451 | 7/2005 |
| JP | 2006-12991 | 1/2006 |

OTHER PUBLICATIONS

U.S. Appl. No. 12/015,171, filed Jan. 16, 2008, Shino.

* cited by examiner

*Primary Examiner*—Wai-Sing Louie
*Assistant Examiner*—Sue Tang
(74) *Attorney, Agent, or Firm*—Oblon, Spivak, McClelland, Maier & Neustadt, L.L.P.

(57) ABSTRACT

A semiconductor memory device includes a supporting substrate including semiconductor materials. The memory device also includes an insulation film provided above the supporting substrate. The memory device further includes a first diffusion layer provided on the insulation film. In addition, the memory device includes a second diffusion layer provided on the insulation film. The memory device additionally includes a body region provided between the first diffusion layer and the second diffusion layer. The body region is in an electrically floating state and accumulates or releases electric charges for storing data. Also, the memory device includes a semiconductor layer penetrating the insulation film and electrically connecting the second diffusion layer to the supporting substrate to release electric charges from the second diffusion layer. Further, the memory device includes a gate insulation film provided on the body region. Additionally, the memory device includes a gate electrode provided on the gate insulation film.

9 Claims, 108 Drawing Sheets

MEMORY CELL AREA

MEMORY CELL AREA

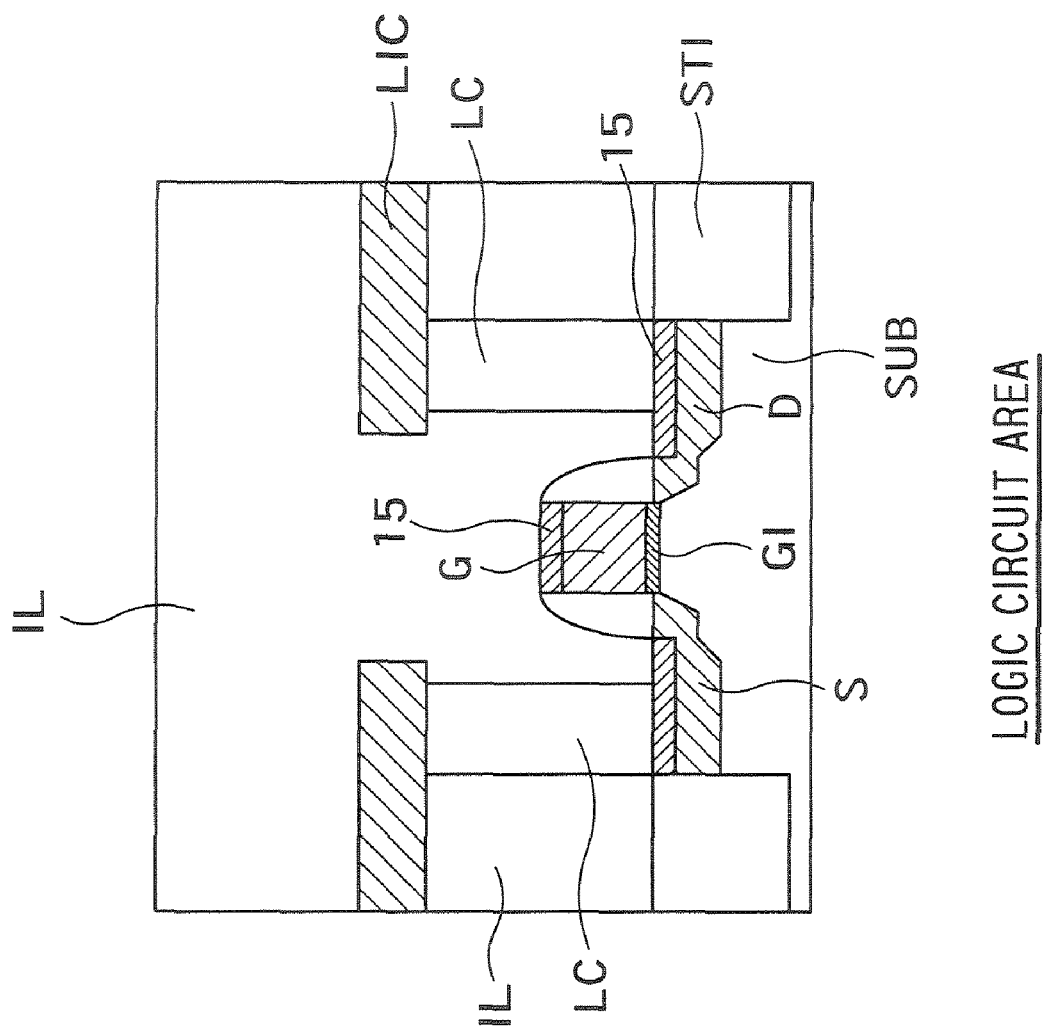

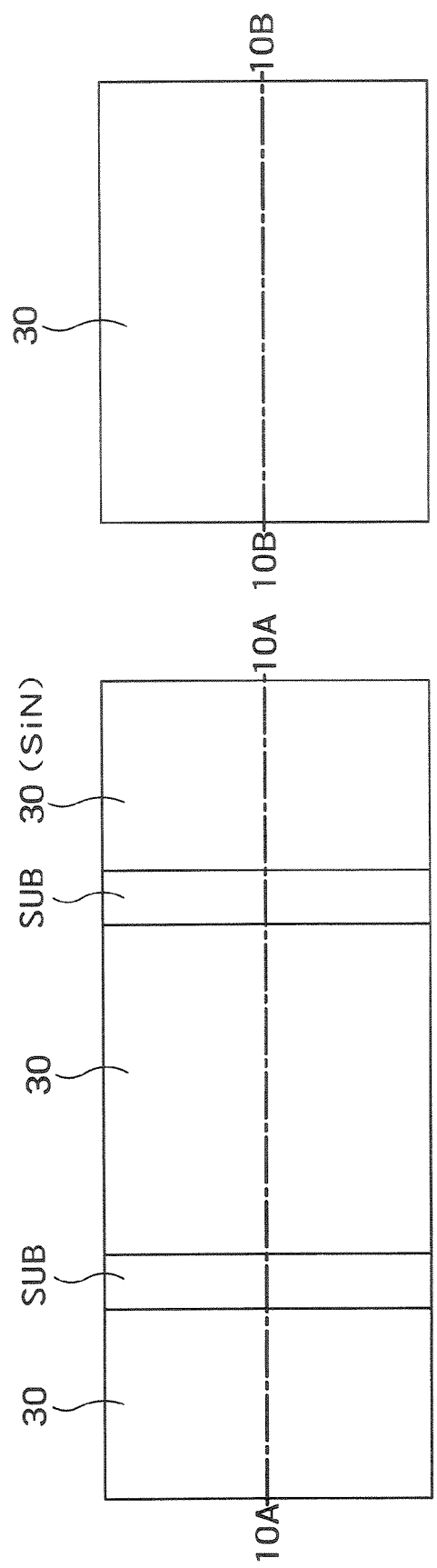

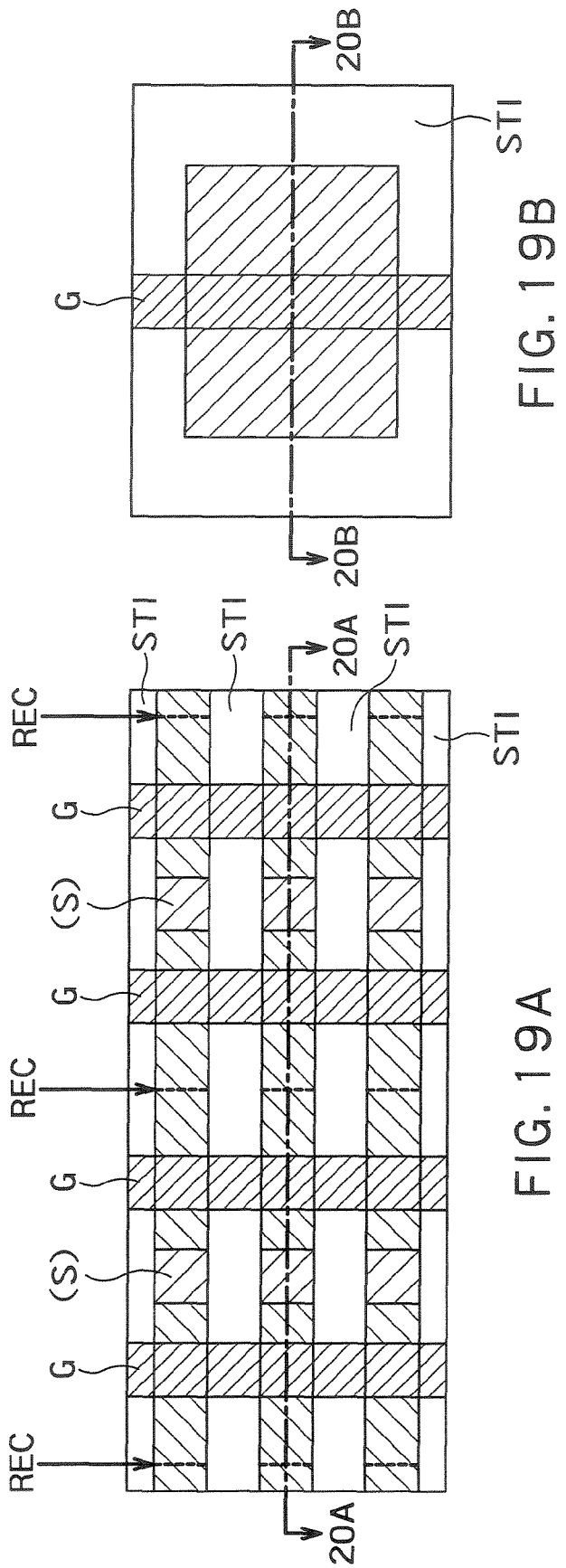

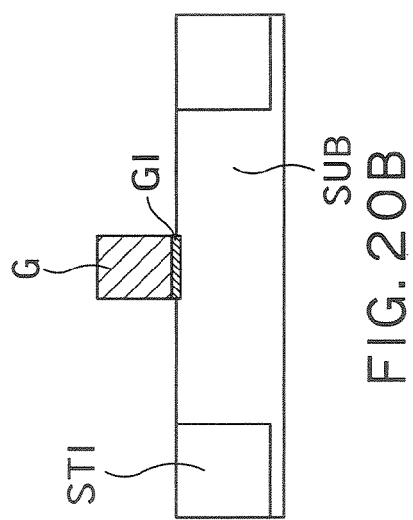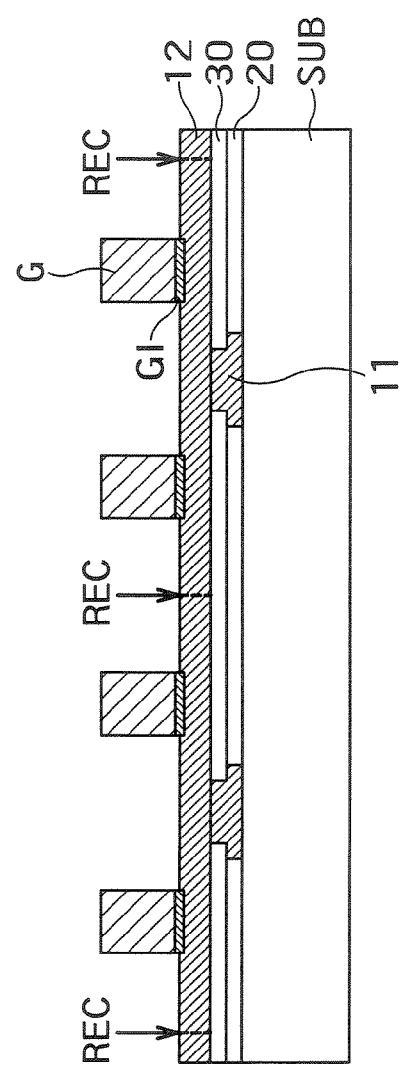

FBC MEMORY CELL AREA
SECOND EMBODIMENT

THIRD EMBODIMENT

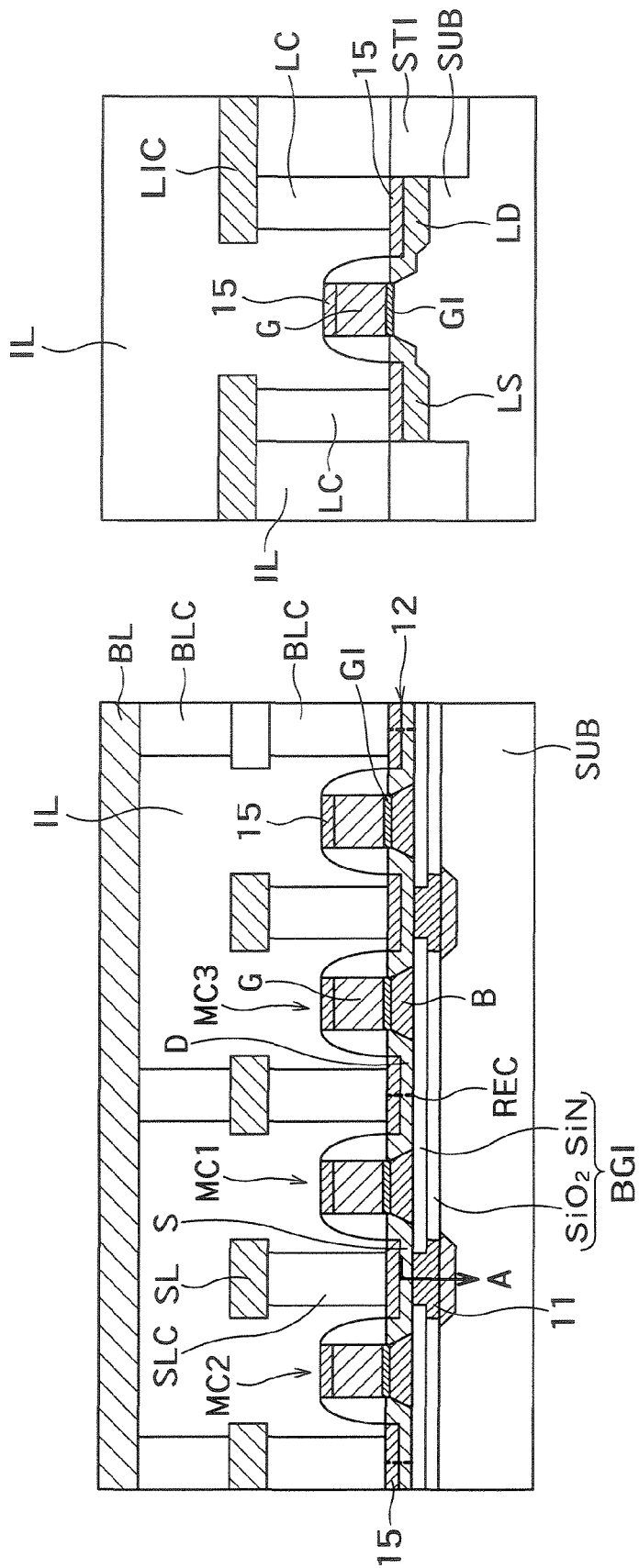

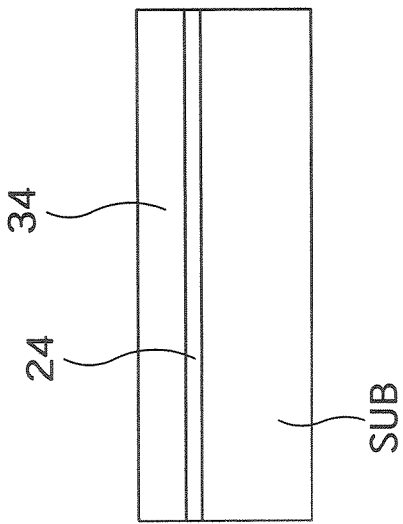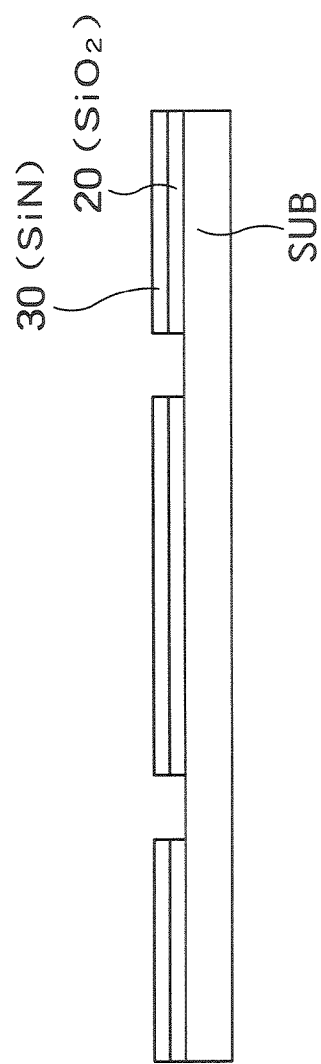

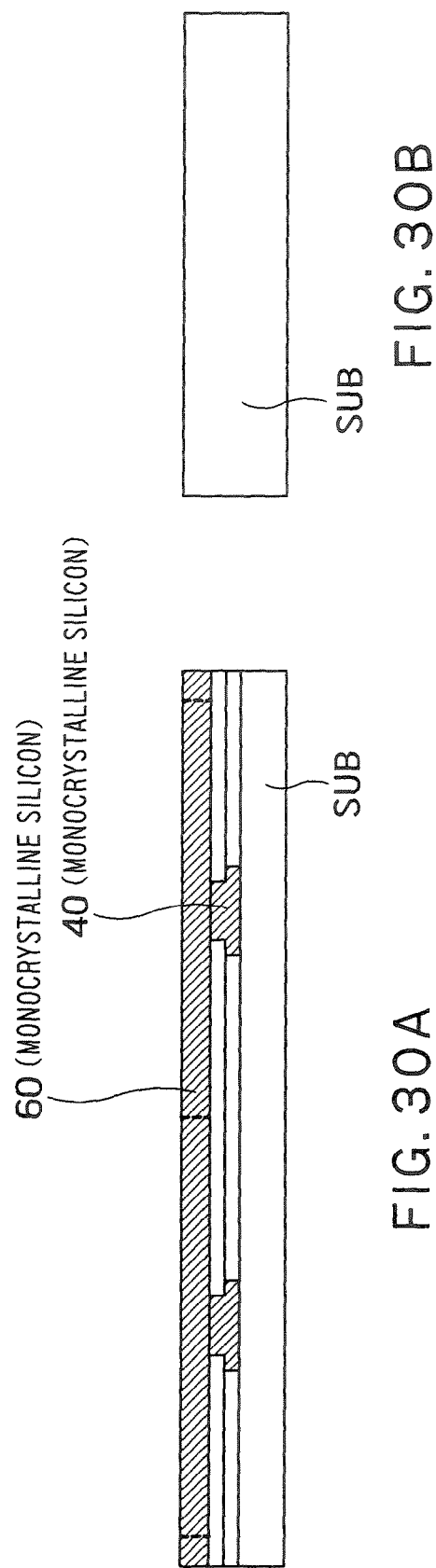

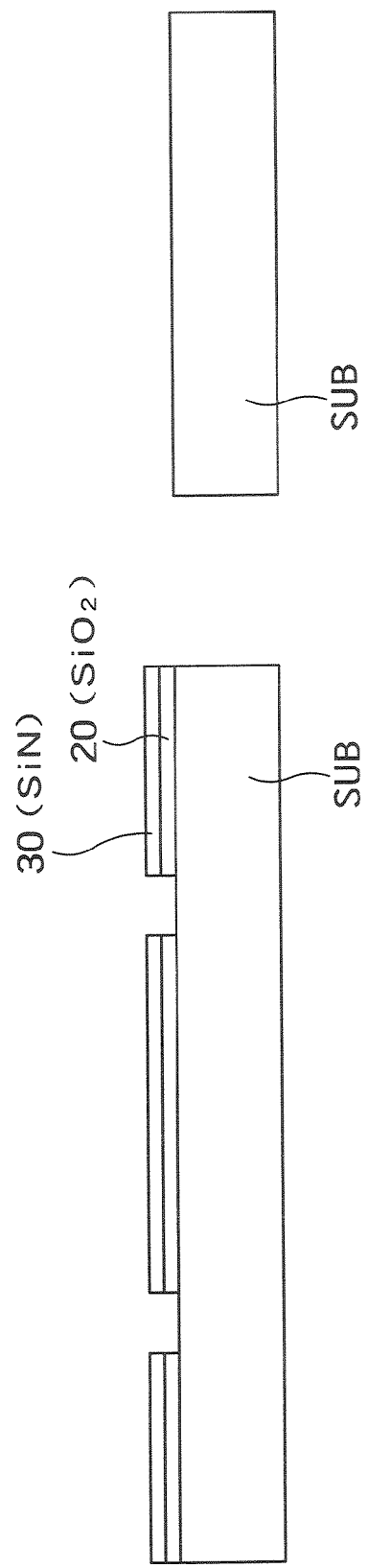

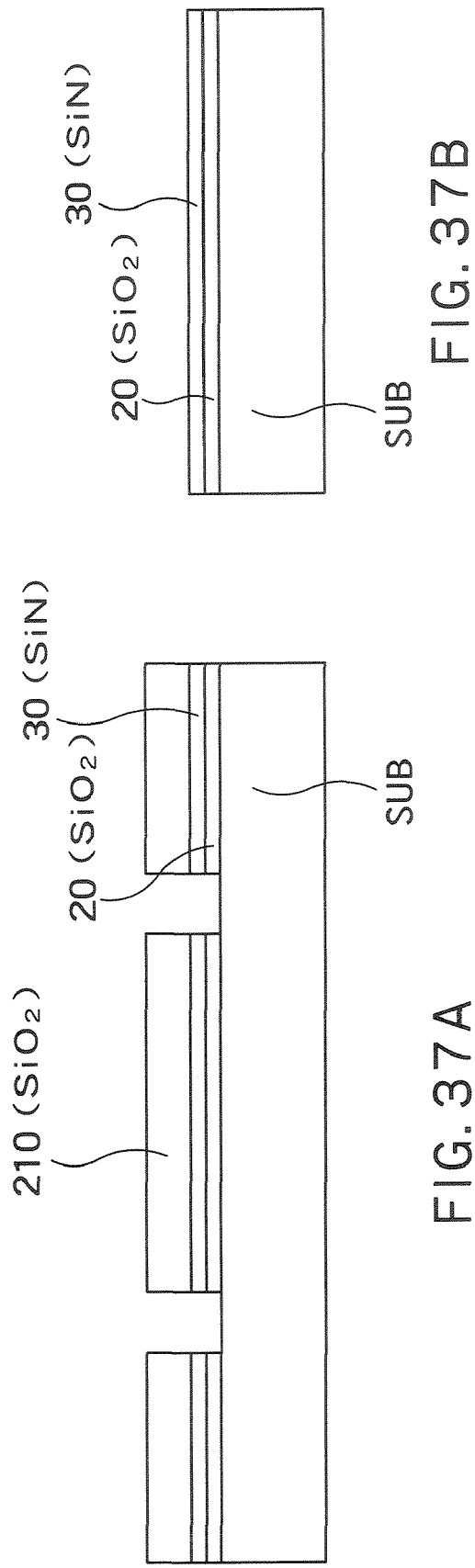

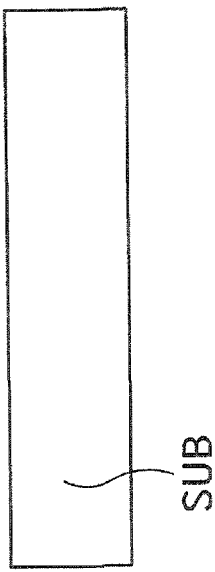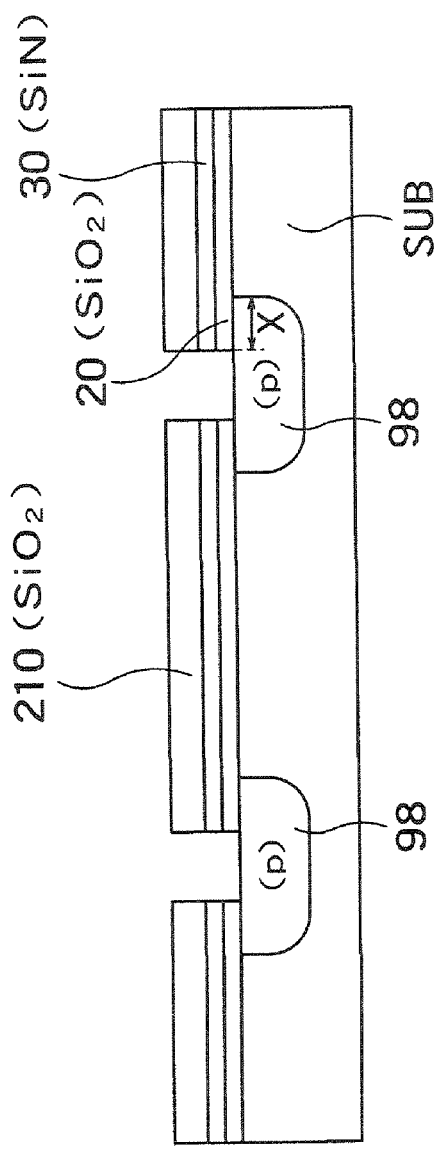

SEVENTH EMBODIMENT

LOGIC CIRCUIT AREA

MEMORY CELL AREA

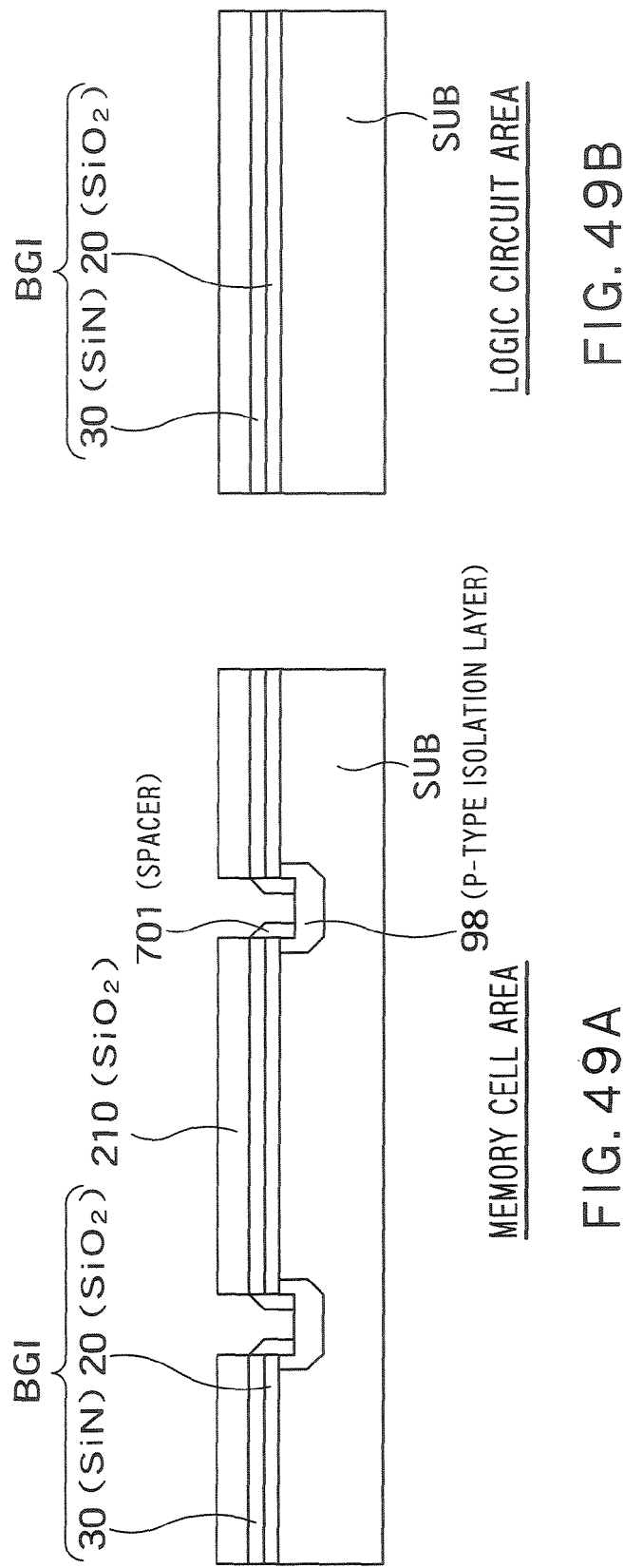

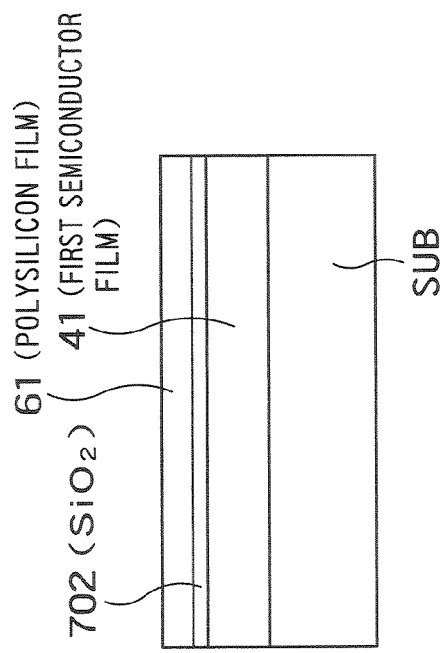
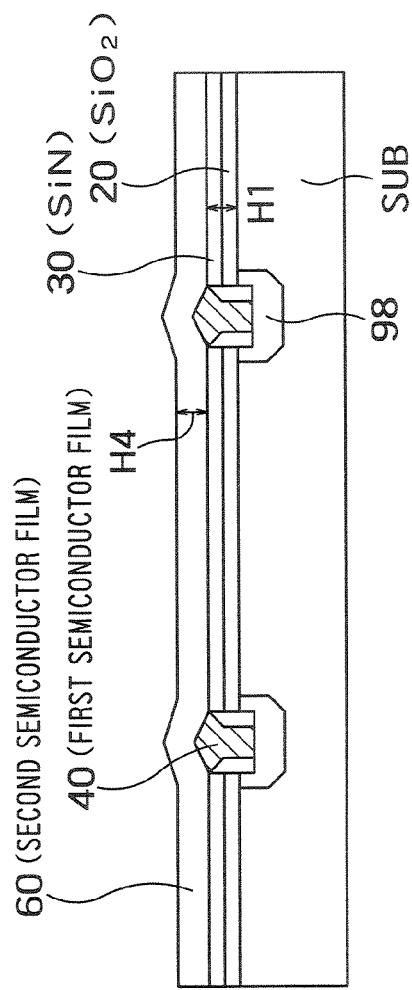
FIG. 51B
FIG. 51A

FIRST MODIFICATION OF THE NINTH EMBODIMENT

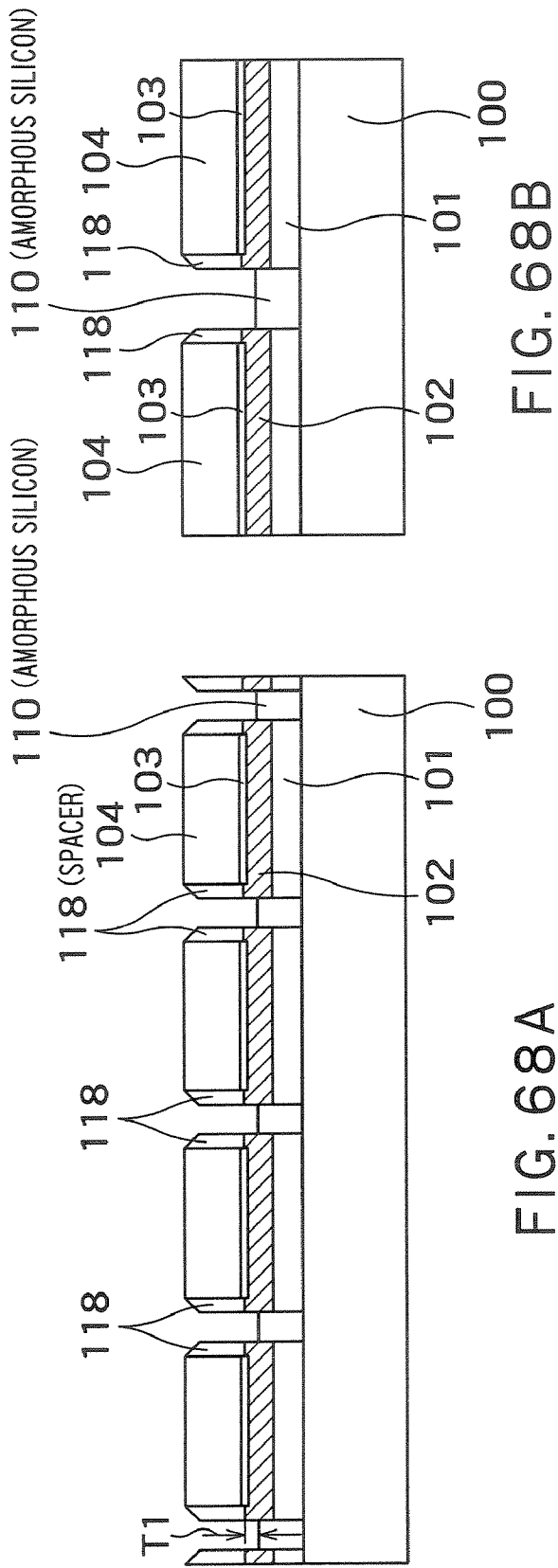

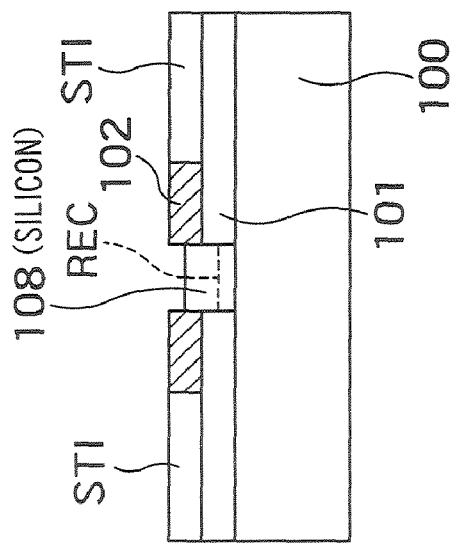
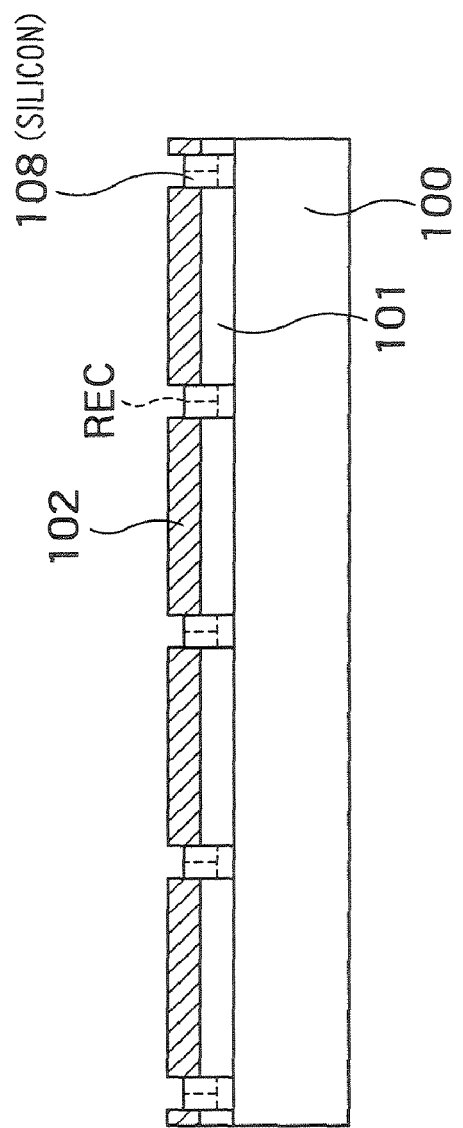
FIG. 69B
FIG. 69A

SECOND MODIFICATION OF THE NINTH EMBODIMENT

TENTH EMBODIMENT

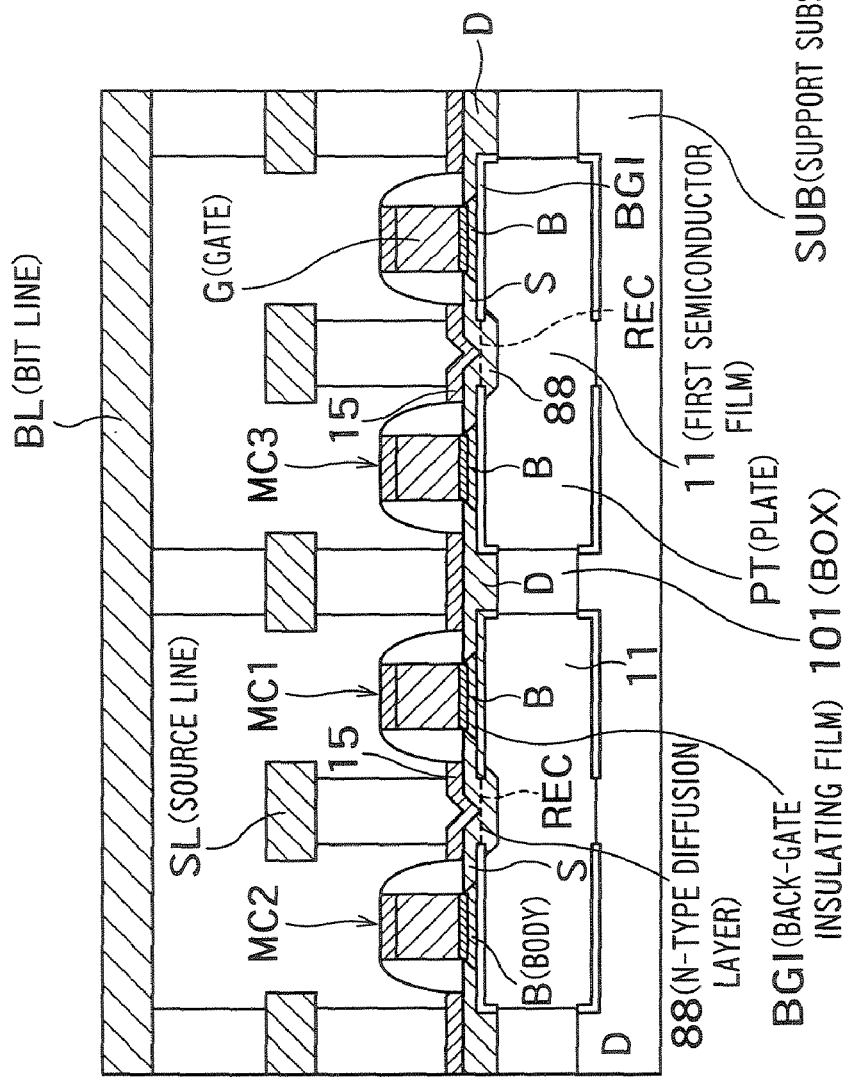
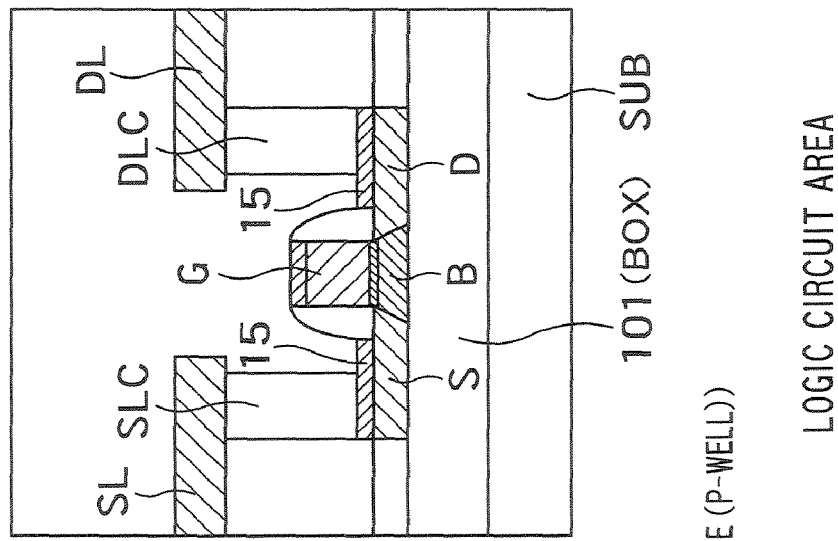
FIG. 72A MEMORY CELL AREA
FIG. 72B LOGIC CIRCUIT AREA

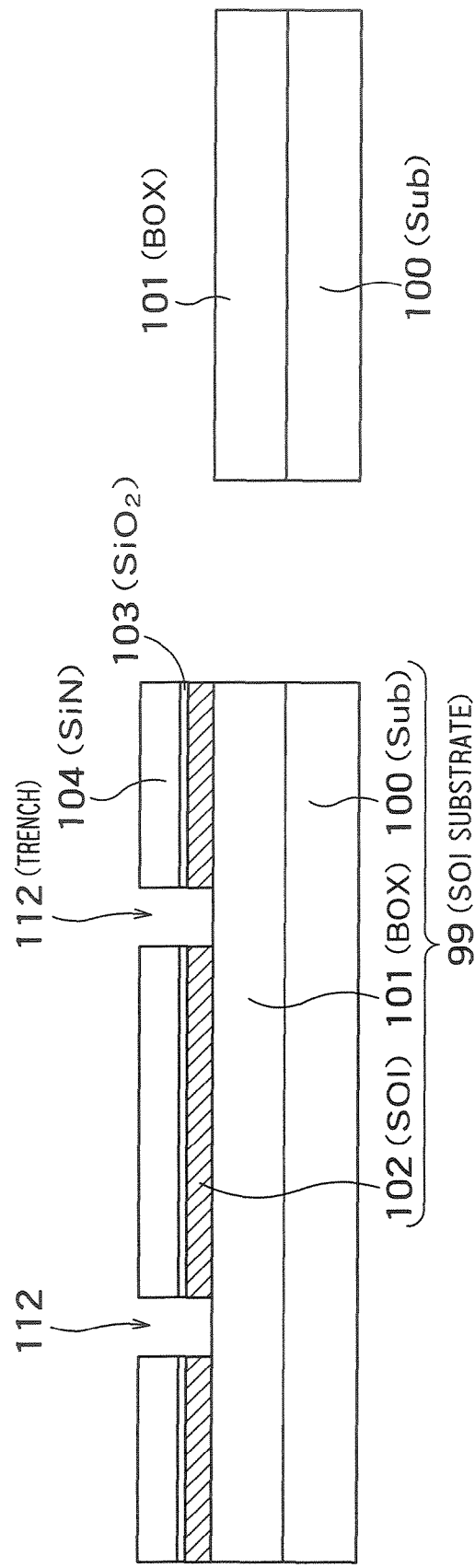

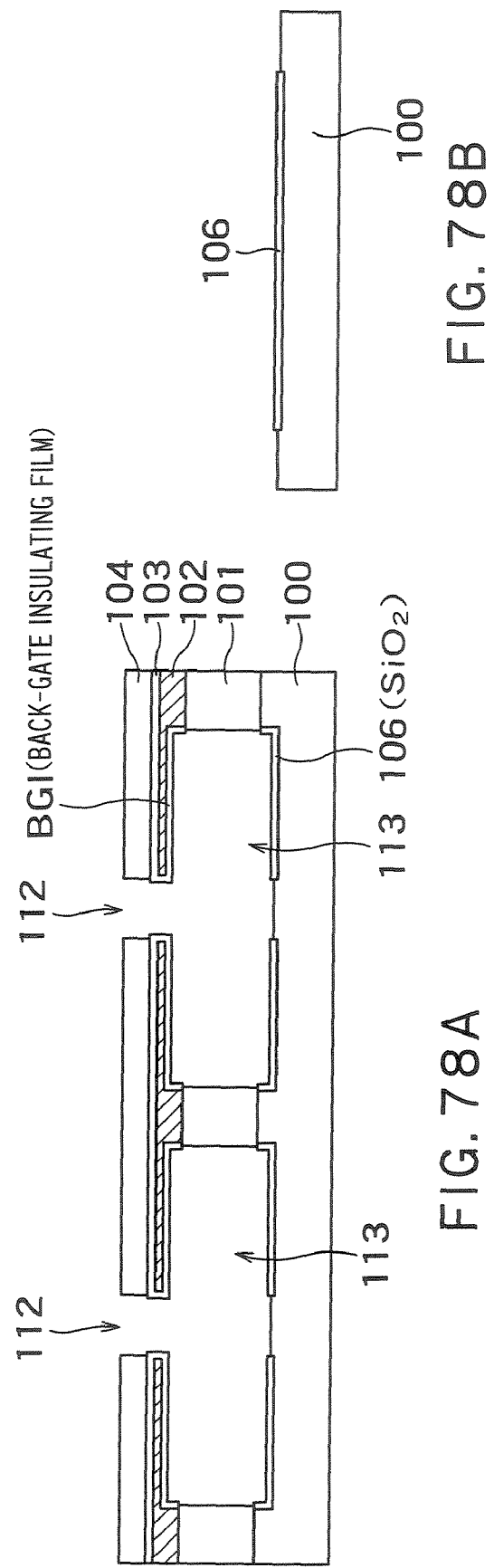

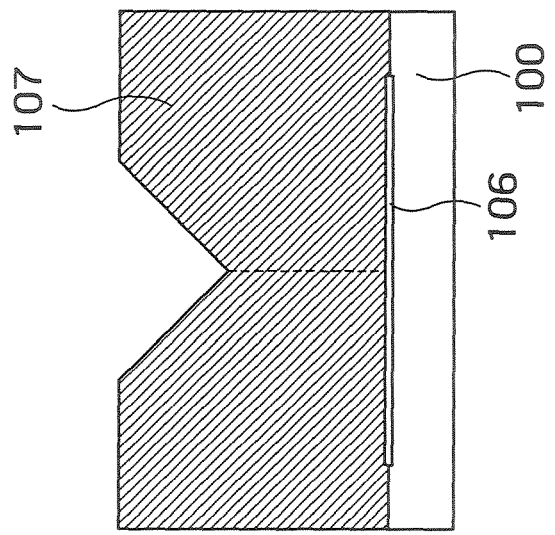
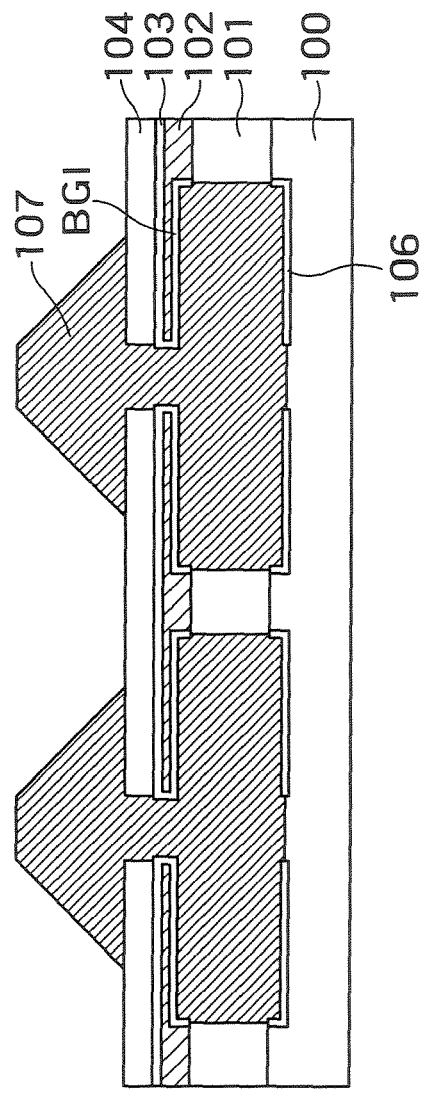
FIG. 80B
FIG. 80A

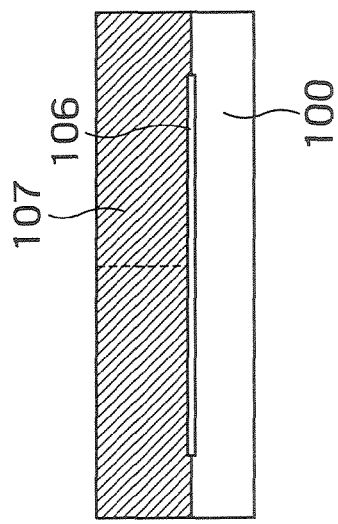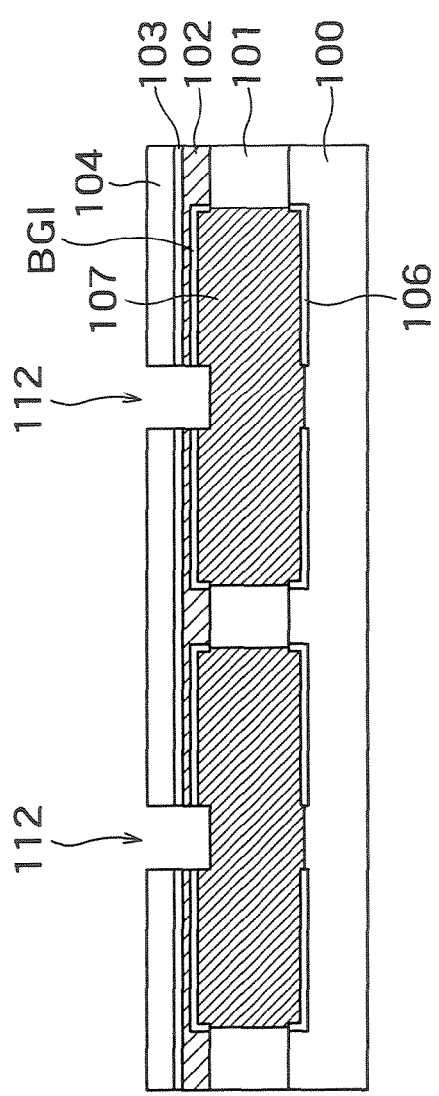

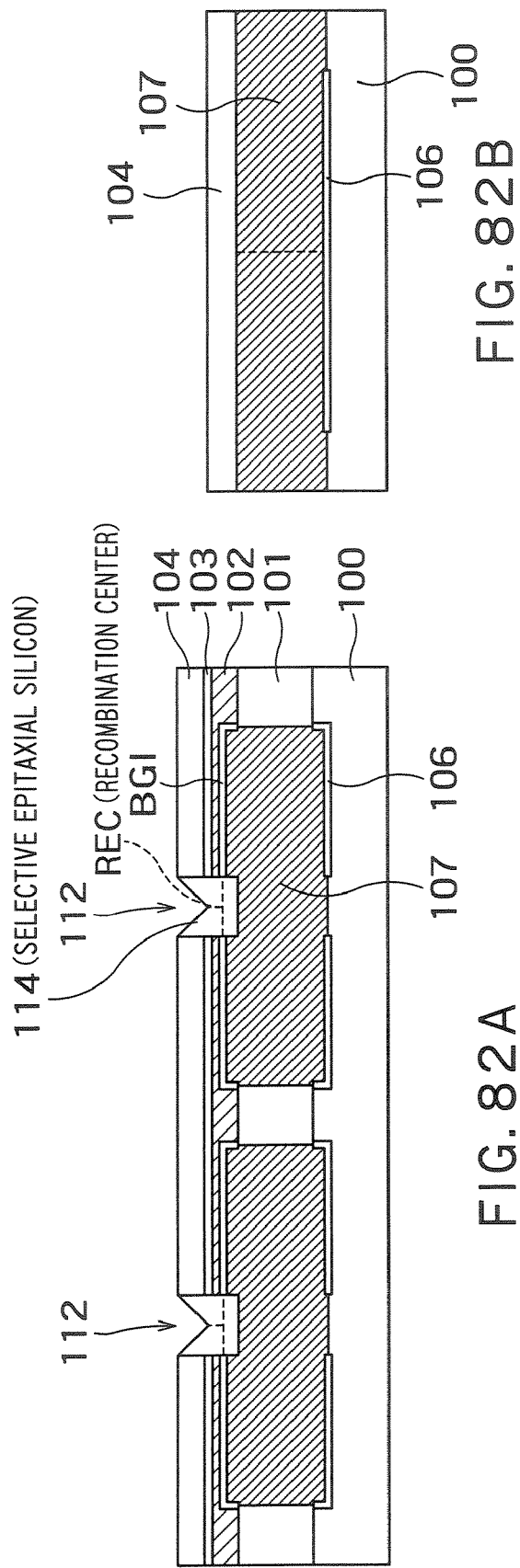

ELEVENTH EMBODIMENT

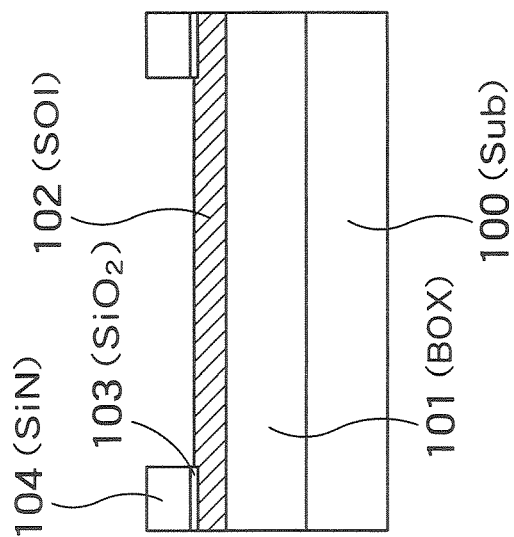
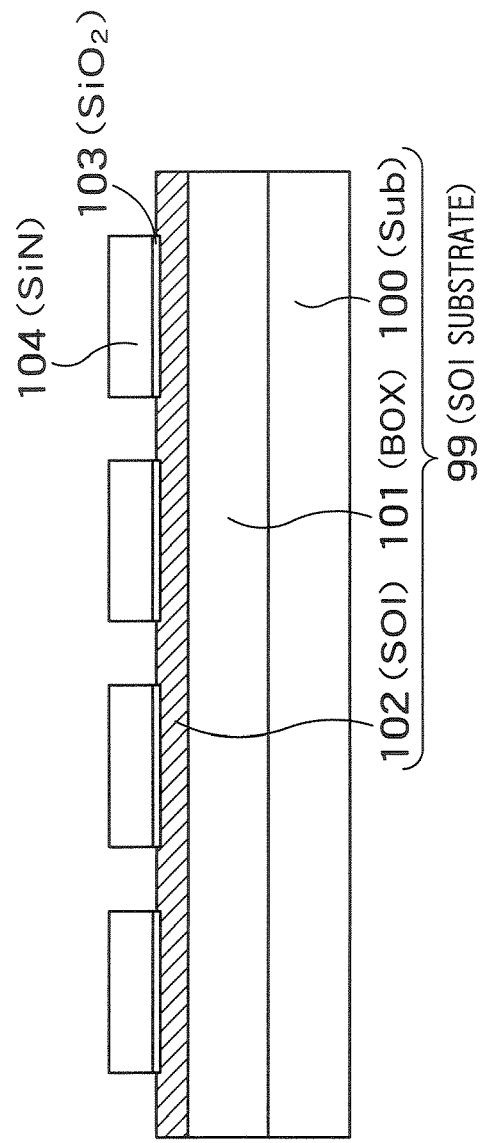

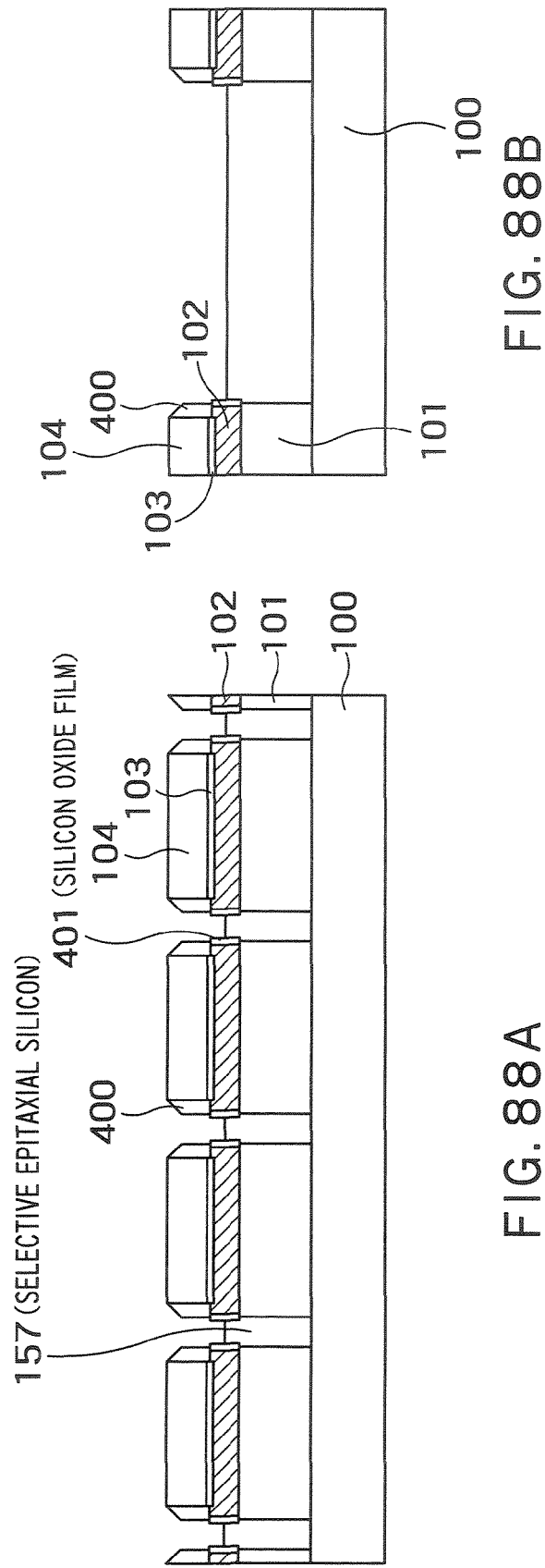

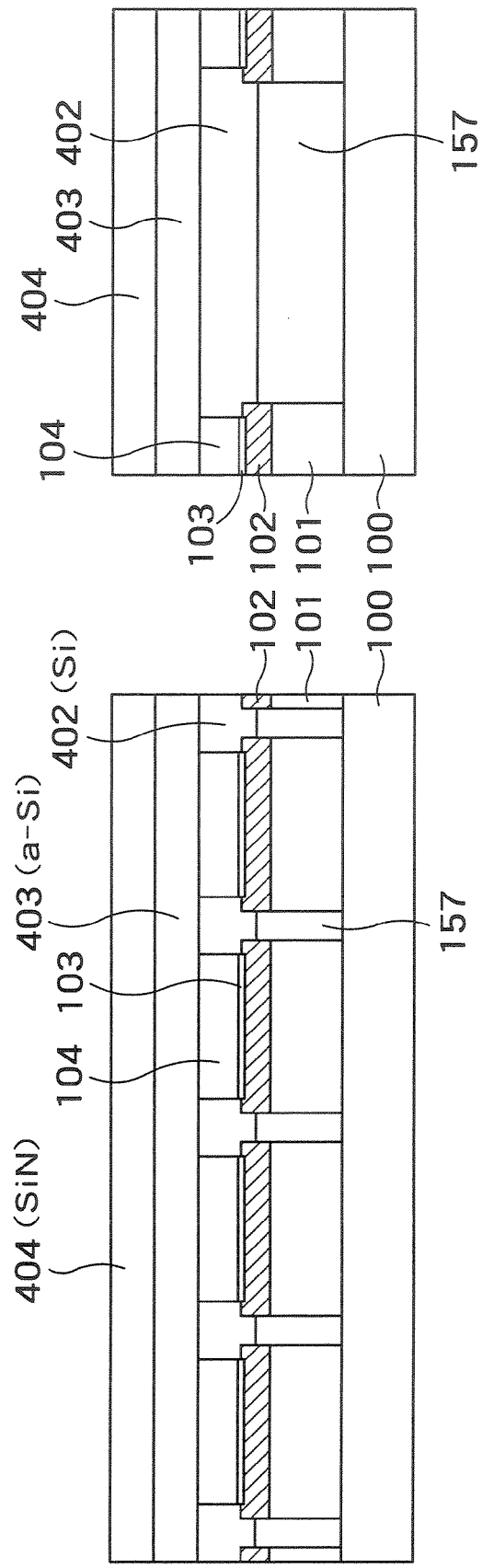

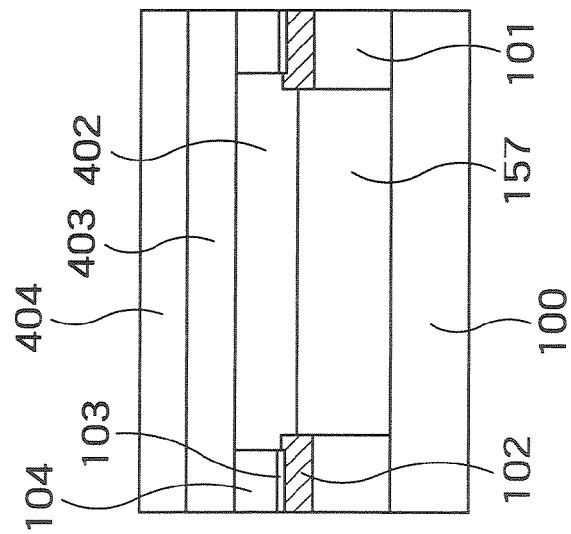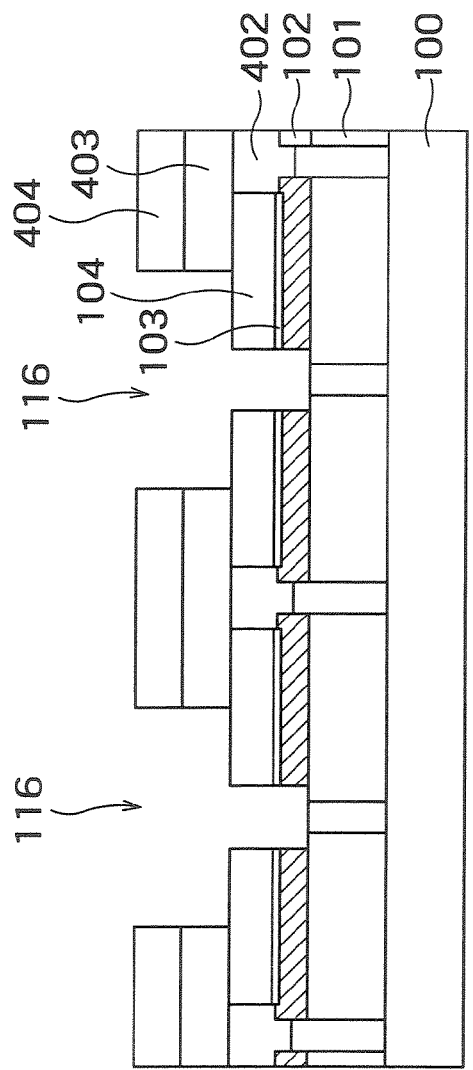
FIG. 90B
FIG. 90A

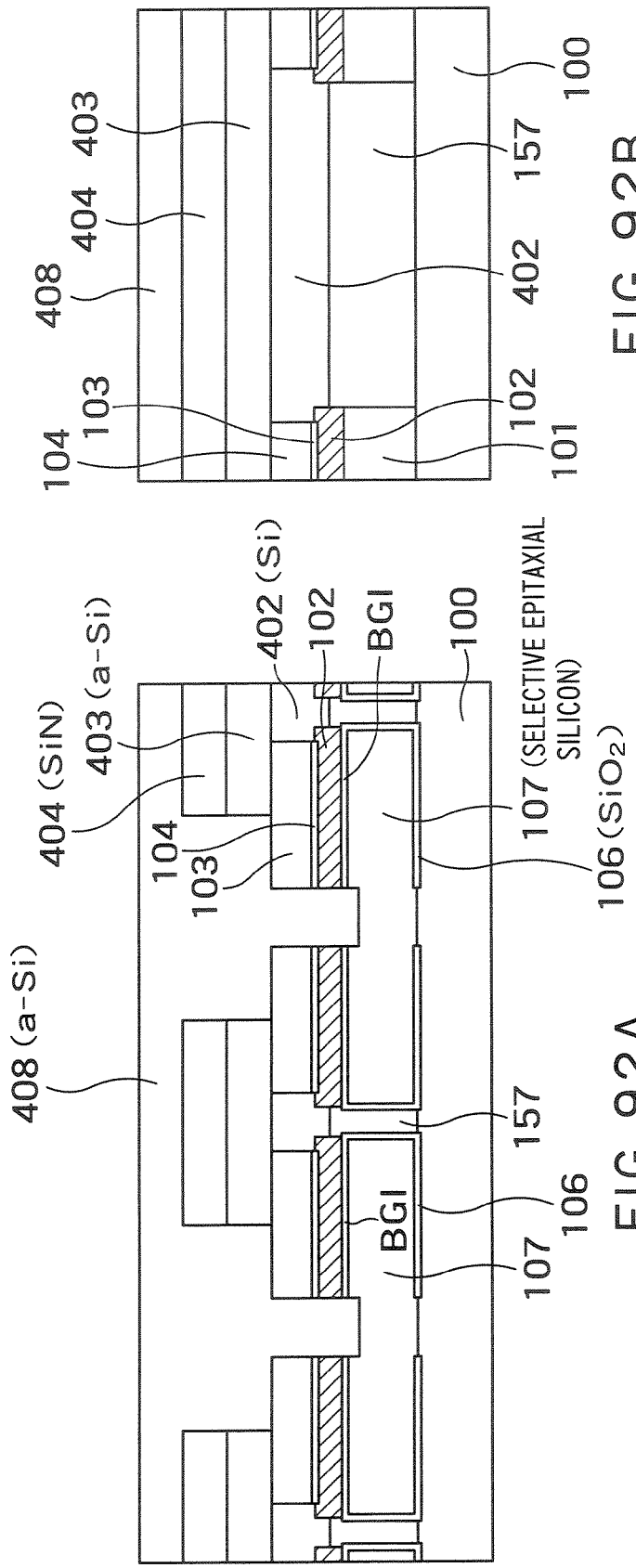

TWELFTH EMBODIMENT

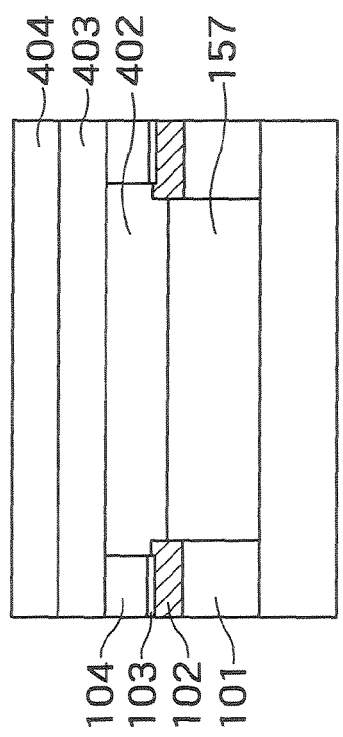
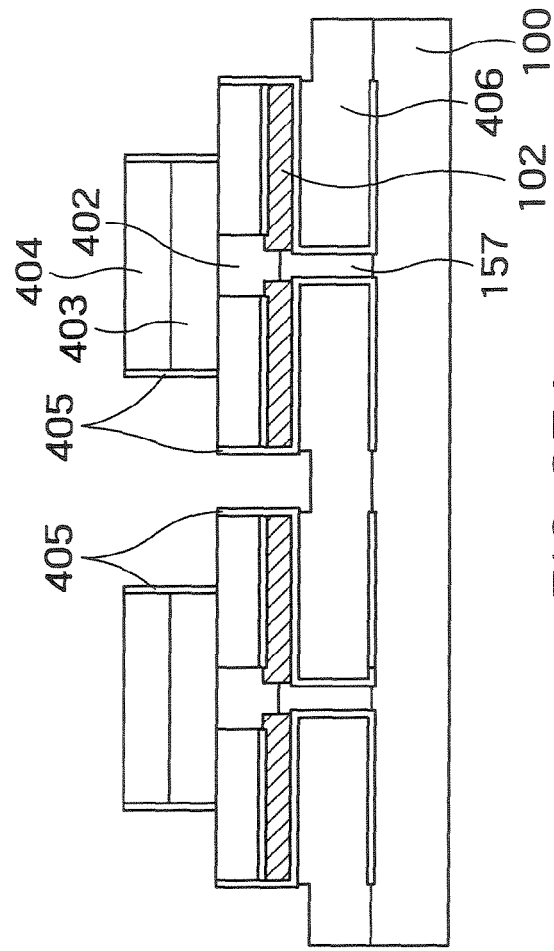

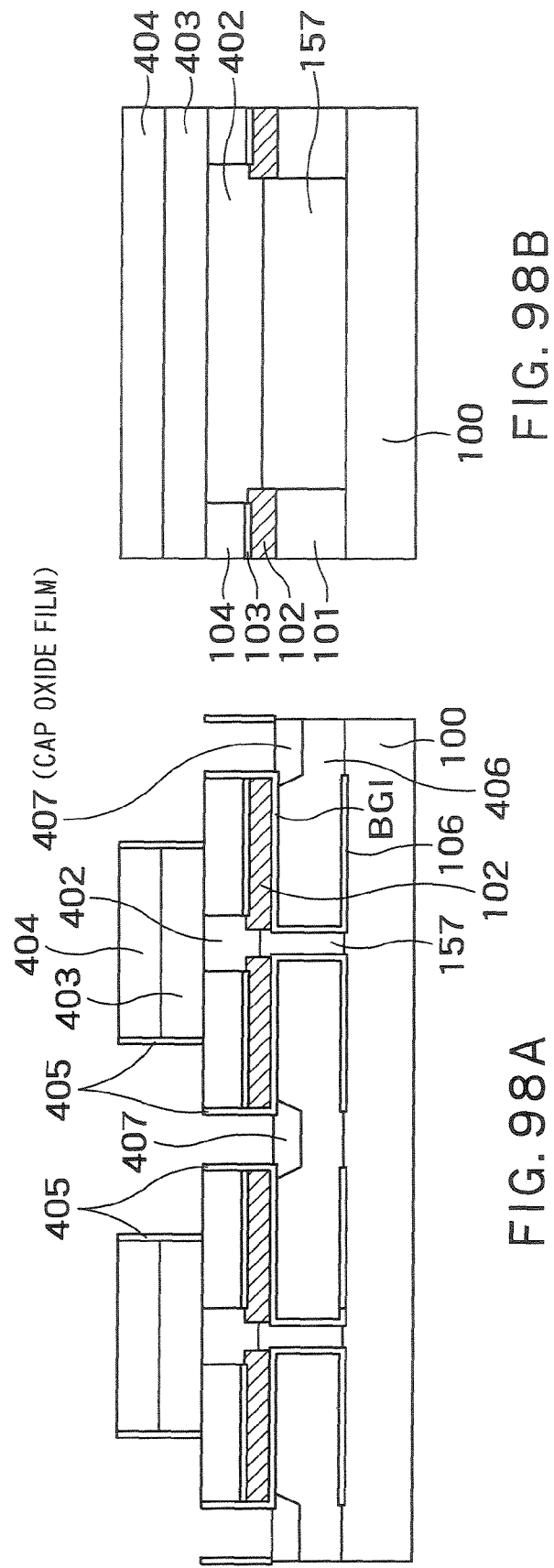

THIRTEENTH EMBODIMENT

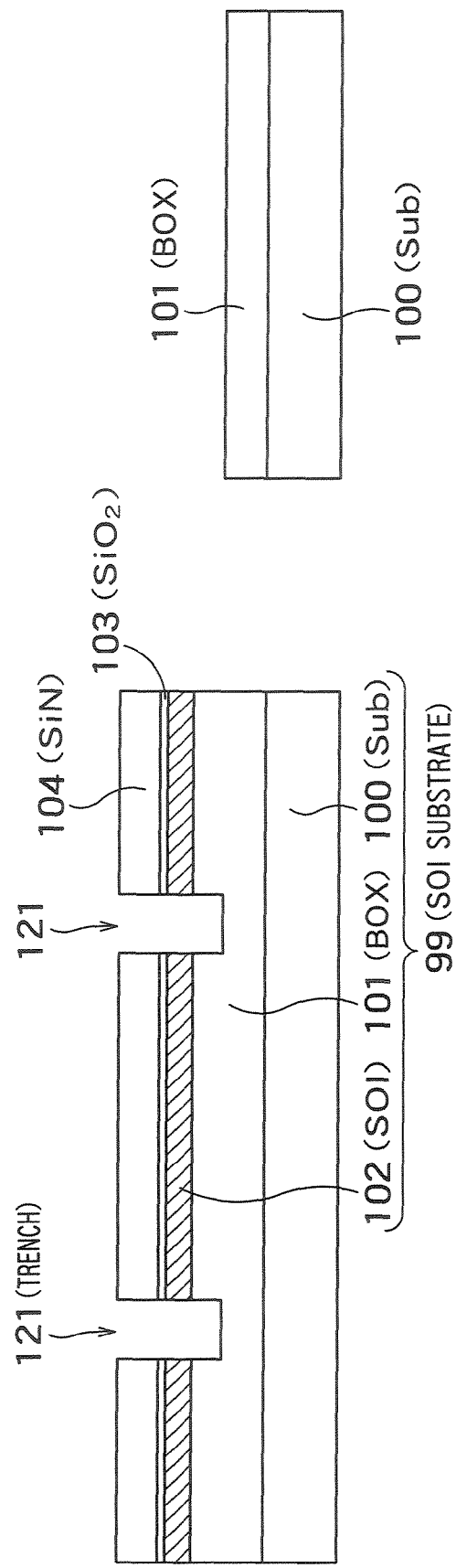

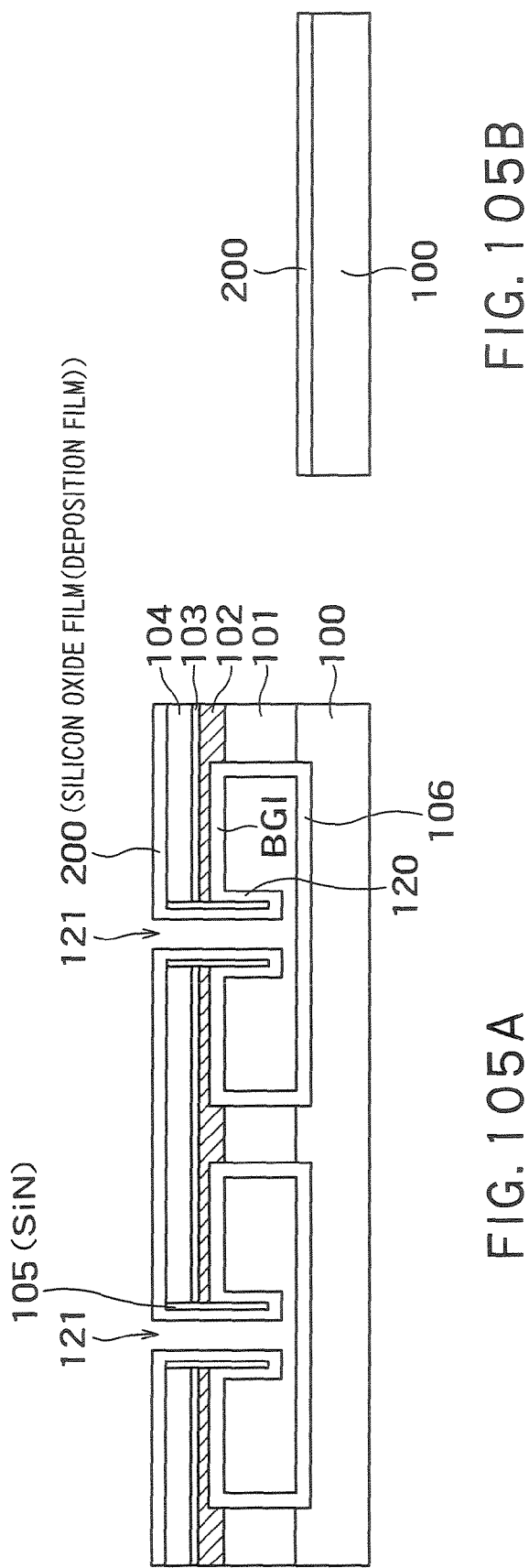

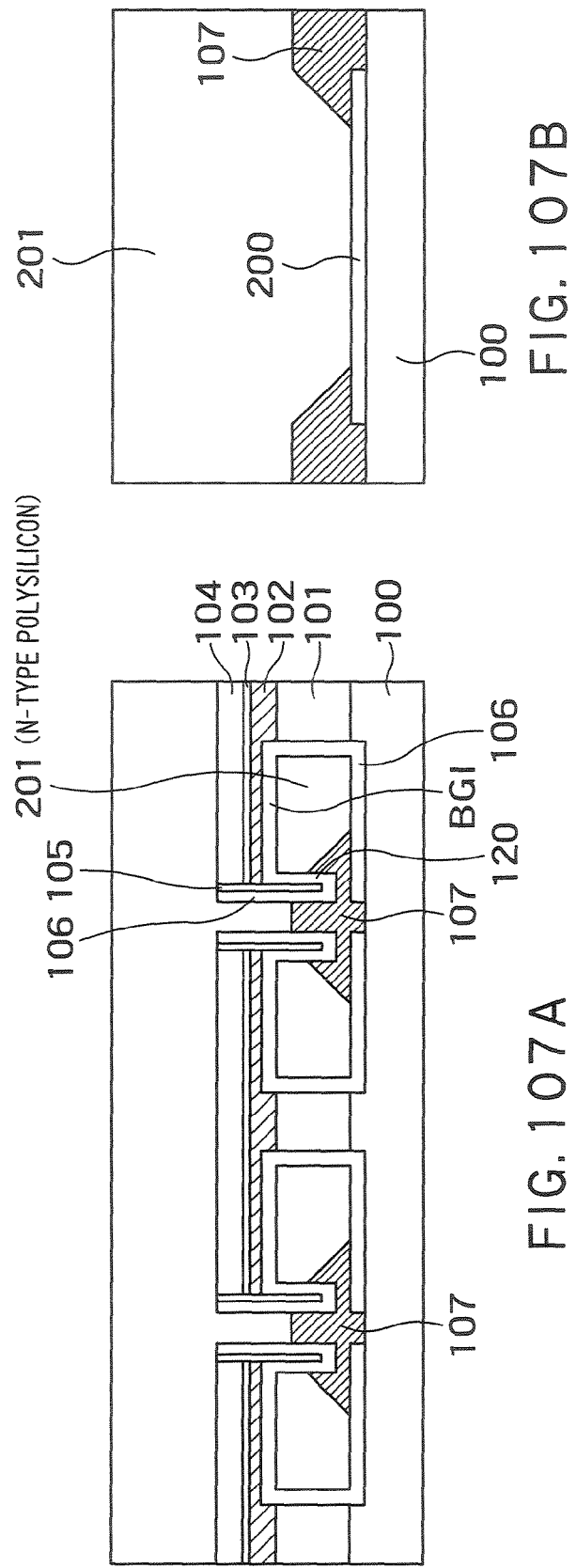

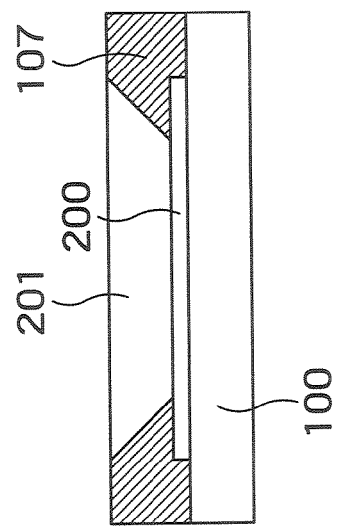
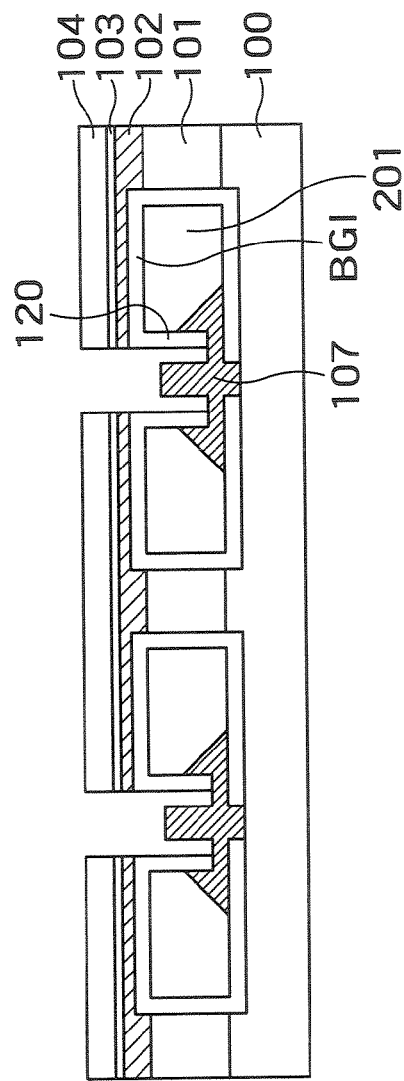
FIG. 108B
FIG. 108A

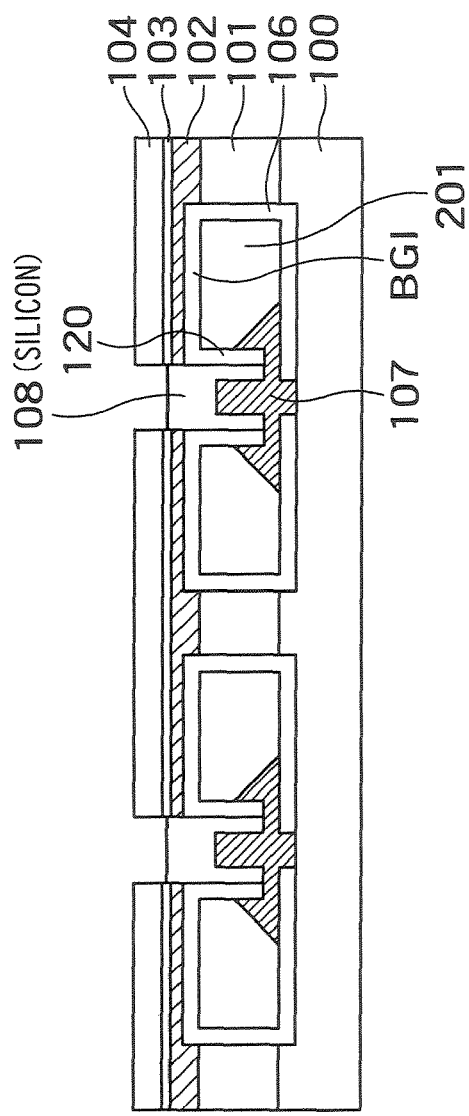
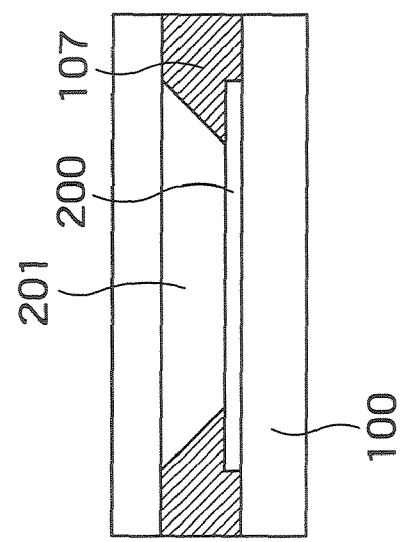
FIG. 109A
FIG. 109B

FIG. 110A FOURTEENTH EMBODIMENT

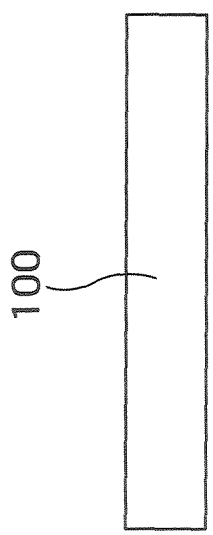
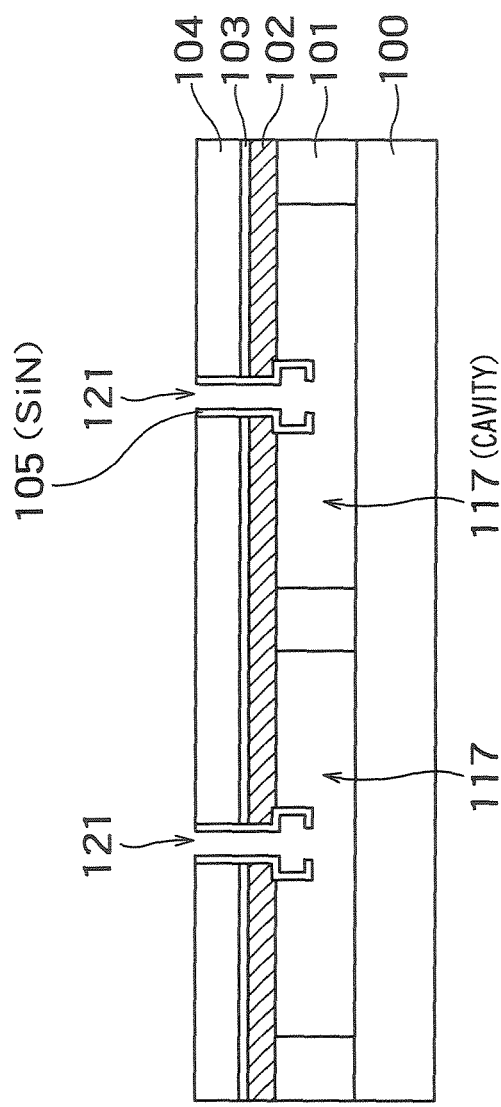

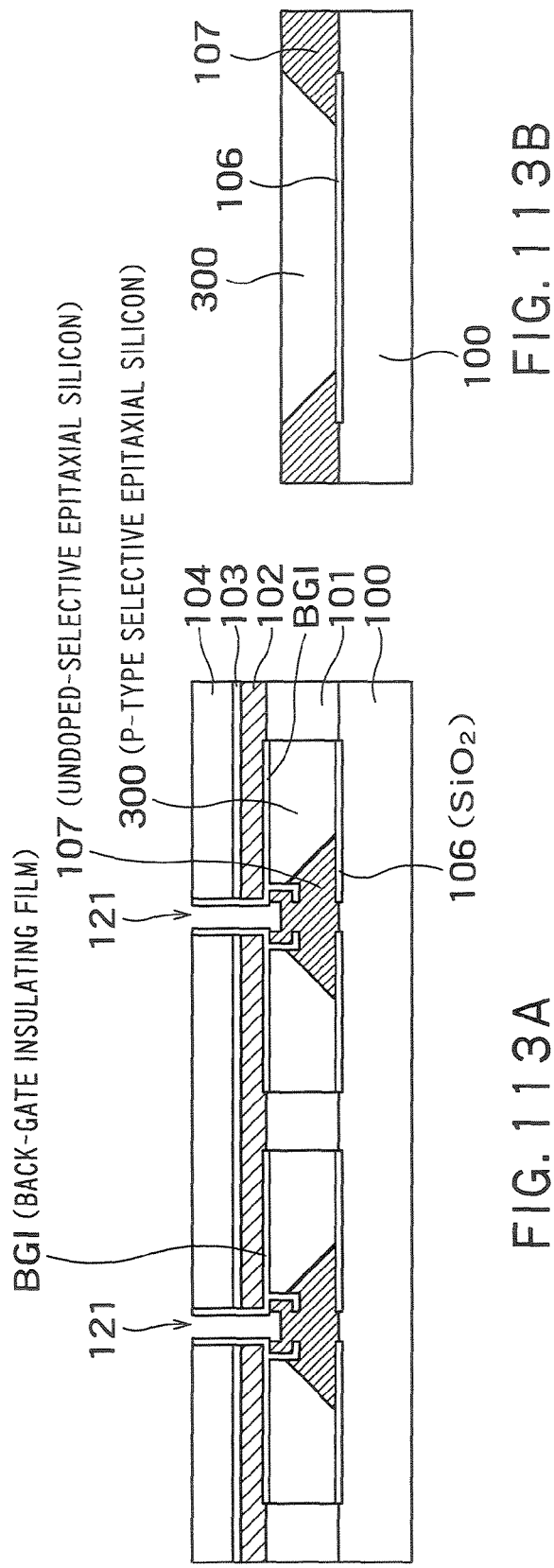

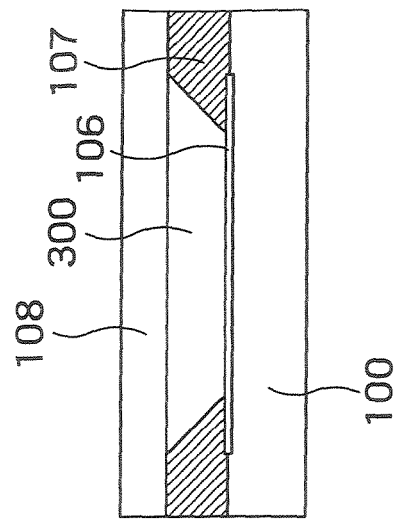
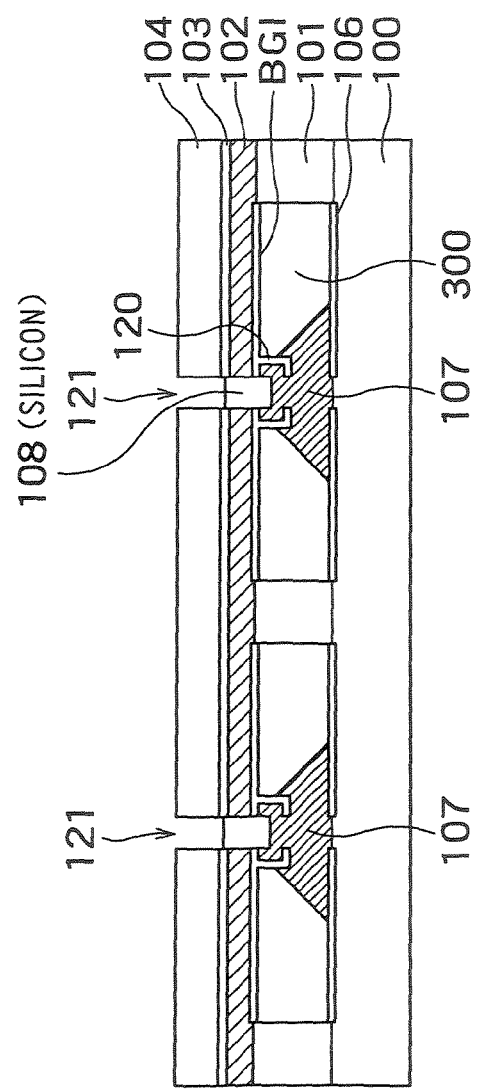

SEMICONDUCTOR MEMORY DEVICE AND MANUFACTURING METHOD THEREOF

CROSS-REFERENCE TO RELATED APPLICATION

This application is based upon and claims the benefit of priority from the prior Japanese Patent Applications No. 2006-53460, filed on Feb. 28, 2006 and No. 2006-277743, filed on Oct. 11, 2006, the entire contents of which are incorporated herein by reference.

BACKGROUND OF THE INVENTION

1. Field of the Invention

The present invention relates to a semiconductor memory device and a method of manufacturing the same.

2. Related Art

FBC memories are superior to 1T-1C (1 Transistor-1 Capacitor) DRAMs in terms of miniaturization. FBC (Floating Body Cell) memories have attracted attention as semiconductor memory devices in place of 1T-1C DRAMs.

FBC memory cells consist of MISFETs usually formed on SOI substrates. In the FBC, a source region, a drain region, and a body region are formed in an SOI layer. The body region sandwiched between the source and the drain is electrically floating. If the FBC is formed of an N-type FET, the memory cell stores data depending on the amount of holes accumulated in the body region.

If the difference $\Delta Vth$ between the threshold voltage of a memory cell storing data "0" and the threshold voltage of a memory cell storing data "1" at the time of reading is small, discrimination between the data "0" and the data "1" is difficult and the number of fail bits can be increased. One of causes of small $\Delta Vth$ is that the surface of a supporting substrate is depleted and the capacitance Csub between the body and the supporting substrate is decreased.

Memory cells share sources or drains with adjacent memory cells. In conventional FBCs, holes of selected memory cells flow into adjacent non-selected memory cells, so that erroneous data is programmed in the non-selected memory cells. For example, if 1.5V is applied to the gate of a selected memory cell and 2.2V is applied to the drain, impact ionization occurs in the vicinity of a PN junction between the drain and the body region. Holes are accumulated in the body region of the selected memory cell and data "1" is programmed. When the data "1" is written, a part of the holes diffuses toward the source to flow into the body region of a non-selected memory cell next to the selected memory cell. The data "1" can be programmed by mistake in the body region of the non-selected memory cell. The holes of the selected memory cell may flow via the drain into the non-selected memory cell. This is called "bipolar disturb".

If adjacent memory cells do not share drains or sources, the aforementioned problems do not occur, though the cell size may be significantly increased.

SOI substrates are about ten times as expensive as ordinary bulk substrates. Conventional FBCs formed on SOI substrates cost more than DRAMs formed on bulk substrates.

SUMMARY OF THE INVENTION

A semiconductor memory device according to an embodiment of the present invention comprises a supporting substrate including semiconductor materials; an insulation film provided above the supporting substrate; a first diffusion layer provided on the insulation film; a second diffusion layer provided on the insulation film; a body region provided between the first diffusion layer and the second diffusion layer, the body region being in an electrically floating state and accumulating or releasing electric charges for storing data; a semiconductor layer connected to the second diffusion layer to release electric charges from the second diffusion layer; a gate insulation film provided on the body region; and a gate electrode provided on the gate insulation film.

A manufacturing method of a semiconductor memory device according to an embodiment of the present invention, the semiconductor memory device having a body region provided between a first diffusion layer and a second diffusion layer in an electrically floating state and which stores data depending on the amount of electric charges accumulated in the body region, the method comprises forming an insulation film on a supporting substrate including semiconductor materials; exposing the surface of the supporting substrate by removing the insulation film in a region where the second diffusion layer is to be formed; forming a first semiconductor layer on the exposed supporting substrate in the region where the second diffusion layer is to be formed; forming a second semiconductor layer on the first semiconductor layer and the insulation film; forming a gate insulation film on the body region in the second semiconductor layer; forming a gate electrode on the gate insulation film; and introducing an impurity between adjacent gate electrodes to form the second diffusion layer and the first diffusion layer in the second semiconductor layer.

A manufacturing method of a semiconductor memory device according to an embodiment of the present invention, the semiconductor memory device having a body region provided between a first diffusion layer and a second diffusion layer in an electrically floating state and which stores data depending on the amount of electric charges accumulated in the body region, the method comprising:

the method comprises preparing a substrate having an insulated semiconductor layer provided on an insulation film on a supporting substrate; removing the insulation film and the insulated semiconductor layer in a region adjacent to which the second diffusion layer is to be formed; filling a semiconductor material in an opening formed by the removal process of the insulation film and the insulated semiconductor layer to form a semiconductor layer connecting electrically between the supporting substrate and the insulated semiconductor layer; forming a gate insulation film on the insulated semiconductor layer; forming a gate electrode on the gate insulation film; and introducing an impurity between adjacent gate electrodes to form the second diffusion layer and the first diffusion layer in the insulated semiconductor layer.

BRIEF DESCRIPTION OF THE DRAWINGS

FIG. 4 is a cross-sectional view along the line 4-4 in FIG. 2;

FIGS. 9A to 21B are plan views and cross-sectional views of a manufacturing method of an FBC memory device according to the first embodiment;

FIG. 25 is a cross-sectional view of an FBC memory device of a fourth embodiment;

FIGS. 26A to 30B are cross-sectional views of a manufacturing method of an FBC memory device according to the fourth embodiment of the present invention;

FIGS. 31A to 34B are cross-sectional views of a manufacturing method of an FBC memory device according to a modification of the fourth embodiment;

FIGS. 37A to 38B are cross-sectional views of a manufacturing method of an FBC memory device according to the fifth embodiment;

FIGS. 48A to 51B are cross-sectional views of a manufacturing method of an FBC memory device according to the seventh embodiment;

FIGS. 68A to 69B are cross-sectional views of a manufacturing method of the first modification of the ninth embodiment;

FIG. 72A is a cross-sectional view of a memory cell area along the line A-A in FIG. 71;

FIG. 72B corresponds to the cross-sectional view of the logic transistor (SOI transistor) along the line 4-4 in FIG. 2;

FIGS. 76A to 83B are cross-sectional views of a manufacturing method of an FBC memory device of the tenth embodiment;

FIGS. 86A to 93B are cross-sectional views of a manufacturing method of an FBC memory device according to the eleventh embodiment;

FIGS. 95A to 98B are cross-sectional views of a manufacturing method of the twelfth embodiment;

FIGS. 103A to 109B are cross-sectional views of a manufacturing method of an FBC memory device according to the thirteenth embodiment;

FIGS. 110A and 110B are cross-sectional views of an FBC memory device according to a fourteenth embodiment of the present invention; and FIGS. 111A to 114B are cross-sectional views of a manufacturing method of an FBC memory device of the fourteenth embodiment.

DETAILED DESCRIPTION OF THE INVENTION

Embodiments of the present invention will be explained below with reference to the accompanying drawings The present invention is not limited to the embodiments.

First Embodiment

Figure 1:
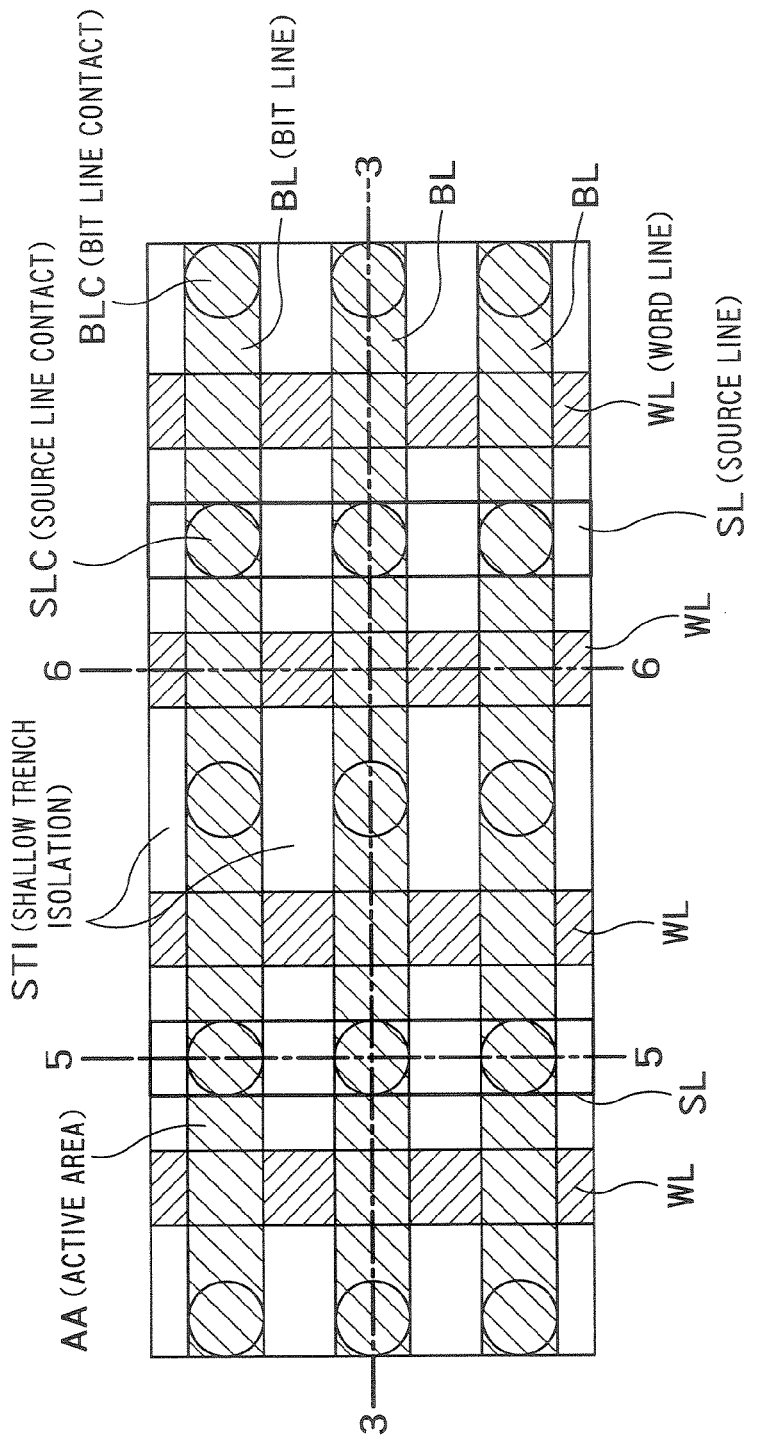
FIGS. 1 and 2 are plan views of an FBC memory device according to a first embodiment of the present invention.
Figure 2:
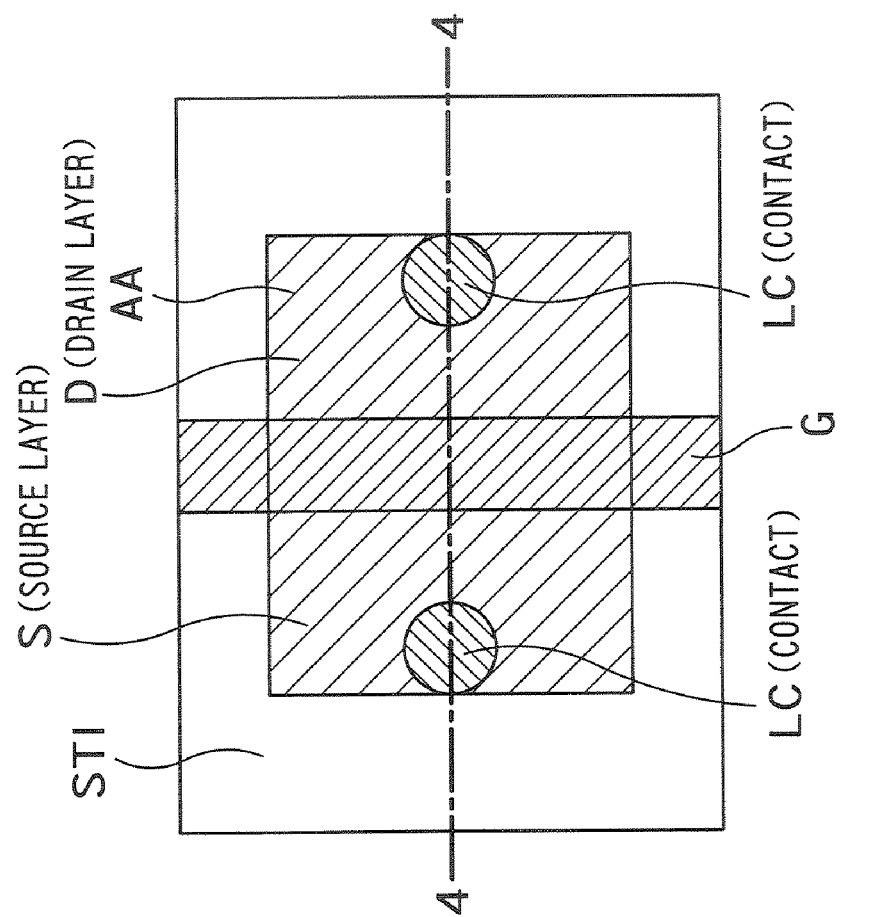

FIGS. 1 and 2 are plan views of an FBC memory device according to a first embodiment of the present invention. FIG. 1 shows memory cells within a memory cell area. FIG. 2 shows a MISFET within a logic circuit area.

In the memory cell area, a bit line BL intersects with a word line WL (gate). The memory cell is provided at an intersection of the bit line BL and the word line WL. A source line SL extends in parallel with the word line WL. Below the bit line BL, an active area AA extends substantially in parallel with the bit line BL in a stripe pattern. An STI (Shallow Trench Isolation) separates the active area AA.

In the logic area, the MISFET consisting of a source S, a drain D, and a gate G is formed in the active area AA.

Figure 3:
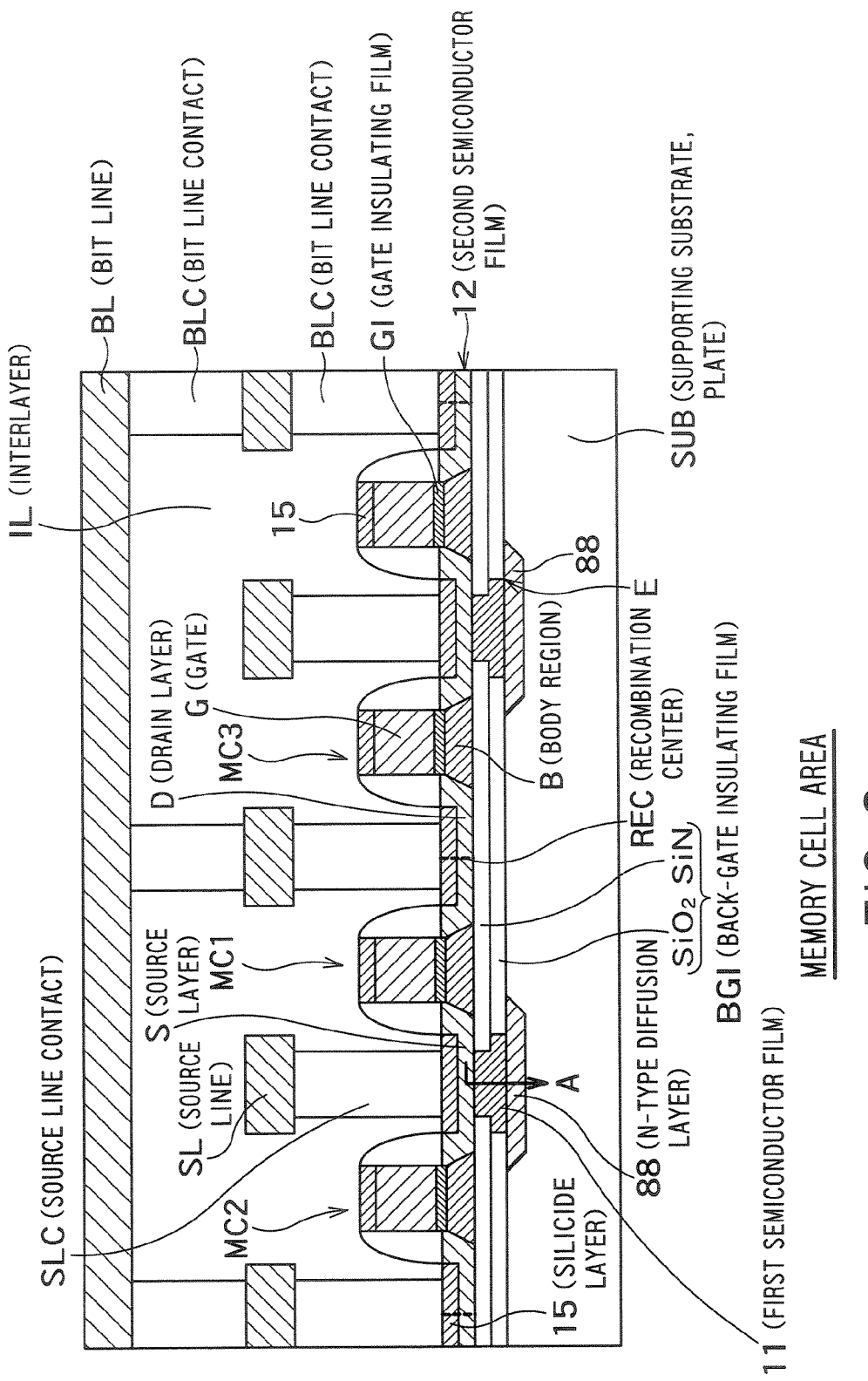
FIG. 3 is a cross-sectional view along the line 3-3 in FIG. 1.

FIG. 3 is a cross-sectional view along the line 3-3 in FIG. 1. As shown in FIG. 3, the FBC memory device of the first embodiment includes a supporting substrate SUB, a back-gate insulation film BGI, a drain layer D, a source layer S, a body region B, a gate insulation film GI, a gate electrode G (the word line WL), a first semiconductor layer 11, a second semiconductor layer 12, the bit line BL, and the source line SL.

In the first embodiment, the supporting substrate serves as a plate including semiconductor materials. In the following embodiments, a plate including semiconductor materials is provided between the supporting substrate and the insulation film. The plate is used for applying a substrate bias to the memory cells.

The drain layer D and the source layer S are provided in the same plane parallel to a surface of the supporting substrate SUB.

The supporting substrate SUB is made of semiconductor materials and is e.g., a bulk silicon substrate. The back-gate insulation film BGI is provided on the supporting substrate SUB. The back-gate insulation film BGI is a multi-layer film of a silicon oxide film having a thickness of about 2 nm and a silicon nitride film having a thickness of about 5 nm to 20 nm. The back-gate insulation film BGI can be a single-layer film of a silicon oxide film or a silicon nitride film. Alternatively, the back-gate insulation film BGI can be a multi-layer film (ONO film) of a silicon oxide film, a silicon nitride film, and a silicon oxide film. The use of the multi-layer film for the back-gate insulation film BGI reduces leakage current passing through the back-gate insulation film BGI. The dielectric constant of the silicon nitride film is higher than that of the silicon oxide film.

Using the back-gate insulation film BGI which includes the silicon nitride film, the body region-substrate (plate) capacitance increases. To further increase the body region-substrate capacitance, high dielectric constant materials such as hafnium silicate can be utilized for the back-gate insulation film BGI. The increased body region-substrate capacitance leads to a large difference in threshold voltage between a memory cell storing data "0" and a memory cell storing data "1", and an extended data retention time.

Below the source layer S, the back-gate insulation film BGI is not provided. Instead, the first semiconductor layer 11 is provided. The first semiconductor layer 11 is made of semiconductor materials such as monocrystalline silicon and provided on the supporting substrate SUB under the source layer S. The second semiconductor layer 12 is made of semiconductor materials such as monocrystalline silicon and provided on the back-gate insulation film BGI and the first semiconductor layer 11. The first semiconductor layer 11 and the second semiconductor layer 12 contain impurities and act as conductors.

Under the first semiconductor layer 11, a diffusion layer 88 with the same conductivity as that of the first semiconductor layer 11 (e.g., n-type) is provided. The diffusion layer 88 is formed by an impurity which diffused from the first semiconductor layer 11 into the supporting substrate SUB. The second semiconductor layer 12, the back-gate insulation film BGI, the diffusion layer 88, and the plate constitute a gated diode. Due to the gated diode structure, the difference in threshold voltage ΔVth between the data "0" and the data "1" is increased as shown in FIG. 5B.

The source layer S, the drain layer D, and the body region B are provided in the second semiconductor layer 12. The drain layer D and the body region B are provided on the back-gate insulation film BGI. The drain layer D is thus electrically insulated from the supporting substrate SUB. The body region B is provided between the drain layer D and the source layer S and electrically floating. The body region B can accumulate electric charges for storing data. The source layer S is provided on the back-gate insulation film BGI and the first semiconductor layer 11. The source layer S is connected to the first semiconductor layer 11. The first semiconductor layer 11 penetrates through the back-gate insulation film BGI to the supporting substrate. If the memory device has a plate between the supporting substrate and the back-gate insulation film, the first semiconductor layer 11 penetrates though the insulation film and the plate. Therefore, the source layer S is electrically connected via the first semiconductor layer 11 to the supporting substrate SUB. The gate insulation film GI is made of, e.g., a silicon oxide film or a silicon nitride film and provided on the body region B. The gate electrode G is made of, e.g., polysilicon and provided on the gate insulation film GI. A silicide layer 15 is provided on surfaces of the source layer S and the drain layer D.

The source layer S and the drain layer D contain, e.g., about $10^{20}$ cm$^{-3}$ of an N-type impurity. In the surface portion of the supporting substrate SUB, a well (also referred to as plate) is provided which contains, e.g., $10^{18}$ cm$^{-3}$ to $10^{19}$ cm$^{-3}$ of a P-type impurity. The source layer S is electrically connected to the plate.

The bit line BL is connected via a bit line contact BLC to the drain layer D in the memory cell. The source line SL is connected via a source line contact SLC to the source layer S in the memory cell. The gate electrode G also functions as the word line WL.

The drain layer D is provided with a recombination center REC. The recombination center REC is a misfit portion of monocrystalline silicon formed when the second semiconductor layer 12 is subjected to solid phase lateral epitaxial growth.

FIG. 4 is a cross-sectional view along the line 4-4 in FIG. 2. FIG. 4 is a cross-section of one typical MISFET. The MISFET includes the source S, the drain D, the gate insulation film GI, the gate electrode G, a contact LC, and a wiring LIC. The source S and the drain D are provided on the supporting substrate SUB. The gate electrode G is provided on the supporting substrate SUB with the gate insulation film GI interposed therebetween. The wiring LIC is connected via the contact LC to the silicide layer 15 provided on the source S and the drain D.

Figure 5A:
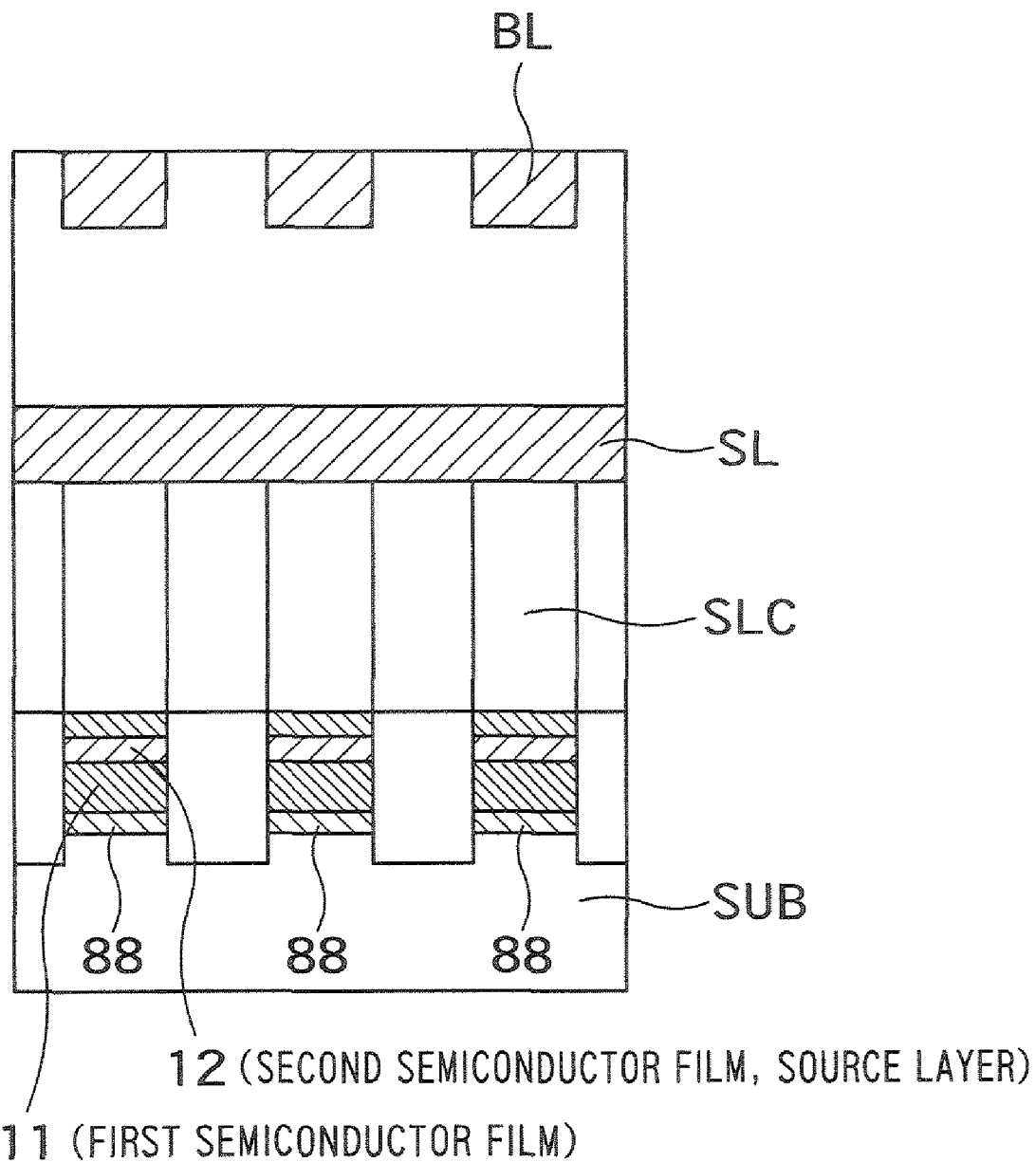
FIG. 5A is a cross-sectional view of the source layer S along the 5-5 line in FIG. 1.
Figure 5B:
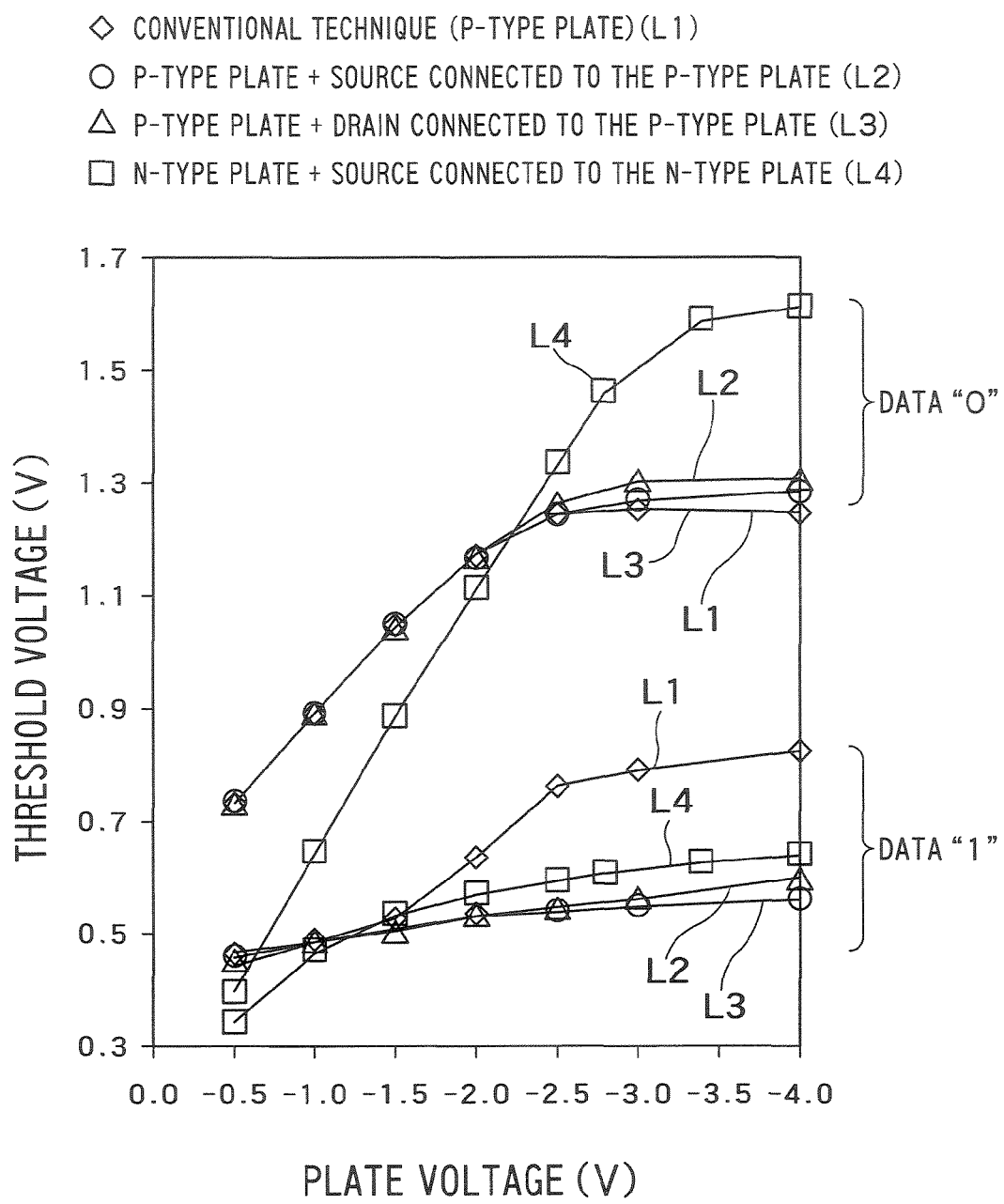
FIG. 5B is the simulated result of the relationship between a threshold voltage and a plate voltage (substrate voltage) in a data reading operation.
Figure 6:
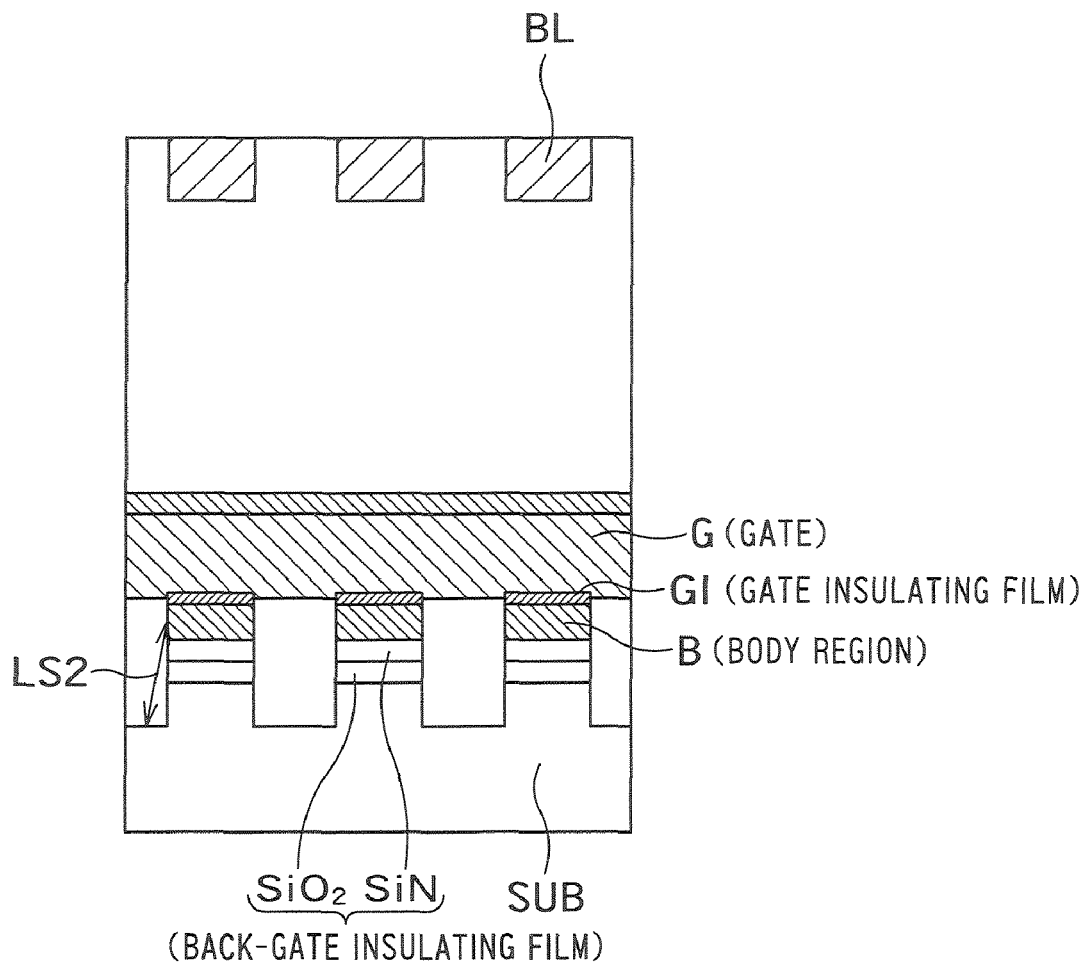
FIG. 6 is a cross-sectional view of the gate electrode G and the body region B along the line 6-6 in FIG. 1.

FIG. 5A is a cross-sectional view of the source layer S along the 5-5 line in FIG. 1. FIG. 6 is a cross-sectional view of the gate electrode G and the body region B along the line 6-6 in FIG. 1. As shown in FIG. 5A, the first semiconductor layer 11 is under the source layer S. The source layer S is thus electrically connected to the supporting substrate SUB. As shown in FIG. 6, the back-gate insulation film BGI is under the body region B. The gate insulation film GI is on the body region B. As shown in FIG. 3, the body region B is surrounded by the source layer S, the drain layer D and the STI. The body region B is thus electrically floating.

In the memory cell area, the drain layer D, the source layer S, the body region B, the gate insulation film GI, and the gate electrode G constitute the memory cell. Memory cells with the same structure are arranged in a matrix.

Figure 5C:
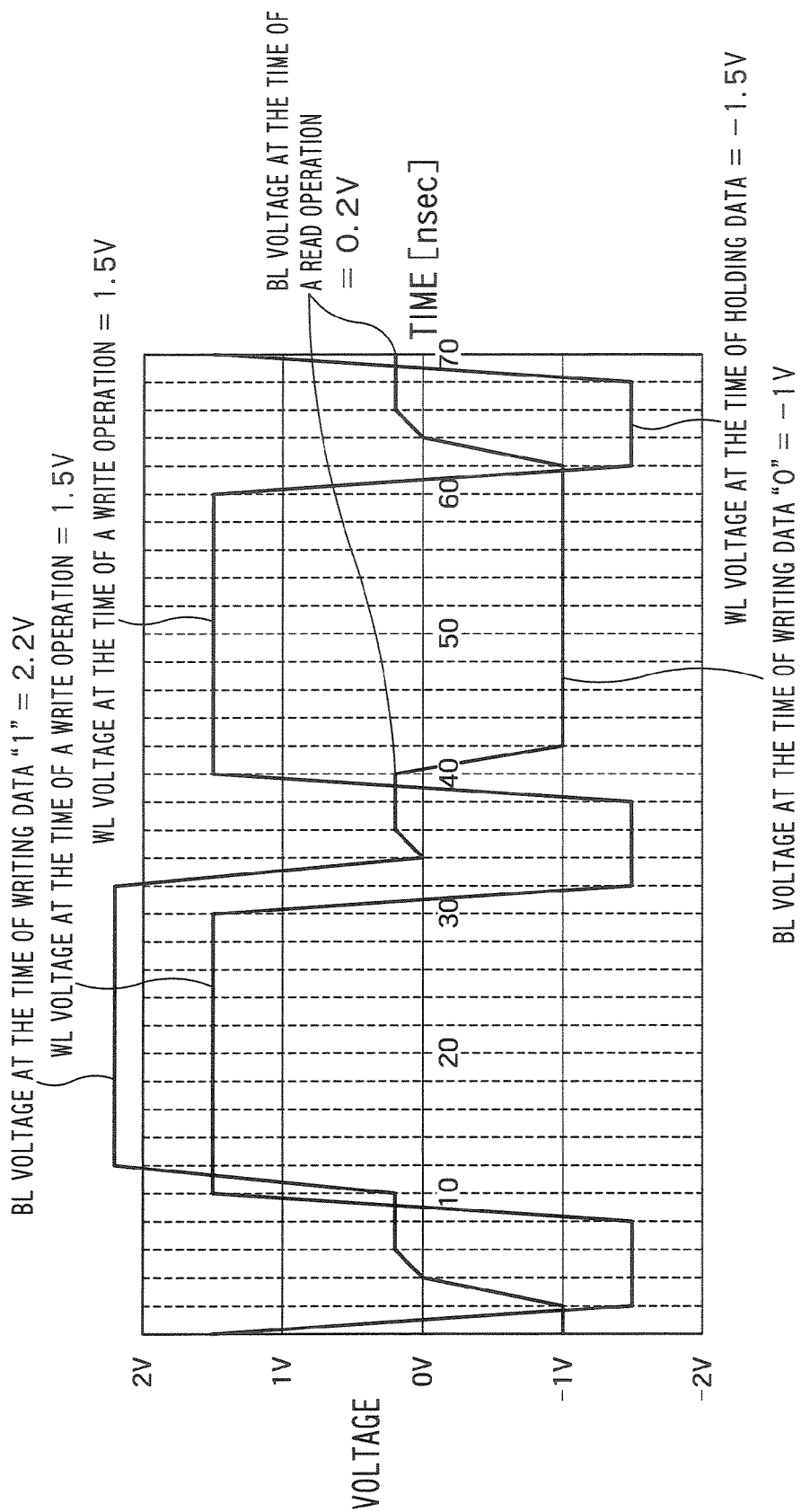
FIG. 5C shows input waveforms utilized for the simulation.

FIG. 5B is the simulation result of the relationship between a threshold voltage and a plate voltage (substrate voltage) in a data reading operation. An SOI layer thickness for the simulation is 15 nm. A back-gate insulation film has a film thickness of 8 nm. A gate insulation film has a film thickness of 6 nm and a gate length of 0.12 μm. A channel has an impurity concentration of $1 \times 10^{17}$ cm$^{-3}$. Thus, the memory cell is operated as a fully-depleted device which features small junction leakage current and small threshold voltage fluctuation. In the case of the fully-depleted device, the threshold voltage is strongly dependent on the substrate voltage as will be described later. A plate has an impurity concentration of $1 \times 10^{18}$ cm$^{-3}$. FIG. 5C shows input waveforms utilized for the simulation.

As indicated by L1 line in FIG. 5B, according to a conventional FBC, the threshold voltage of a memory cell with data "1" increases so as to approach the threshold voltage of a memory cell with data "0". This is because if the plate voltage is lower than −1.5V, the surface of the supporting substrate is inverted and the body-plate capacitance is decreased. As a result, at a plate voltage of −1.5V, ΔVth exhibits its maximum value of 0.543V.

Line L2 indicates the simulation result of the structure that the source is connected to the P-type plate in the first embodiment (FIG. 3). According to the first embodiment, at a plate voltage of −3V, ΔVth exhibits its maximum value of 0.738V. Although not shown in the graph, when the concentration of the plate is increased from $1 \times 10^{18}$ cm$^{-3}$ to $1 \times 10^{19}$ cm$^{-3}$, at a plate voltage of −2V, ΔVth is increased to 0.908V. As shown in FIG. 5B, as compared to an FBC memory device utilizing an N-type plate to be described later, the FBC memory device utilizing the P-type plate exhibits a large difference in threshold voltage at plate voltages near 0V. Thus, power consumption for the FBC memory device utilizing the P-type plate is decreased.

Reasons why the difference in threshold voltage ΔVth in the first embodiment is larger than a conventional one are as follows. According to the first embodiment, as described with reference to FIG. 3, the gated diode is formed on the surface of the supporting substrate SUB. The gated diode is a structure which includes a pn junction formed by the P-type semiconductor and the N-type diffusion layer formed on the surface of the P-type semiconductor, the gate insulation film formed on the N-type diffusion layer, and the gate electrode. In the gated diode structure, when the surface of the supporting substrate SUB is inverted, electrons are supplied from the N-type diffusion layer 88 to the inversion layer. The width of a depletion layer formed on the surface of the supporting substrate SUB just below the body is narrowed and the capacitance Csub between the body B and the supporting substrate SUB (plate) is increased. An increase in the threshold voltage of the data "1" memory cell MC is suppressed An end portion E of an interface between the back-gate insulation film BGI and the supporting substrate SUB is included in the N-type diffusion layer 88. The N-type diffusion layer 88 is connected to the source layer S. In such structure, the threshold voltage of the data "0" memory cell according to the first embodiment is increased as compared to conventional cases in low plate voltage regions. This is because at low plate voltage regions, carrier distribution in the SOI layer is modulated and thus a body potential when the data 0 is written is decreased. Accordingly, the number of holes in the "0" memory cell of the first embodiment is smaller than that of conventional cases, indicating holes are effectively released from the body B using the first embodiment in low plate voltages region.

According to the first embodiment, the source layer S is electrically connected to the supporting substrate SUB (plate) as shown in FIG. 3. At the time of data writing, the voltage of the supporting substrate SUB is maintained so as to be lower than that of the source line SL. For example, the source line SL has a voltage of 0V and the supporting substrate SUB has a voltage of −3V. A pn junction between the supporting substrate SUB and the N-type diffusion layer 88 is reverse-biased. Holes generated by impact ionization do not flow into the adjacent non-selected memory cell but are released to the supporting substrate SUB. Assume that MC1 in FIG. 3 indicates the selected memory cell in the data "1" writing operation, and MC2 indicates the non-selected memory cell. Holes flow, as indicated by the arrow A in FIG. 3, via the source layer S and the first semiconductor layer 11 into the supporting substrate SUB. Bipolar disturb is thus suppressed.

According to the first embodiment, the recombination center REC is provided at the middle of the drain layer D as shown in FIG. 3. The holes generated by impact ionization do not flow into the non-selected memory cell. Assume that MC1 indicates the selected memory cell in the data "1" writing operation, and MC3 indicates the non-selected memory cell. Holes flowing from the memory cell MC1 to the drain layer D are blocked by the recombination center REC so as not to reach the adjacent non-selected memory cell MC3. Bipolar disturb is thus suppressed. Another merit of reverse-biasing the pn-junction is to increase the threshold voltage difference by substrate bias effects, as mentioned above referring to the line L2 of FIG. 3.

As described above, according to the first embodiment, holes flown in the source layer S are discharged into the plate. Holes flown into the drain layer D are blocked by the recombination center REC. Bipolar disturb is thus suppressed.

In the FBC memory device of the first embodiment, as shown in FIG. 3, the drain layer D or the source layer S and the body region B are arranged alternately in a repeated manner. The drain layer D and the source layer S are provided in the same plane parallel to a surface of the supporting substrate SUB. In the second semiconductor layer 12, the drain layer D, the source layer S, and the body region B are arranged in a pattern such as D-B-S-B-D-B-S-B. Such arrangement is accomplished by adjacent memory cells sharing the drain layer D or the source layer S. Because adjacent memory cells share the drain layer D or the source layer S, the memory cell size is decreased. The overall size of the FBC memory device becomes smaller.

Figure 7:
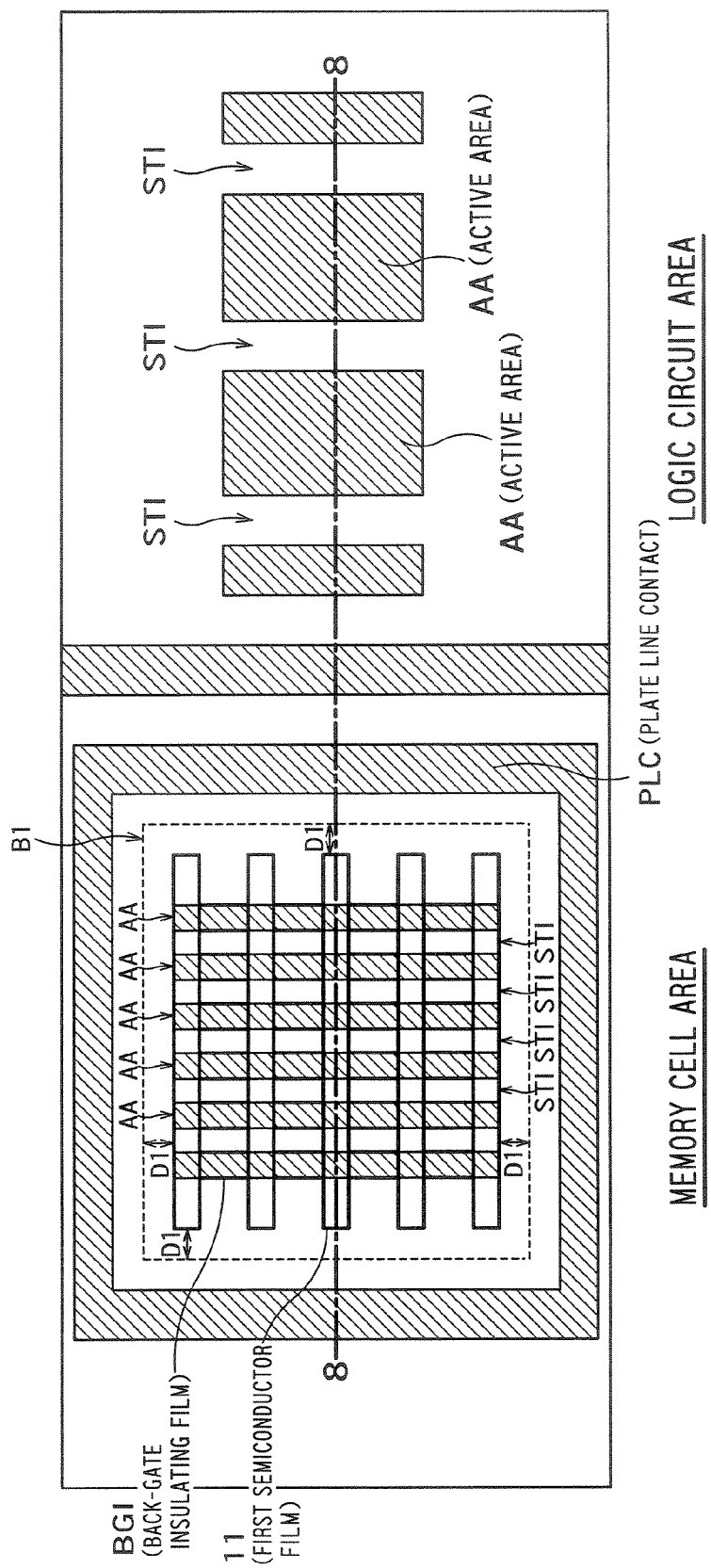
FIG. 7 is a plan view of a memory cell area, a plate line contact PLC surrounding the memory cell area, and a logic circuit area.
Figure 8:
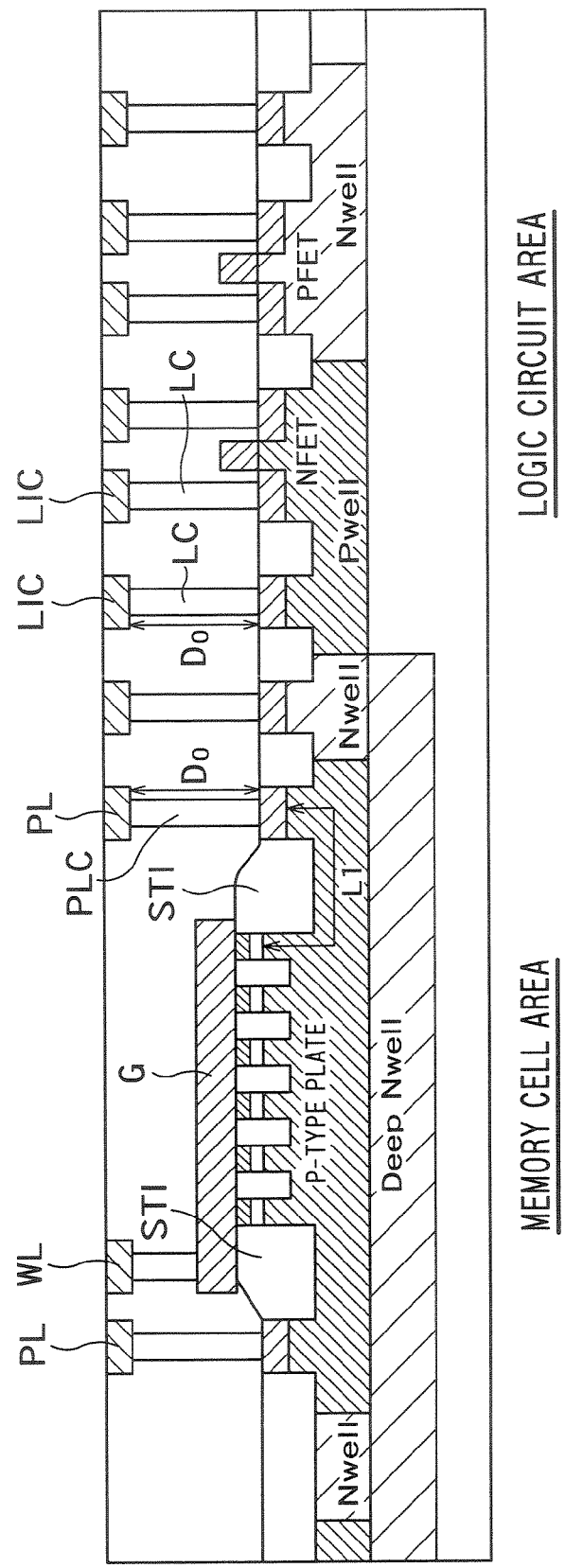
FIG. 8 is a cross-sectional view along the line 8-8 in FIG. 7.

FIG. 7 is a plan view of a memory cell area, a plate line contact PLC surrounding the memory cell area, and a logic circuit area. FIG. 8 is a cross-sectional view along the line 8-8 in FIG. 7. The broken line in FIG. 7 indicates a boundary B1 between the memory cell area and the logic circuit area. The boundary is placed in an STI area. As shown in FIG. 7, the plate line contact PLC is provided so as to surround the memory cell area. As shown in FIG. 8, a plate line PL is connected via the plate line contact PLC to a P-type plate. The P-type plate is surrounded by an N-type well.

The plate line contact PLC connects the plate line PL serving as a wiring and a supporting substrate SUB (plate). In the logic circuit area, a contact LC connects a wiring LIC and a source layer S or a drain layer D.

The depth D0 of a contact plug for the plate line contact PLC is substantially the same as the depth D0 of a contact plug for the logic contact LC. In other words, when using the surface of the supporting substrate SUB as a reference, the height of the contact plug for the plate line contact PCL is substantially the same as that of the contact plug for the logic contact LC.

The plate line contact PLC has been conventionally formed so as to pass through an element isolation area. Such conventional approach requires a step for etching the element isolation area. Further, the depth of the plate line contact is different from that of the contact in the logic circuit area, resulting in an increased failure rate of the contact.

According to the first embodiment, because the plate line contact PLC is formed so as to have substantially the same depth as that of the logic contact LC, the depth of a contact hole reaching the surface of the supporting substrate SUB does not vary. The failure rate of the contact is decreased. The contact hole passing through the element isolation area is not required, resulting in manufacturing cost reduction.

FIGS. 9A to 21B are plan views and cross-sectional views of a manufacturing method of an FBC memory device according to the first embodiment. FIGS. 9A, 10A, 11A, 12A, 13A, 14A, 15A, 19A, 20A, and 21A show a memory cell area. FIGS. 9B, 10B, 11B, 12B, 13B, 14B, 15B, 19B, 20B, and 21B show a logic circuit area.

Figure 10B:
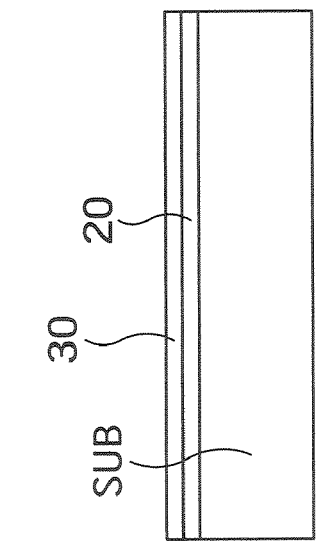
Figure 10A:
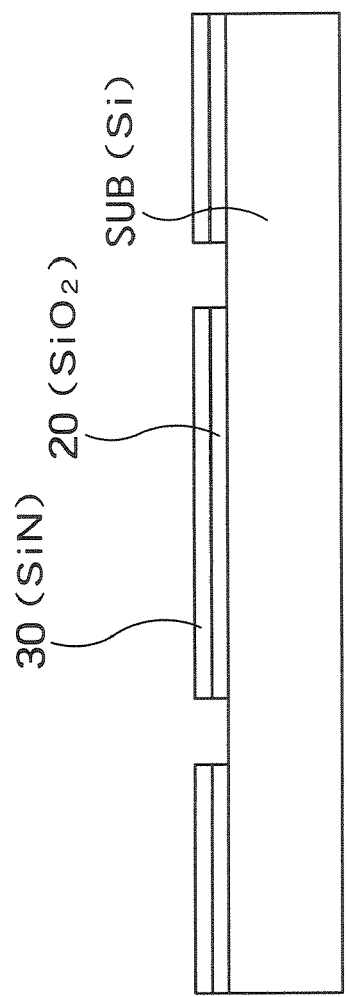
Figure 11B:
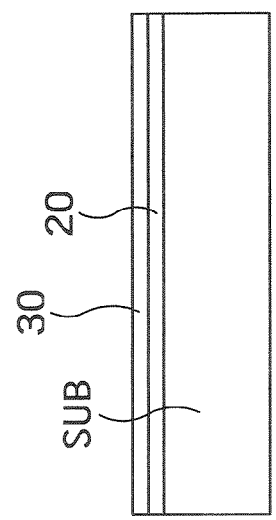
Figure 11A:
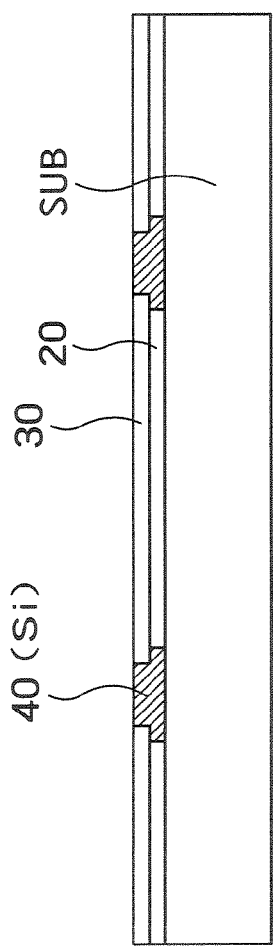

On a supporting substrate SUB, a silicon oxide film 20 and a silicon nitride film 30 are deposited as an insulation film. The multi-layer film of the silicon oxide film 20 and the silicon nitride film 30 serves as a back-gate insulation film BGI. The silicon oxide film 20 and the silicon nitride film 30 in a region where a source layer S is formed are removed by photolithography and RIE (Reactive Ion Etching). As shown in FIG. 10A, the supporting substrate SUB is exposed in the region where the source layer S is formed. In the logic circuit area, the silicon oxide film 20 and the silicon nitride film 30 cover the supporting substrate SUB as shown in FIG. 10B. A P-type impurity (e.g., boron) is ion-implanted in the supporting substrate SUB in the memory cell area, so that the plate (not shown) is formed. The plate concentration is, e.g., about $10^{19}$ cm$^{-3}$. As shown in FIG. 11A, monocrystalline silicon is selectively and epitaxially grown on the exposed supporting substrate SUB in the region where the source layer S is formed. A silicon layer 40 serving as a first semiconductor layer is thus formed.

Figure 12B:
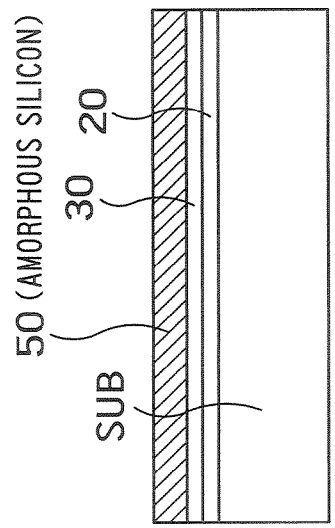
Figure 12A:
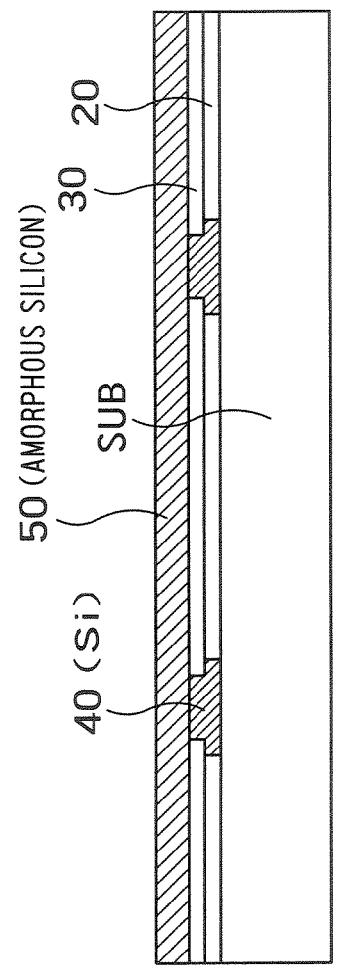

As shown in FIGS. 12A and 12B, an amorphous silicon film 50 is deposited on the silicon nitride film 30 and the silicon layer 40. Annealing is then performed in a nitrogen atmosphere at about 600° C. for a few hours. Solid phase lateral epitaxial growth occurs in the memory cell area. More specifically, as shown in FIG. 13A, the amorphous silicon film 50 is monocrystallized by thermal treatment from its portion contacting the silicon layer 40. Transformation of the amorphous silicon film 50 into monocrystalline silicon allows a silicon layer 60 serving as a second semiconductor layer to be formed. As monocrystallization proceeds, a misfit portion is created at the intermediate between adjacent silicon layers 40. Such misfit portion acts as the recombination center REC in the drain layer D.

Figure 13B:
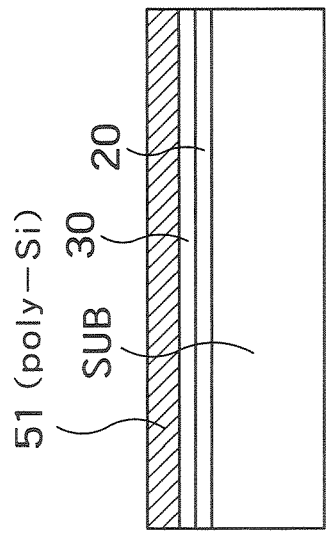
Figure 13A:
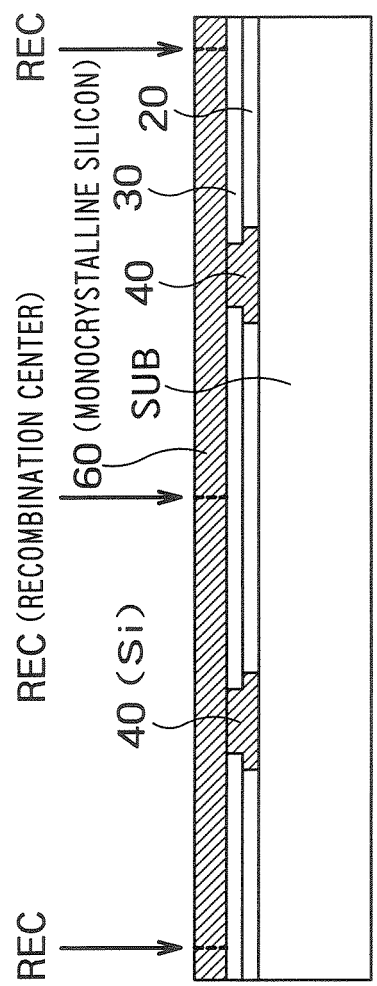

As shown in FIG. 13B, because the amorphous silicon film 50 is deposited on the silicon nitride film 30 in the logic circuit area, the amorphous silicon film 50 is not monocrystallized but becomes a polysilicon 51. As shown in FIG. 7, the boundary B1 between the silicon layer 60 and the polysilicon 51 is formed so as to be apart from the first semiconductor layer 11 by a certain distance D1. The distance D1 corresponds to the transverse dimension of the silicon layer 60 subjected to solid phase epitaxial growth. The distance D1 is determined so as to be longer than a half of the distance between adjacent source layers S.

Figure 14B:
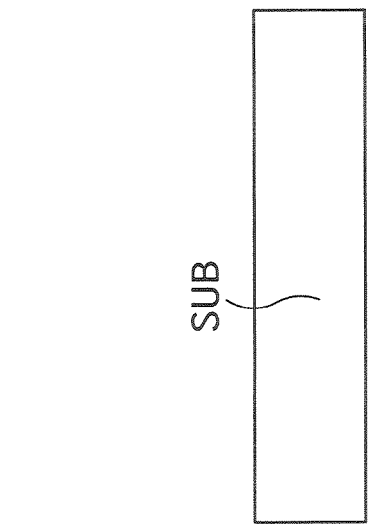
Figure 14A:
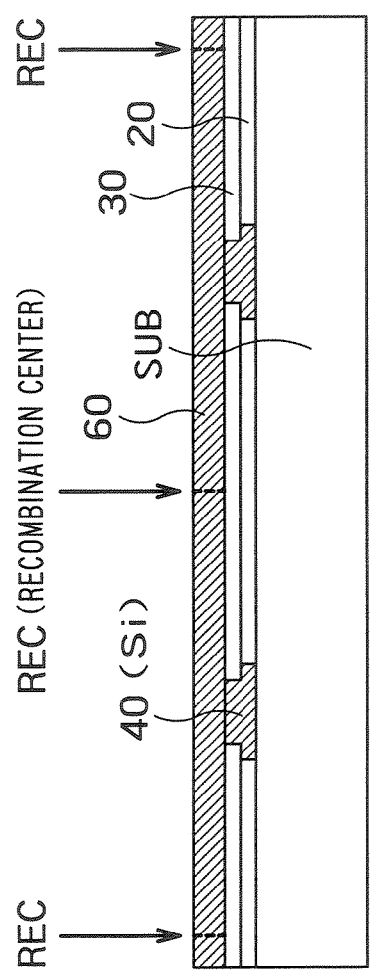

As shown in FIG. 14B, the polysilicon 51 in the logic circuit area is removed by an HCL gas. The silicon nitride film 30 and the silicon oxide film 20 in the logic circuit area are removed. The step for forming the silicon layer 40 to the step for removing polysilicon can be successively performed by the same semiconductor manufacturing equipment. In other words, the steps can be performed with an in-situ process. Thus, the first embodiment contributes significantly to manufacturing cost reduction.

Figure 15B:
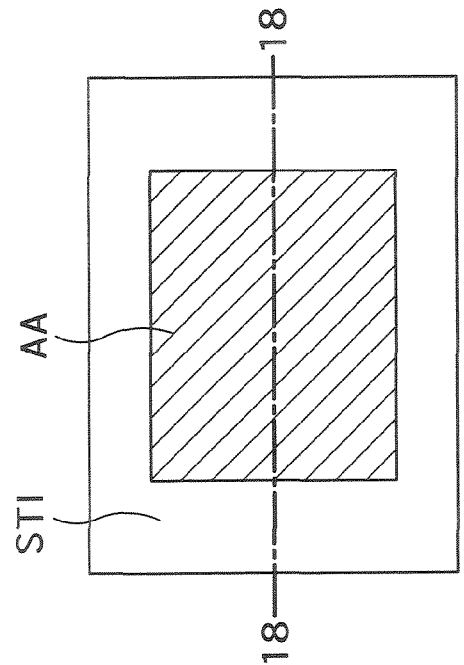
Figure 15A:
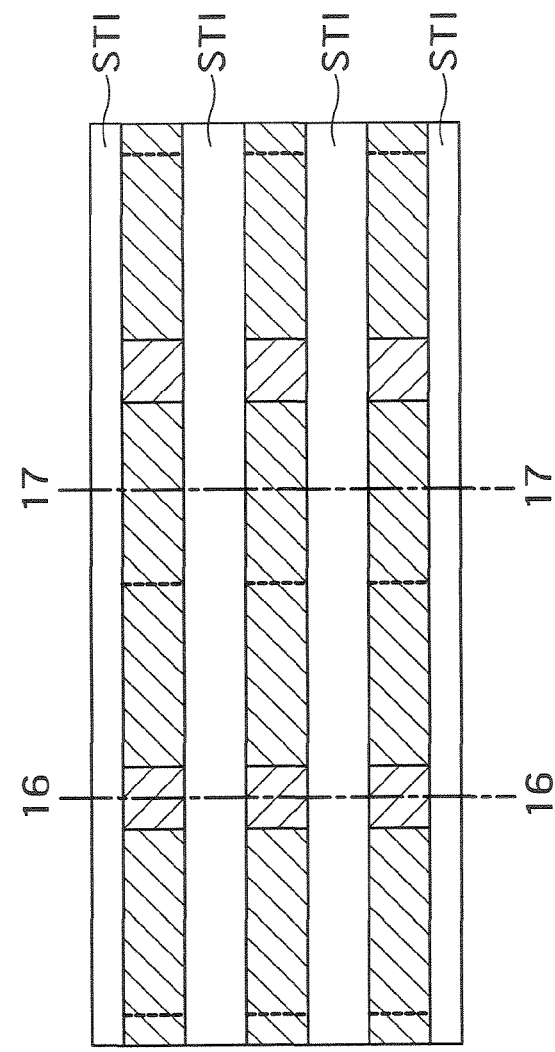
Figure 16:
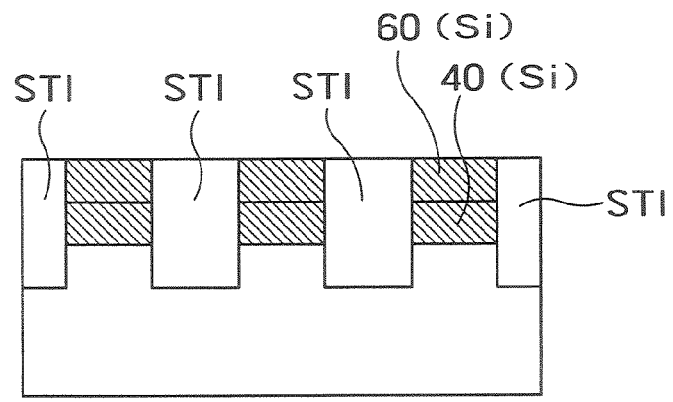
Figure 17:
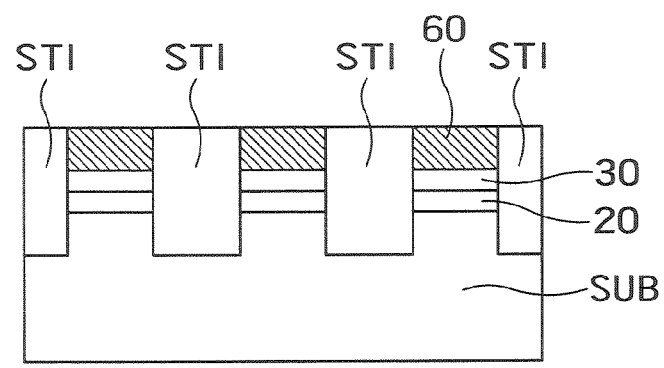
Figure 18:
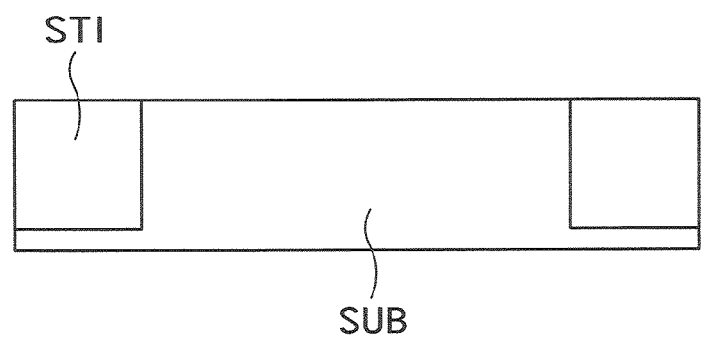

As shown in FIGS. 15A and 15B, an STI is formed in a non-active area. In the memory cell area, the STI is formed so as to pass through the silicon nitride film 30 and the silicon oxide film 20 and reach the supporting substrate SUB. At the boundary B1 between the memory cell area and the logic circuit area, different film structures oppose and steps are thus formed at the surfaces. After the STI is formed and the manufacturing steps are performed, the steps are gradually smoothed. Etching residue such as gate polysilicon caused by the steps at the boundary B1 is not generated. FIG. 16 is a cross-sectional view along the line 16-16 in FIG. 15A. As shown in FIG. 16, the cross-sections of the silicon layer 40 (first semiconductor layer) and the silicon layer 60 (second semiconductor layer) appear. FIG. 17 is a cross-sectional view along the line 17-17 in FIG. 15A As shown in FIG. 17, the cross sections of the silicon oxide film 20, the silicon nitride film 30, and the silicon layer 60 appear. FIG. 18 is a cross-sectional view of the logic circuit area along the line 18-18 in FIG. 15B. For convenience, the silicon layer 40 is referred to as the first semiconductor layer 11 and the silicon layer 60 is referred to as the second semiconductor layer 12.

After a gate insulation film is formed, as shown in FIGS. 19A and 19B, a gate electrode G is formed.

FIG. 20A is a cross-sectional view along the line 20A-20A in FIG. 19A. FIG. 20B is a cross-sectional view along the line 20B-20B in FIG. 19B. As shown in FIGS. 19A to 20B, the gate insulation film GI and the gate electrode G are formed on the body region B of the second semiconductor layer 12.

Figure 21B:
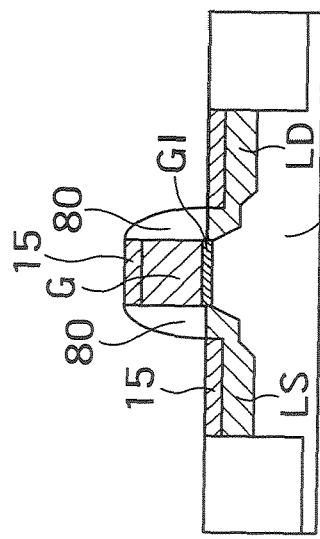
Figure 21A:
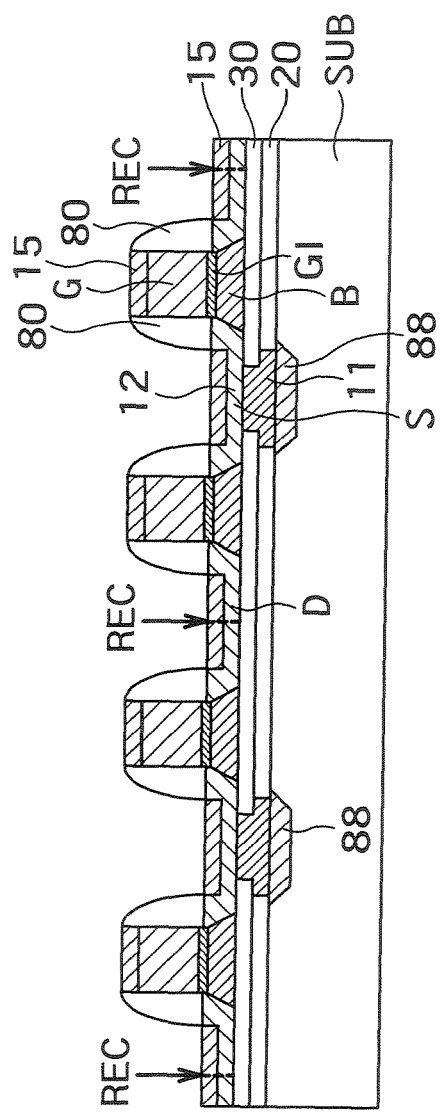

An extension layer (not shown) is then formed in the source/drain region, if necessary. As shown in FIGS. 21A and 21B, a sidewall film 80 is formed at the side surface of the gate electrode G. By using the gate electrode G and the sidewall film 80 as a mask, an N-type impurity is ion-implanted in the source/drain region. Thermal treatment is then performed so that the N-type impurity is diffused via the first semiconductor layer 11 on the surface of the supporting substrate SUB. An N-type diffusion layer 88 is thus formed. Alternatively, at the time of ion implantation, the N-type impurity is introduced in the surfaces of the first semiconductor layer 11 and the supporting substrate SUB, and thermal treatment is performed. A silicide layer 15 is formed on the surfaces of the source/drain region and the gate electrode.

Conventional steps are then performed. An interlayer insulating layer IL, contacts SLC, BLC, LC, and wirings BL, SL, LIC are formed. The source line contact SLC passes through the interlayer insulating layer IL to reach the source layer S, and is electrically connected via the source layer S and the first semiconductor layer 11 to the supporting substrate SUB. In this way, the FBC memory device is completed.

When the FBC memory device is formed, an SOI substrate is utilized conventionally Extremely thin SOI substrate with around 10 nm of a BOX layer is ten or more times as expensive as usual bulk silicon substrates.

In contrast, according to the manufacturing method of the first embodiment, the first semiconductor layer 11 connecting the plate and the source of the memory cell is formed and the second semiconductor layer 12 including the body region B is then formed. By using not the SOI substrate but the bulk silicon substrate, the FBC memory device is formed. This leads to significant manufacturing cost reduction.

By using the bulk substrate for forming the FBC, the logic circuit is formed on the same bulk substrate. When the logic circuit is formed on the bulk substrate, there exists a rich accumulation of conventional logic circuit design techniques. It is beneficial in terms of design that the FBC memory and the logic circuit can be formed on the same bulk substrate.

According to the first embodiment, by forming the second semiconductor layer 12 with solid phase lateral epitaxial growth, an SOI structure is formed on the bulk substrate. When monocrystalline regions growing transversely from adjacent source regions collide with each other, a misfit portion is formed.

The misfit portion generally increases leakage current in a PN junction. Otherwise, in order to prevent the misfit portion, the layout size may be increased. Particularly in a memory cell array, an increase in cell size may present a serious problem.

In the first embodiment, the misfit portion is formed in the drain layer D, so that bipolar disturb is avoided while leakage current is suppressed. According to the first embodiment, by utilizing usually unfavorable misfit portion (recombination center) positively, the bipolar disturb is suppressed.

According to conventional manufacturing methods, an impurity for forming a plate is ion-implanted into a supporting substrate via an SOI layer and a BOX layer. According to the conventional method, however, when the BOX layer is thin, the impurity is implanted in the SOI layer as well as the supporting substrate. The surface concentration of the supporting substrate is not determined independently of the concentration of the SOI layer. The concentration of a body region must be equal to or less than about $10^{18}$ cm$^{-3}$ in order to suppress junction leakage current. The concentration of the supporting substrate thus must be about $10^{18}$ cm$^{-3}$. When data is read or written, a depletion layer is formed in the supporting substrate and the body-plate capacitance cannot be increased.

According to the manufacturing method of the first embodiment, an impurity is ion-implanted in the supporting substrate SUB and then the second semiconductor layer 12 is formed. The impurity concentration of the plate is determined independently of the impurity concentration of the second semiconductor layer 12. For example, after the plate with an impurity concentration of $10^{18}$ cm$^{-3}$ or more is formed, the body region with an impurity concentration of less than $10^{18}$ cm$^{-3}$ is formed. According to the first embodiment, the difference in threshold voltage between a memory cell storing data "0" and a memory cell storing data "1" is widened and data retention time is extended while junction leakage current is suppressed.

As described above, the plate line contact PLC is formed so as to have substantially the same depth as that of the logic contact LC. Because a contact hole passing through an element isolation area is not necessary, the FBC memory device of the first embodiment is manufactured easier than conventional cases.

When the drain D is connected to the supporting substrate SUB, the parasitic capacitance between the bit line BL and the supporting substrate SUB is increased. The bit line BL is driven at high or low voltages when the data is read/written. In the first embodiment, the drain D is separated from the supporting substrate SUB by the back-gate insulation film BGI. As compared to a second embodiment, the parasitic capacitance is decreased, the operational speed of the circuit is increased and power consumption is decreased.

The selective epitaxial step described with reference to FIG. 11 can be omitted. The amorphous silicon 50 is transformed to monocrystalline silicon and acts as both the first semiconductor layer and the second semiconductor layer. The manufacturing method that selective epitaxial growth is omitted accomplishes manufacturing cost reduction.

According to a manufacturing method using selective epitaxial growth, the distance of monocrystallization by solid phase growth is short, which leads to a decrease in the possibility of defects in a crystal. With this manufacturing method, memories with extended data retention time are manufactured.

Second Embodiment

Figure 22:
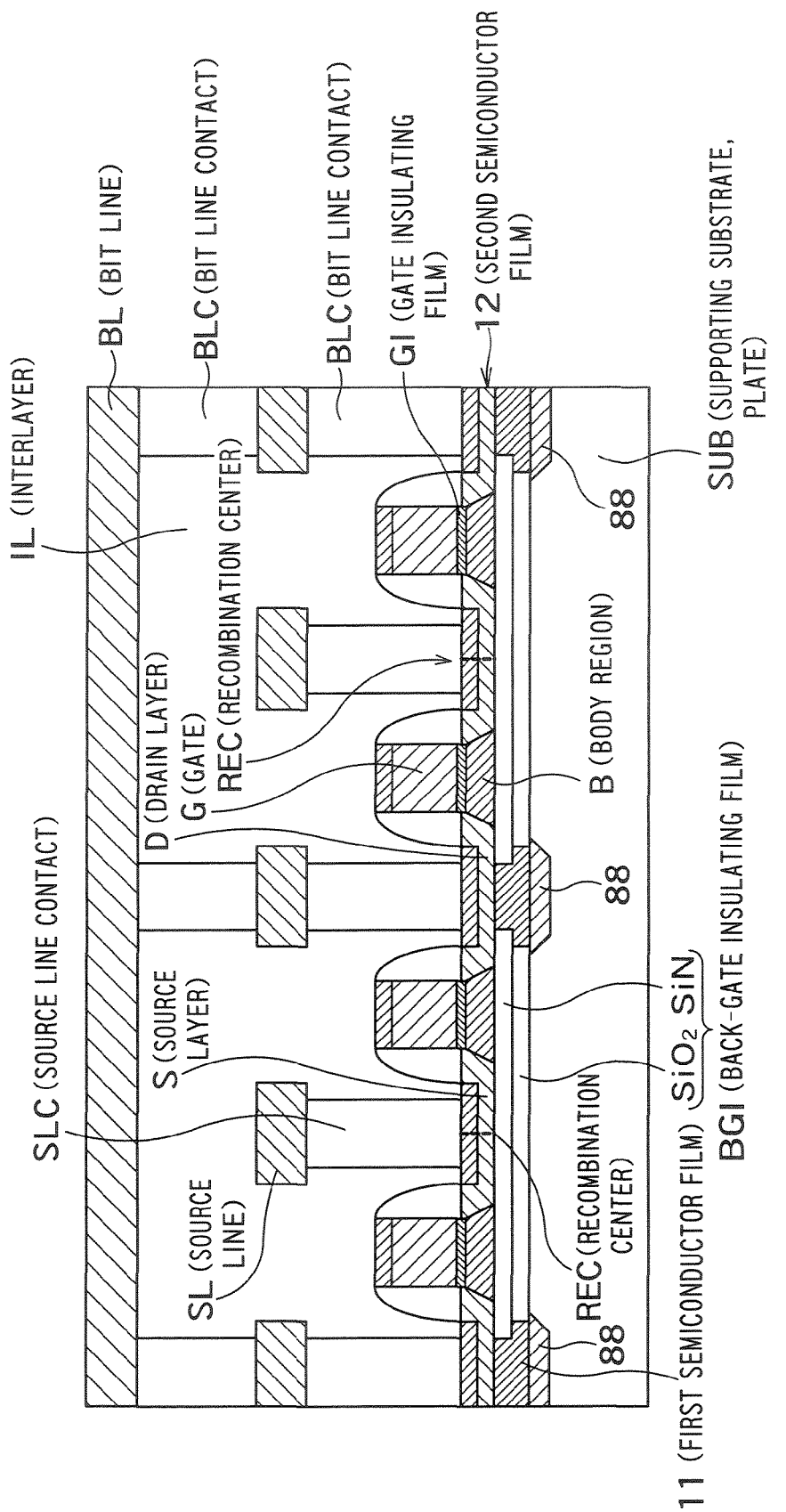
FIG. 22 is a cross-sectional view of an FBC memory device of a second embodiment of the present invention.

FIG. 22 is a cross-sectional view of an FBC memory device of a second embodiment of the present invention. The second embodiment is different from the first embodiment in that a drain layer D is electrically connected to a supporting substrate SUB (plate) and a recombination center REC is provided at a source layer S. Other configurations of the second embodiment can be the same as in the first embodiment. The drain layer D is provided on a first semiconductor layer 11 and electrically connected via the first semiconductor layer 11 to the supporting substrate SUB. The source layer S is provided on a back-gate insulation film BGI. Although the source layer S is not connected to the supporting substrate SUB, the recombination center REC is provided in the source layer S.

By the drain layer D electrically connected to the supporting substrate SUB, holes generated by impact ionization at the time of data writing are emitted from the drain layer D to the supporting substrate SUB. Flowing of the holes into an adjacent non-selected memory cell is thus prevented. Because the recombination center REC is provided in the source layer S, the holes generated by the impact ionization do not flow into the adjacent non-selected memory cell. Bipolar disturb is thus suppressed in the second embodiment. The second embodiment has the same effects as in the first embodiment in spite of the opposed positional relationship between the source layer S and the drain layer D with respect to that of the first embodiment.

Third Embodiment

Figure 23:
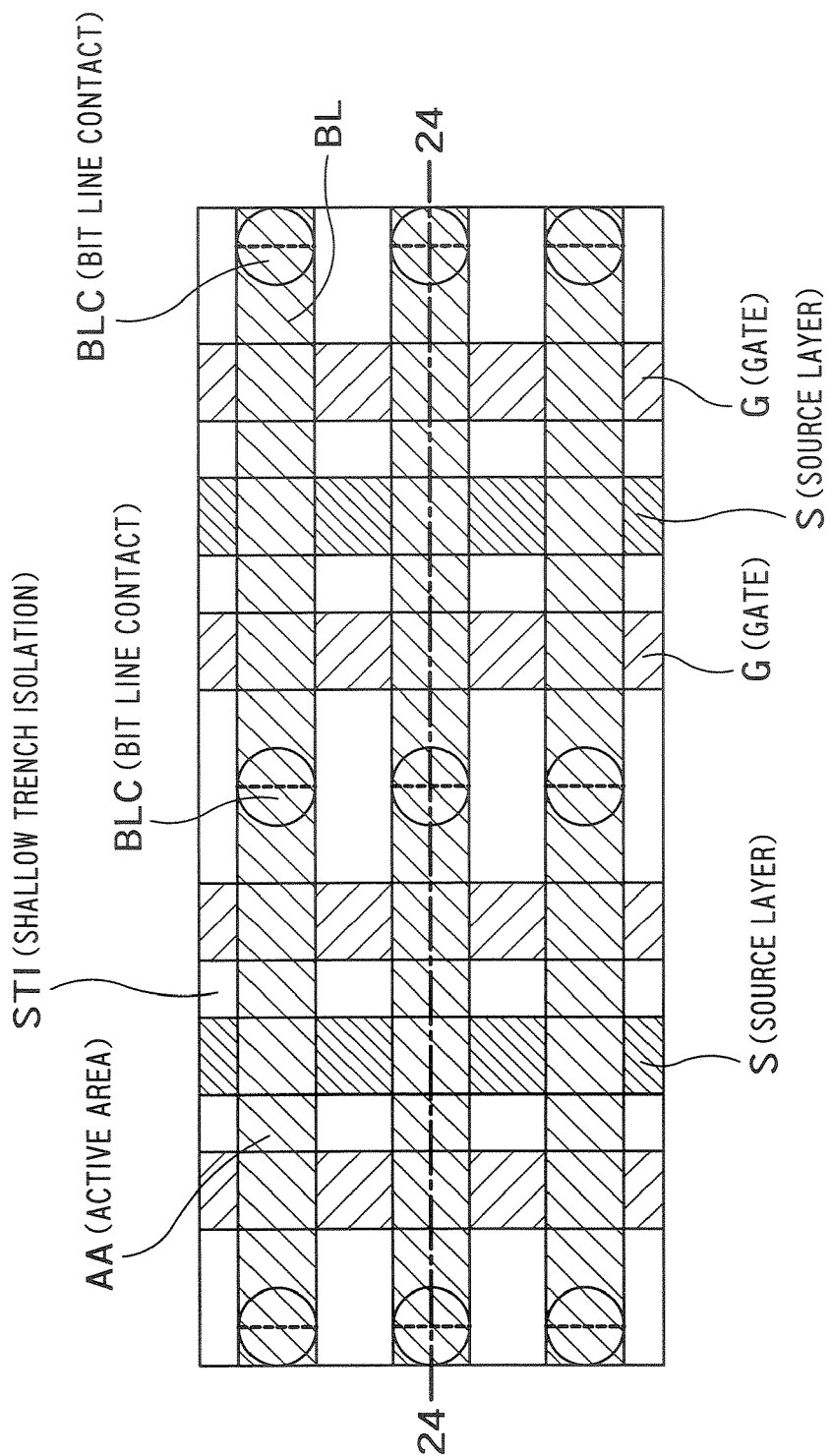
FIG. 23 is a plan view of an FBC memory device of a third embodiment of the present invention.
Figure 24:
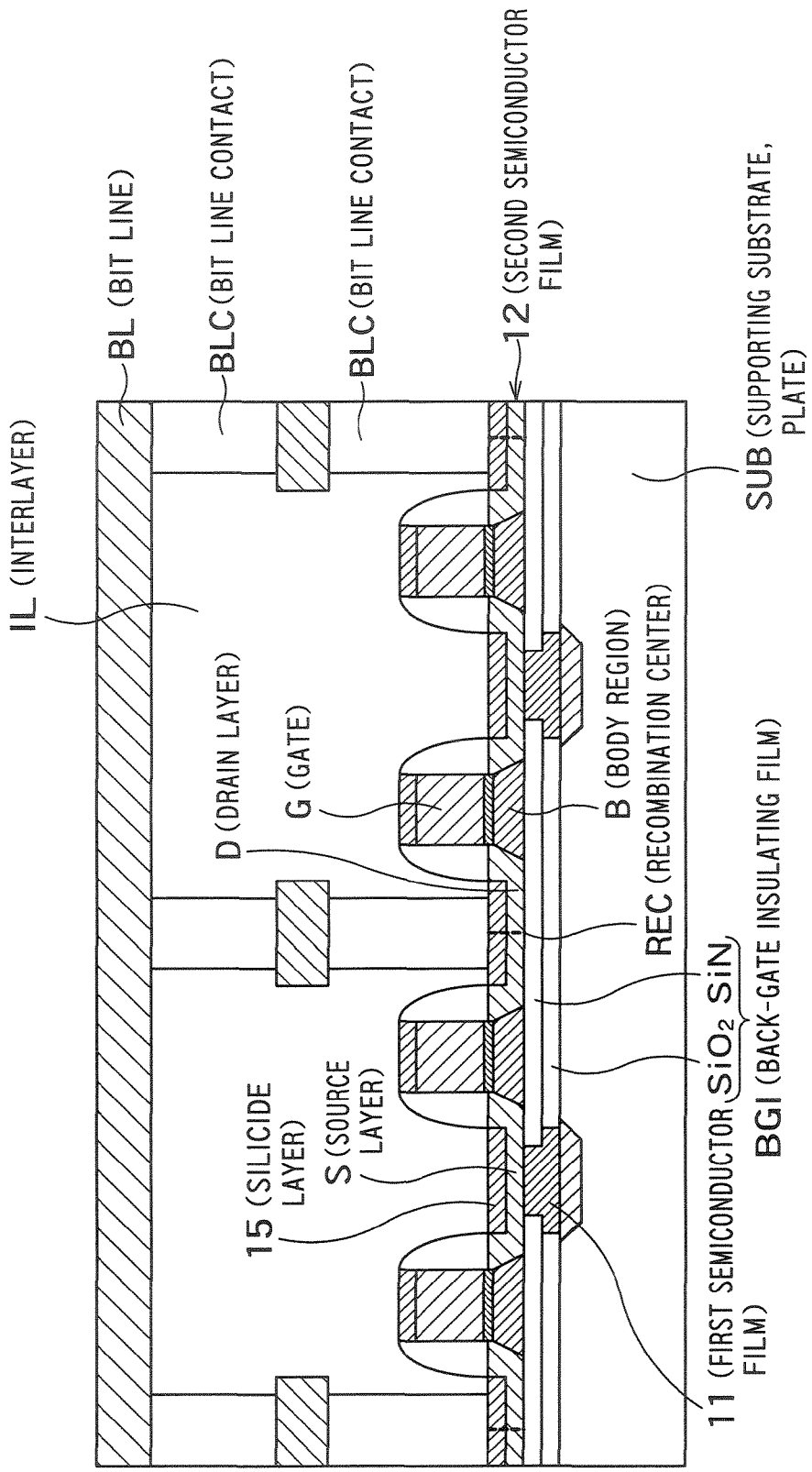
FIG. 24 is a cross-sectional view along the line 24-24 in FIG. 23.

FIG. 23 is a plan view of an FBC memory device of a third embodiment of the present invention. FIG. 24 is a cross-sectional view along the line 24-24 in FIG. 23. The third embodiment is different from the first embodiment in that a plurality of source layers S are connected by a silicide layer 15 and a source line contact SLC and a source line SL are not provided. Other configurations of the third embodiment can be the same as in the first embodiment.

According to the third embodiment, the distance between a bit line contact BLC and a gate G is further shortened and the size of a memory cell becomes smaller.

Fourth Embodiment

In the first embodiment, as shown in FIG. 14, the amorphous silicon film 50, the silicon nitride film 30, and the silicon oxide film 20 deposited on the logic circuit area are removed. The height level of the surface of the supporting substrate SUB on which the logic circuit is formed is different from that of the surface of the second semiconductor layer 12 on which the memory cell is formed. This may cause defocusing in the memory cell area and/or the logic circuit area at the time of lithography for forming the gate electrode G. The chip yield may be decreased.

The height of the surface of the silicon film 60 (second semiconductor layer) in the memory cell area shown in FIG. 14 is preferably the same level as that of the surface of the supporting substrate SUB in the logic circuit area. According to an FBC memory device of a fourth embodiment, as shown in FIG. 25, the height of the top surface of a supporting substrate SUB in a logic circuit area is substantially the same level as that of the top surface of a body region B in a memory cell. A manufacturing method of the fourth embodiment allows the height of the surface of a silicon film 60 in the memory cell area to be the same level as that of the surface of the supporting substrate SUB in the logic circuit area.

FIGS. 26A to 30B are cross-sectional views of a manufacturing method of an FBC memory device according to the fourth embodiment of the present invention. FIGS. 26A, 27A, 28A, 29A and 30A are cross-sections of a memory cell area. FIGS. 26B, 27B, 28B, 29B and 30B are cross-sections of a logic circuit area.

Figure 26B:
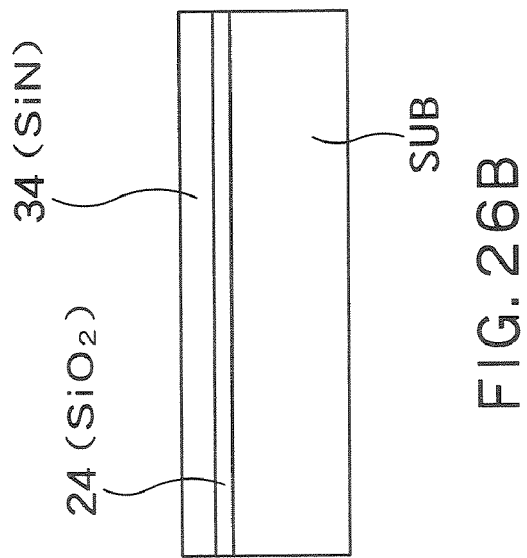
Figure 26A:
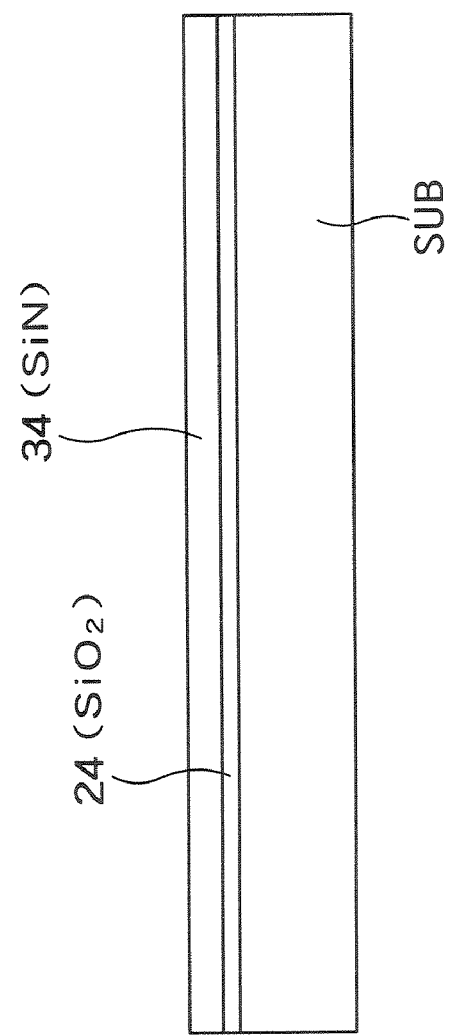
Figure 27B:
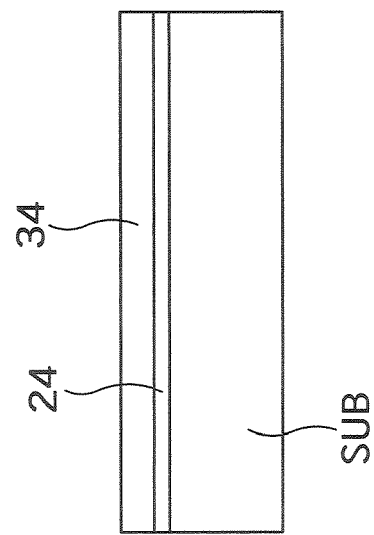
Figure 27A:
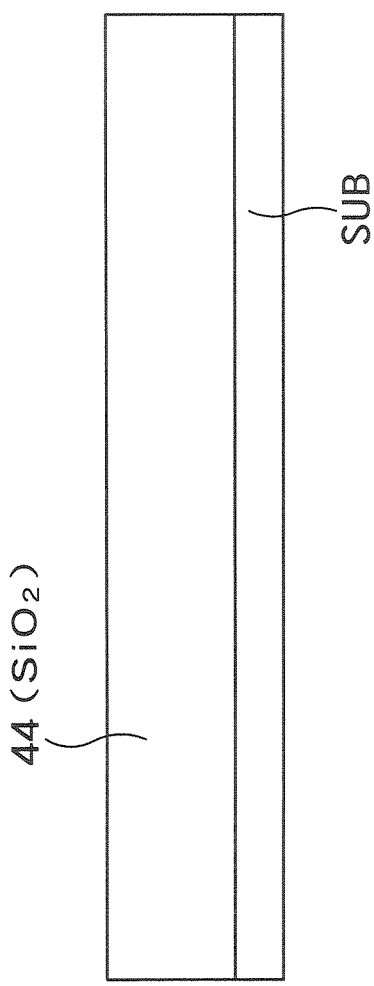

As shown in FIGS. 26A and 26B, a silicon oxide film 24 and a silicon nitride film 34 are deposited on a supporting substrate. By photolithography and wet etching, the silicon oxide film 24 and the silicon nitride film 34 in the memory cell area are removed. The memory cell area refers to as the area within the boundary B1 shown in FIG. 7. By thermally oxidizing the supporting substrate SUB, as shown in FIG. 27A, a silicon oxide film 44 is formed on the supporting substrate SUB. By adjusting the film thickness of the silicon oxide film 44, the height of a second semiconductor layer 12 is made to be the same level as that of the supporting substrate SUB in the logic circuit area. The silicon oxide film 44 is removed using ammonium fluoride.

A P-type impurity such as boron is ion-implanted in the supporting substrate SUB in the memory cell area. A plate with a concentration of about $10^{19}$ cm$^{-3}$ is formed.

As shown in FIG. 28A, the supporting substrate SUB is thermally oxidized and a silicon oxide film 20 is formed. On the silicon oxide film 20, a silicon nitride film 30 is deposited. The silicon oxide film 20 and the silicon nitride film 30 function as a back-gate insulation film BGI. The silicon oxide film 20 and the silicon nitride film 30 in a region where a source layer S is formed are removed. The logic circuit area has substantially the same configuration as in FIG. 27B, as shown in FIG. 28B.

Figure 29B:
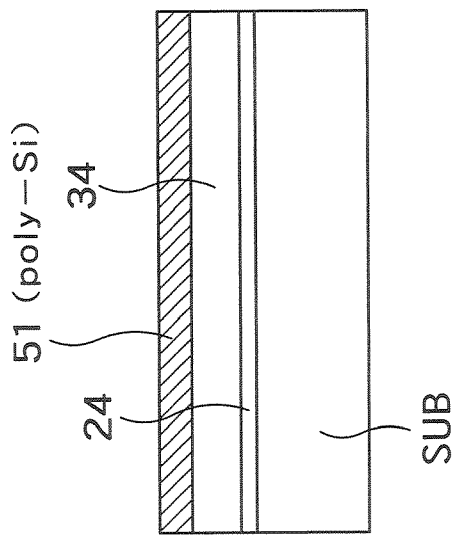
Figure 29A:
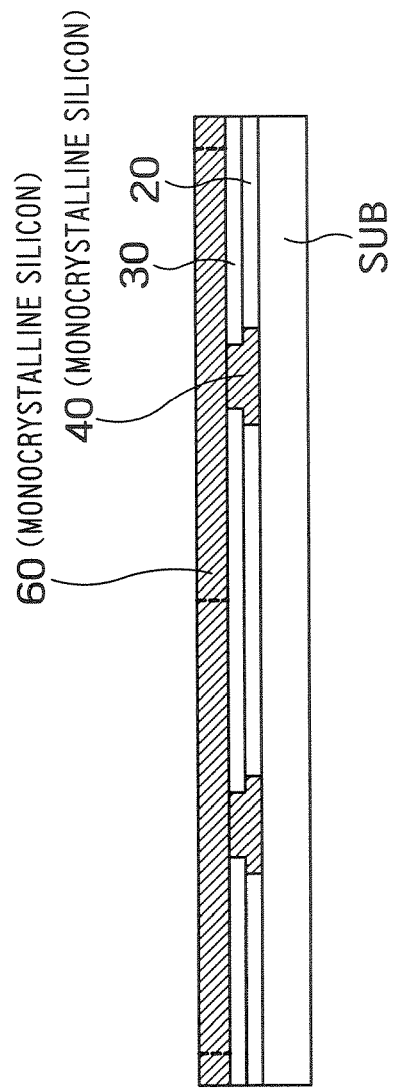

As shown in FIG. 29A, silicon films 40 and 60 are formed as in the first embodiment. In the logic circuit area, a polysilicon film 51 is formed on the silicon nitride film 34. The boundary between the silicon film 60 and the polysilicon film 51 is the boundary B1 shown in FIG. 7 and coincides with the boundary of the silicon nitride film 34.

As shown in FIG. 30, the polysilicon film 51, the silicon nitride film 34, and the silicon oxide film 24 are removed. The structure shown in FIG. 30 is similar to the structure shown in FIG. 14 but different in that the height of the surface of the silicon film 60 (second semiconductor layer) in the memory cell area is the same level as that of the surface of the supporting substrate SUB in the logic circuit area. The same steps as those of FIGS. 15A to 21B in the first embodiment are performed. The FBC memory device of the fourth embodiment is thus completed.

The fourth embodiment can be applied to the second or third embodiment, which adds effects of the second or the third embodiment to the fourth embodiment.

Modification of Fourth Embodiment

FIGS. 31A to 34B are cross-sectional views of a manufacturing method of an FBC memory device according to a modification of the fourth embodiment. By the method of the modification, the height of the surface of the second semiconductor layer 12 in the memory cell area is made to be the same level as that of the surface of the supporting substrate SUB in the logic circuit area as in the fourth embodiment.

The same structures as those of FIGS. 10A and 10B in the first embodiment are provided. As shown in FIG. 31, the silicon nitride film 30 and the silicon oxide film 20 in the logic circuit area are removed. The boundary of the logic area is the boundary B1 shown in FIG. 7. Surfaces of the supporting substrate SUB in the region where the source is formed in the memory cell area and the supporting substrate SUB in the logic circuit area are exposed.

Figure 32A:
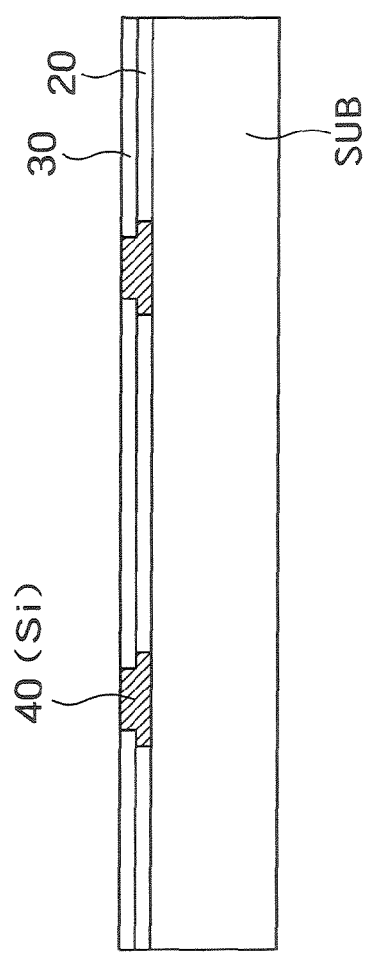
Figure 32B:
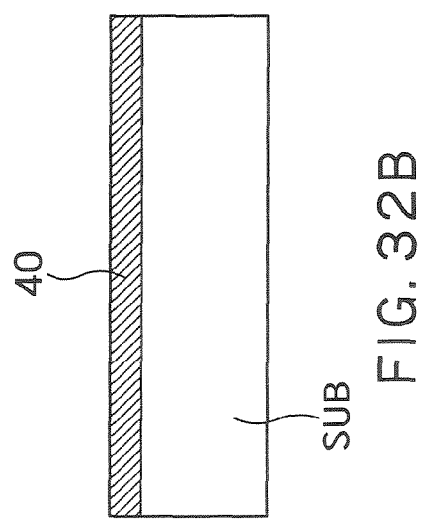

As shown in FIGS. 32A and 32B, the silicon film 40 made of monocrystalline silicon is formed on the exposed supporting substrate SUB by selective epitaxial growth.

Figure 33B:
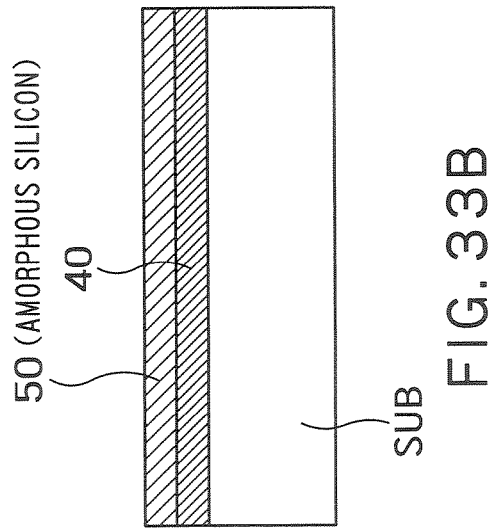
Figure 33A:
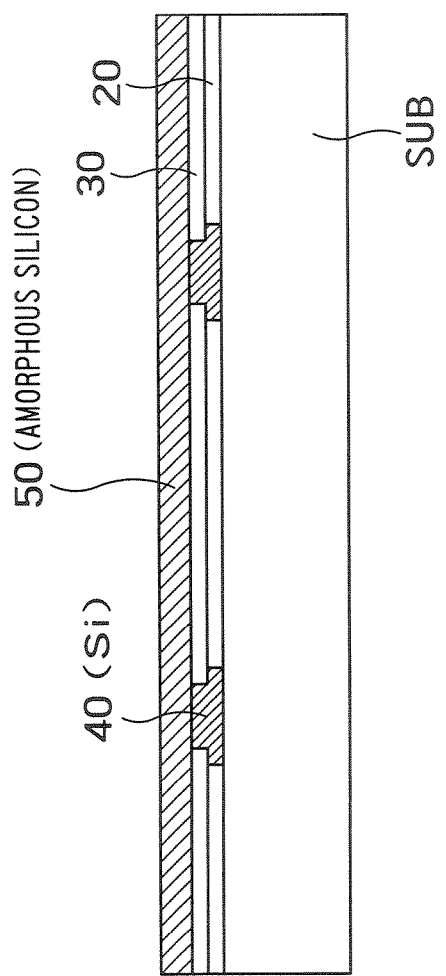

As shown in FIGS. 33A and 33B, the amorphous silicon film 50 is deposited on the silicon film 40 and the silicon nitride film 30. Annealing is then performed in a nitrogen atmosphere at about 600° C. for about 60 minutes. Solid phase lateral epitaxial growth occurs in the memory cell area as described above. The solid phase lateral epitaxial growth also occurs in the logic circuit area. The silicon film 60 made of monocrystalline silicon is formed in both the memory cell area and the logic circuit area. Annealing is performed in a hydrogen atmosphere at 1000° C. under an atmospheric pressure of 100 Torr for about 1 minute. This causes transformation of silicon atomic structure and the flatness of the surface of the silicon film 60 is improved. The silicon film 40 serves as the first semiconductor layer 11 and the silicon film 60 serves as the second semiconductor layer 12.

The same steps as those of FIGS. 15A to 21B in the first embodiment are performed and the FBC memory device is thus completed. In the logic circuit area, circuit elements are formed not on the supporting substrate SUB but on the silicon film 60. The height of the surface of the silicon film 60 in the logic circuit area is the same level as that of the surface of the silicon film 60 in the memory cell area. By forming the logic circuit elements on the silicon film 60, the FBC memory device shown in FIG. 25 is manufactured as in the fourth embodiment.

Fifth Embodiment

Figure 35:
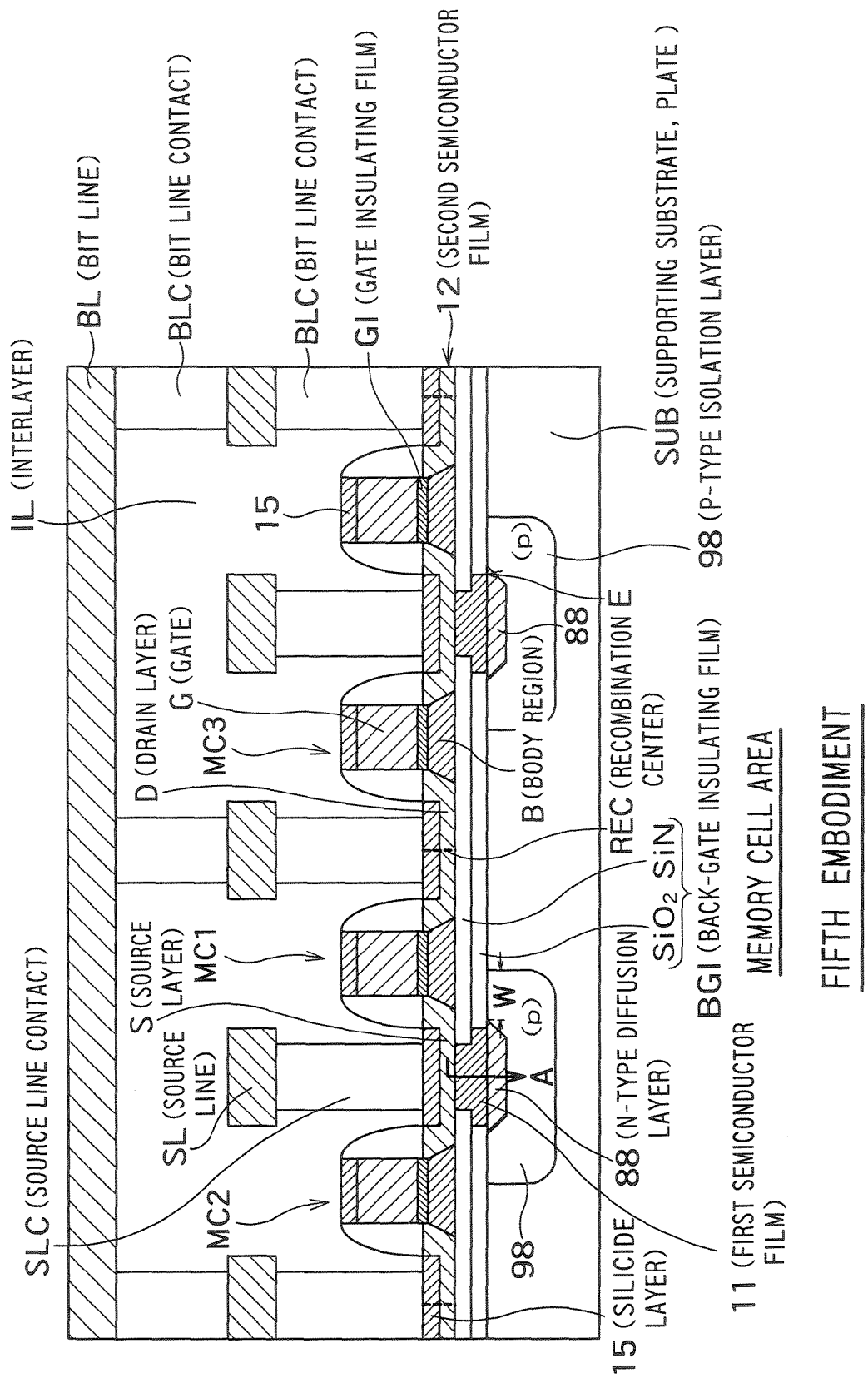
FIG. 35 is a cross-sectional view of an FBC memory device according to a fifth embodiment of the present invention.

FIG. 35 is a cross-sectional view of an FBC memory device according to a fifth embodiment of the present invention. In the fifth embodiment, a plate is an N-type semiconductor. A P-type isolation layer (isolation diffusion layer) 98 is formed around a diffusion layer 88 in the plate or the support substrate.

The isolation layer 98 formed in the supporting substrate SUB is connected to the source layer S and forms a pn-junction with the source layer S. The source layer S is shared to plurality of memory cells adjacent each other for miniaturization of the memory device.

According to the fifth embodiment, because the conductivity of the plate is N-type, when negative voltage is applied to the plate, the surface of a supporting substrate SUB is in an accumulation state. As a result, a decrease in body-plate capacitance is prevented. As indicated by the line L4 in FIG. 5B, when the plate is of N-type and the plate voltage is around −4V, ΔVth exhibits its maximum value of 0.969V. An FBC memory device with an N-type plate exhibits a larger difference in threshold voltage ΔVth than that of an FBC memory device with a P-type plate.

When −3V of potential is applied to the plate, a reverse bias is applied to the pn junction between a source S and the P-type isolation layer 98. A forward bias is applied to the pn junction between the P-type isolation layer 98 and the plate. When holes from data "1" memory cells MC reach the source S, the holes in the source S are immediately released to the supporting substrate SUB by an electric field. This suppresses bipolar disturb.

Figure 36:
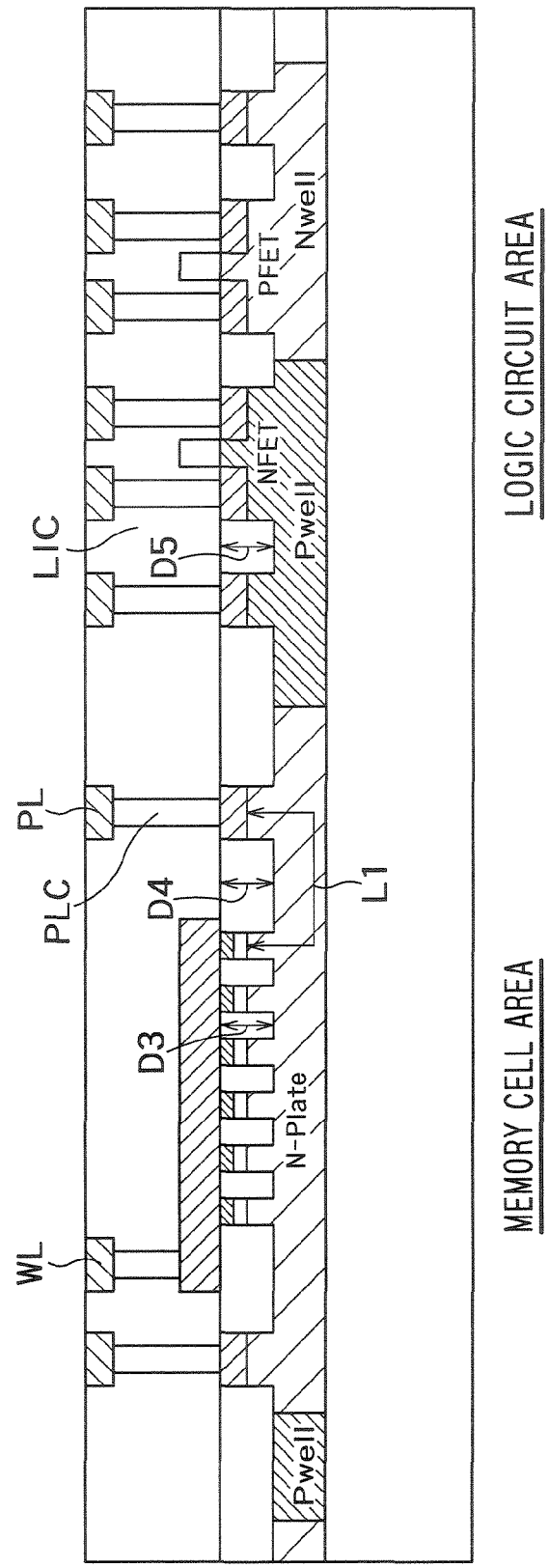
FIG. 36 is a cross-sectional view of a memory cell area and a logic circuit area.

FIG. 36 is a cross-sectional view of a memory cell area and a logic circuit area. In the memory cell area, the N-type plate is formed and a plate line contact PLC is formed so as to surround the memory cell area to apply a voltage to the P-type isolation layer 98. The depth D3 of an STI in the memory cell area, the depth D4 of the STI in the vicinity of a boundary 81, and the depth D5 of the STI in the logic circuit area are the same. The STI is thus formed easily. The depth of the STI is, e.g., about 0.3 µm.

A manufacturing method of the fifth embodiment will be described. As shown in FIGS. 37A and 37B, an N-type impurity is ion-implanted in the memory cell area so that the N-type plate is formed. For example, phosphorus with a concentration of $10^{18}$ cm$^{-3}$ is introduced into the supporting substrate SUB. A silicon oxide film 20 and a silicon nitride film 30 are then deposited on the supporting substrate SUB. A silicon oxide film 210 is deposited on the silicon nitride film 30. By photolithography and RIE, the silicon oxide film 210 in a region where the source layer S is formed is removed. The silicon oxide film 210 on the logic circuit area is also removed.

By using the silicon oxide film 20 and the silicon nitride film 30 as a mask, boron having a dose of $10^{14}$ cm$^{-2}$ is ion-implanted at acceleration energy of 5 keV. Annealing is then performed in a nitrogen atmosphere at 950° C. for 60 minutes. The P-type diffusion layer 98 shown in FIGS. 38A and 38B is formed. A transverse-directional diffusion distance X of the P-type impurity is controlled by adjusting edges of the silicon oxide film 20 and the silicon nitride film 30, annealing temperature, and annealing time. By adjusting the dose of boron, the concentration of boron in a region having the minimum width W from the end of the diffusion layer 88 to the end of the isolation layer 98 shown in FIG. 35 is increased. As a result, electric short of the source S and the supporting substrate SUB caused by punch-through is suppressed.

Figure 34B:
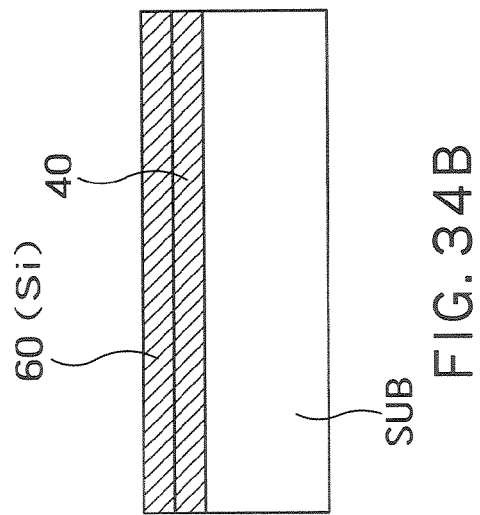
Figure 34A:
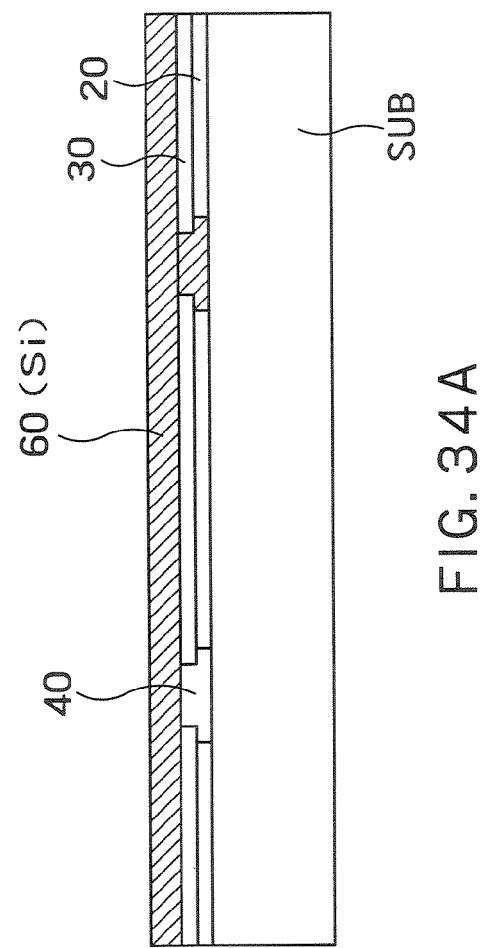

After the silicon oxide film 210 is removed, silicon layers 40 and 60 are formed as described with reference to FIGS. 32 to 34. The steps shown in FIGS. 15 to 21 in the first embodiment are then performed. The device shown in FIG. 35 is thus completed.

The P-type isolation layer 98 can be provided below the drain layer D in the second embodiment. Using an N-type plate with the P-type isolation layer below the drain layer D, effects of the fifth embodiment are applied to the second embodiment.

Sixth Embodiment

In the fifth embodiment, the depths D3, D4, and D5 of the STI are the same as shown in FIG. 36 and are, e.g., about 0.3 µm. The second semiconductor layer 12 has a thickness of, e.g., 10 nm to 50 nm. If the depth of the STI is deep, a path L1 from the plate line contact PLC to the memory cell MC at the center of the memory cell area is extended. In addition, as the depth of the STI is deeper, the sheet resistance of the plate is increased. The resistance of the path L1 is increased and the plate potential just under the body region B is unstable and non-homogeneous. Due to the increased plate resistance, the plate potential in a central portion of the cell area is different from that in an edge portion of the cell area. If a source and/or a drain are connected to the supporting substrate (plate), a larger IR drop is caused by a leakage current between the source/drain and the supporting substrate (plate). Thus, in order to realize a stable and homogeneous plate potential, decreasing the leakage current and the plate resistance is required especially in the structure of the present embodiment. If the plate potential is unstable and non-homogeneous, the difference in threshold voltage between a memory cell storing data "0" and a memory cell storing data "1" may not be assured sufficiently in the entire cell area.

Figure 39:
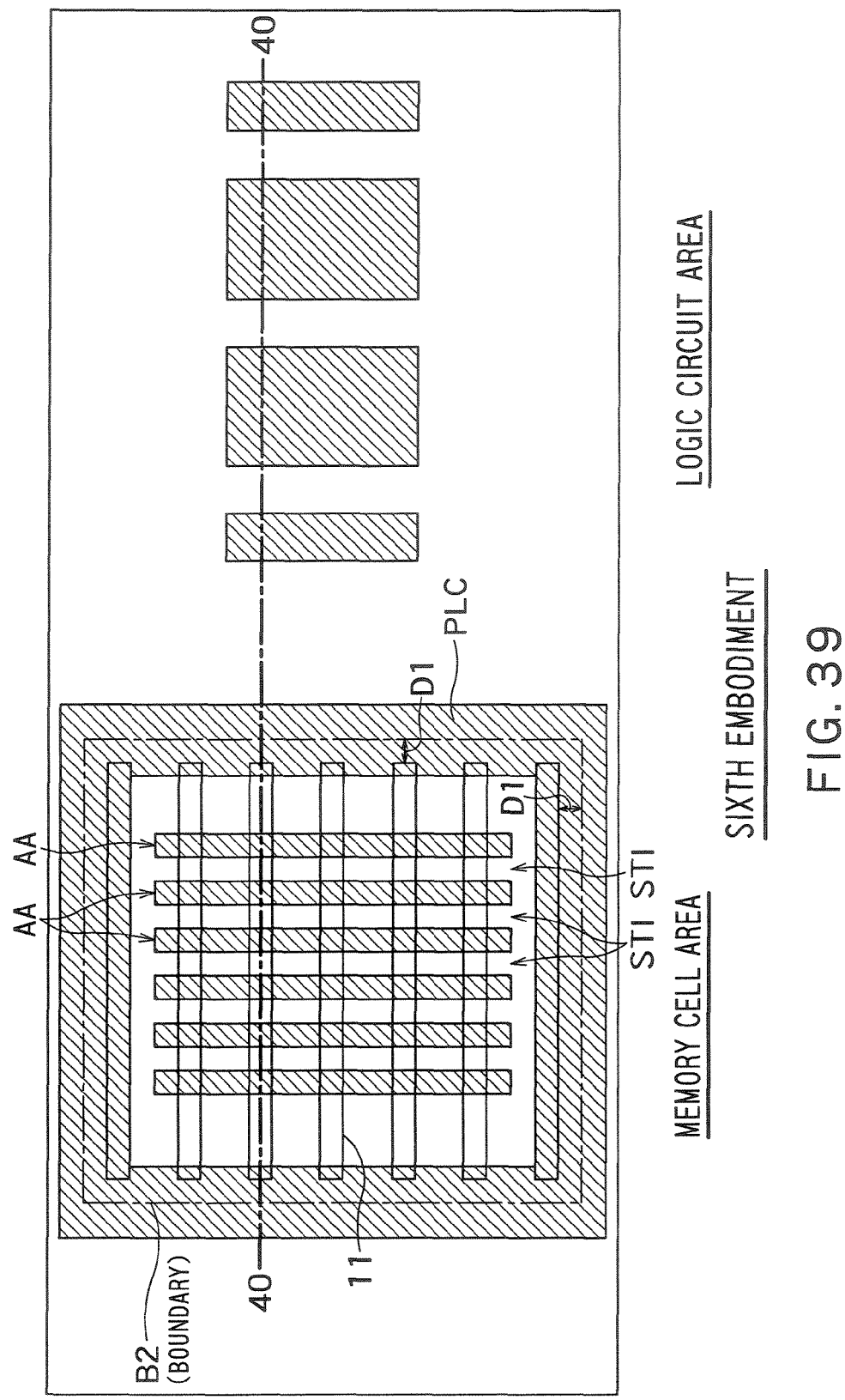
FIG. 39 is a plan view of an FBC memory device according to a sixth embodiment of the present invention.
Figure 40:
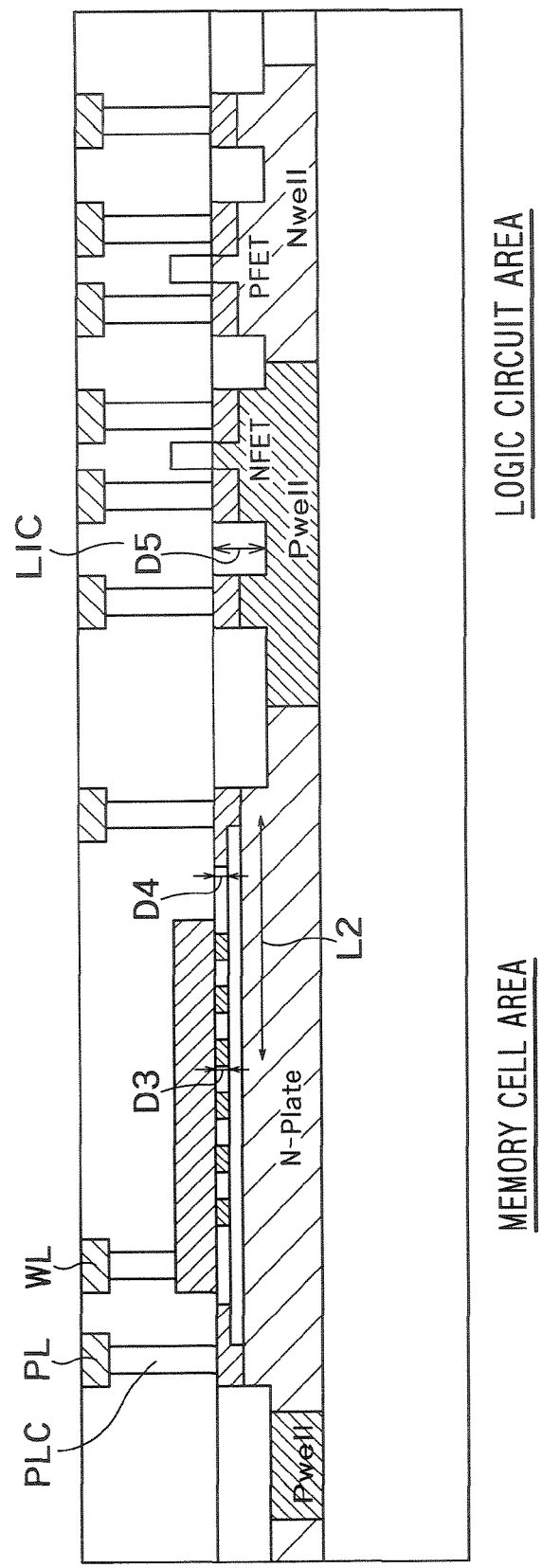
FIG. 40 is a cross-sectional view along the line 40-40 in FIG. 39.
Figure 41:
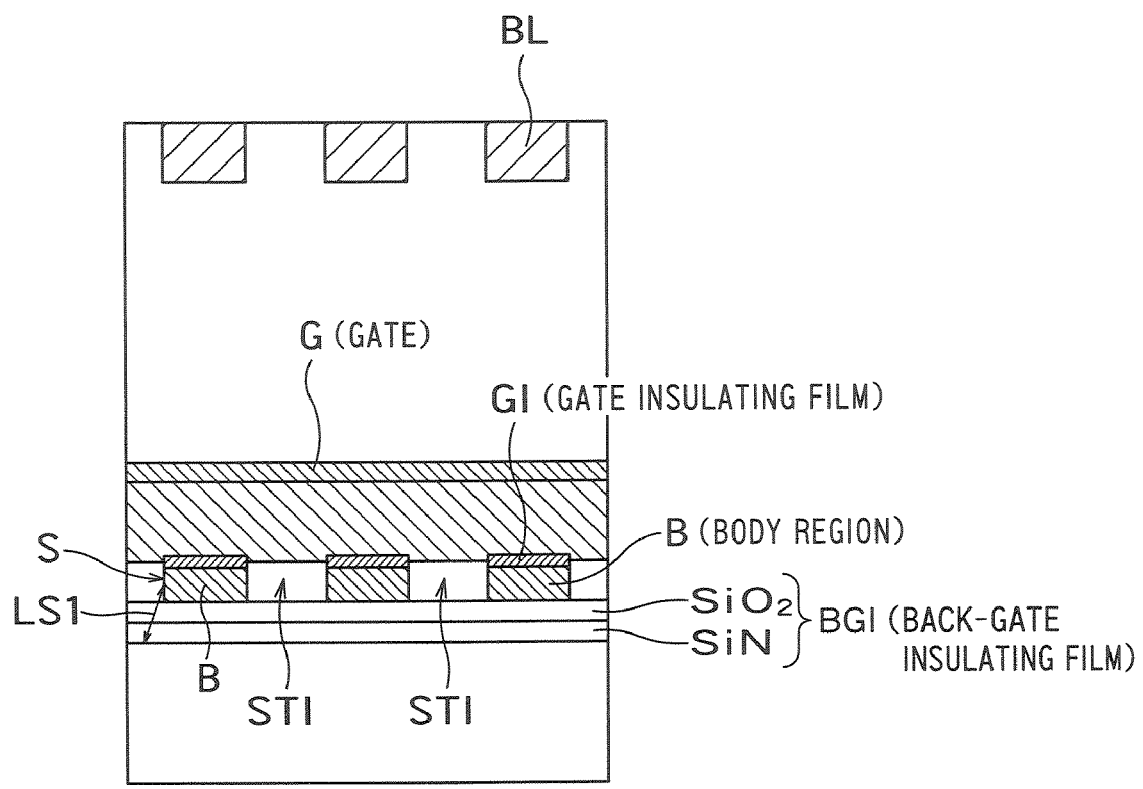
FIG. 41 is a cross-sectional view of an FBC memory device according to a sixth embodiment.

FIG. 39 is a plan view of an FBC memory device according to a sixth embodiment of the present invention. FIG. 40 is a cross-sectional view along the line 40-40 in FIG. 39. In the sixth embodiment, an STI provided between a plate line contact PLC and a memory cell area is shallow and the height of its bottom surface is higher than that of the surface of a supporting substrate SUB. A path L2 from a plate line contact PLC to a memory cell MC at the center of the memory cell area is relatively short. In addition, because the STI is shallow, the sheet resistance of a plate is low. Due to two reasons mentioned above, the resistance of the path L2 is decreased. Because the resistance from the plate line contact PLC to the memory cell area is decreased, plate potential just under a body region B is stabilized and a body-plate capacitance is increased. The difference in threshold voltage between the memory cell storing the data "0" and the memory cell storing the data "1" is assured sufficiently in the entire cell area. FIG. 41 is a cross-sectional view of the FBC memory device according to the sixth embodiment of the present invention. This cross-sectional view corresponds to FIG. 6 in the first embodiment. As shown in FIG. 41, the STI is formed by removing the body B and a second semiconductor layer 12. A distance LS1 between the side surface S of the body B and the plate is shorter than LS2 in the first embodiment (see FIG. 6). As a result, a body-plate fringe capacitance is increased and the difference in threshold voltage between the memory cell storing the data "0" and the memory cell storing the data "1" is thus increased.

Figure 42:
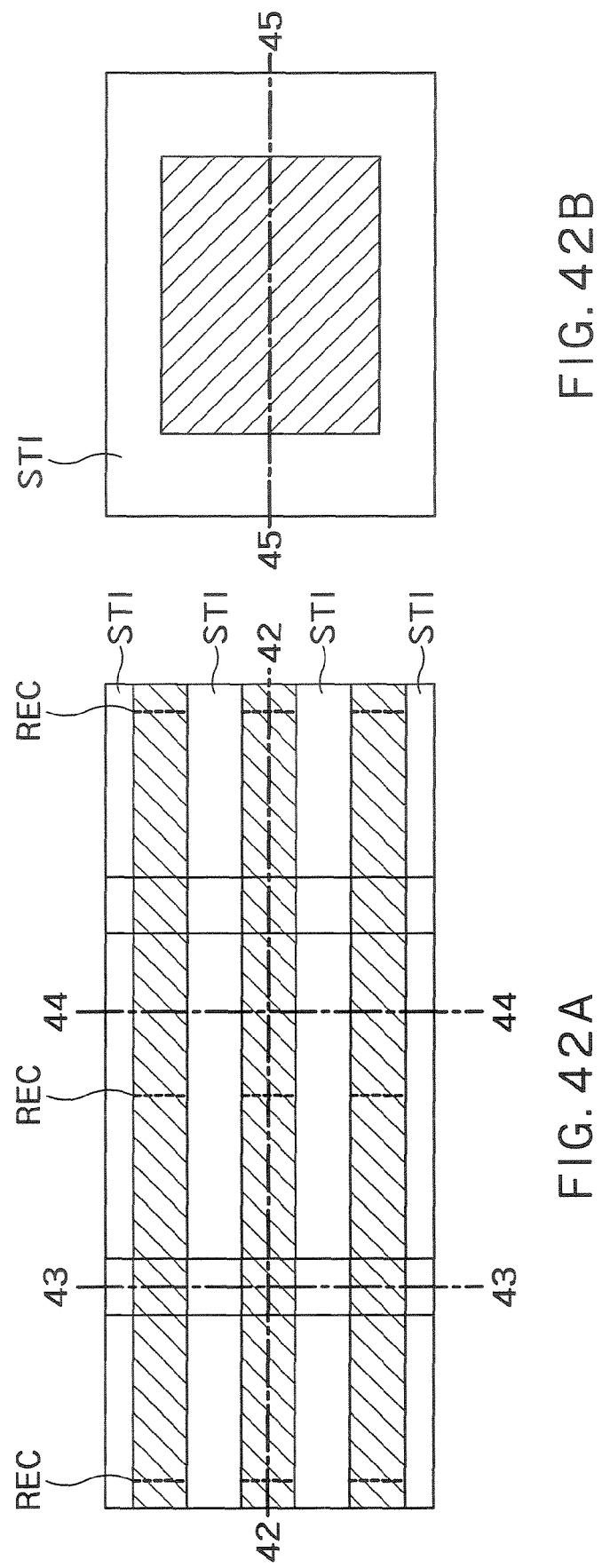
FIGS. 42A and 42B are plan views of an FBC memory device according to a sixth embodiment.
Figure 43:
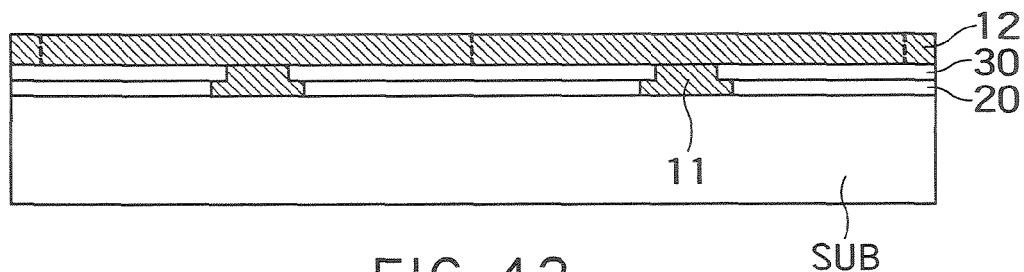
FIG. 43 is a cross-sectional view along the line 42-42 in FIG. 42A.

A manufacturing method of an FBC memory device according to the sixth embodiment will be described. FIGS. 42A to 46 are plan views and cross-sectional views of the manufacturing method of an FBC memory device according to the sixth embodiment. As in the fifth embodiment, the steps shown in FIGS. 37A to 38B and FIGS. 32A to 34B are performed. The boundary between a region where a nitride film 30 and an oxide film 20 are provided and a region where they are not provided corresponds to the boundary B2 in FIG. 39. The boundary B2 is within an active area patterned in the subsequent step. As shown in FIGS. 42A and 42B, an STI is formed. FIG. 43 is a cross-sectional view along the line 42-42 in FIG. 42A. This cross-sectional view is the same as the cross-sectional view shown in FIG. 15 in the first embodiment.

Figure 44:
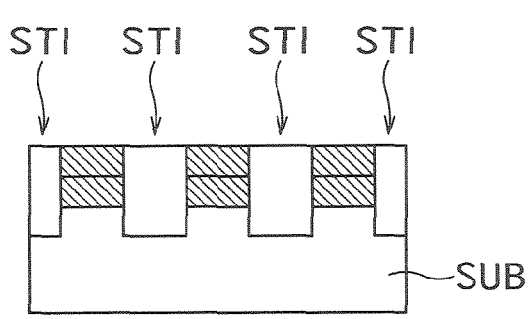
FIG. 44 is a cross-sectional view of a region where a source layer S is formed along the line 43-43 in FIG. 42A.
Figure 45:
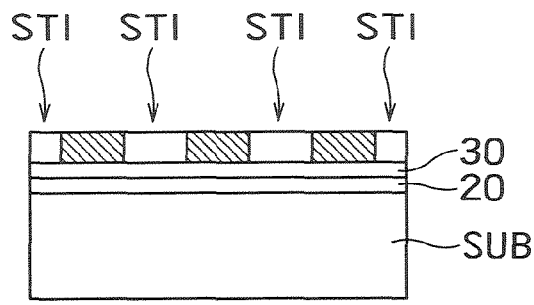
FIG. 45 is a cross-sectional view of a region where a body region B is formed along the line 44-44 in FIG. 42A.
Figure 46:
FIG. 46 is a cross-sectional view of a logic circuit area along the line 45-45 in FIG. 42B.

FIG. 44 is a cross-sectional view of a region where a source layer S is formed along the line 43-43 in FIG. 42A. In the region where the source layer S is formed, the STI is formed so as to reach a supporting substrate SUB. FIG. 45 is a cross-sectional view of a region where a body region B is formed along the line 44-44 in FIG. 42A. In the region where the body region B is formed, while the STI is formed so as to reach the silicon nitride film 30, it does not reach the supporting substrate SUB. FIG. 46 is a cross-sectional view of a logic circuit area along the line 45-45 in FIG. 42B. In the logic circuit area, the STI is formed to be relatively deep as the STI shown in FIG. 44. By performing the steps shown in FIGS. 19A to 21B, the FBC memory device of the sixth embodiment is completed.

When the supporting substrate SUB shown in FIGS. 44 and 46 are subjected to anisotropic etching, the silicon nitride film 30 is utilized as an etching stopper. The STI does not reach the supporting substrate SUB in the region where the body region B is formed and the structure shown in FIG. 40 is provided.

Seventh Embodiment

If the width W of the P-type isolation layer 98 shown in FIG. 35 is small, punch-through may occur between the source layer S and the supporting substrate SUB. To prevent the punch-through, the width of the isolation layer 98 can be large in a transverse direction. In this case, since the P-type isolation layer 98 is extended below the body B, the body-plate capacitance is decreased, resulting in a decreased difference in threshold voltage $\Delta V$th.

Figure 47:
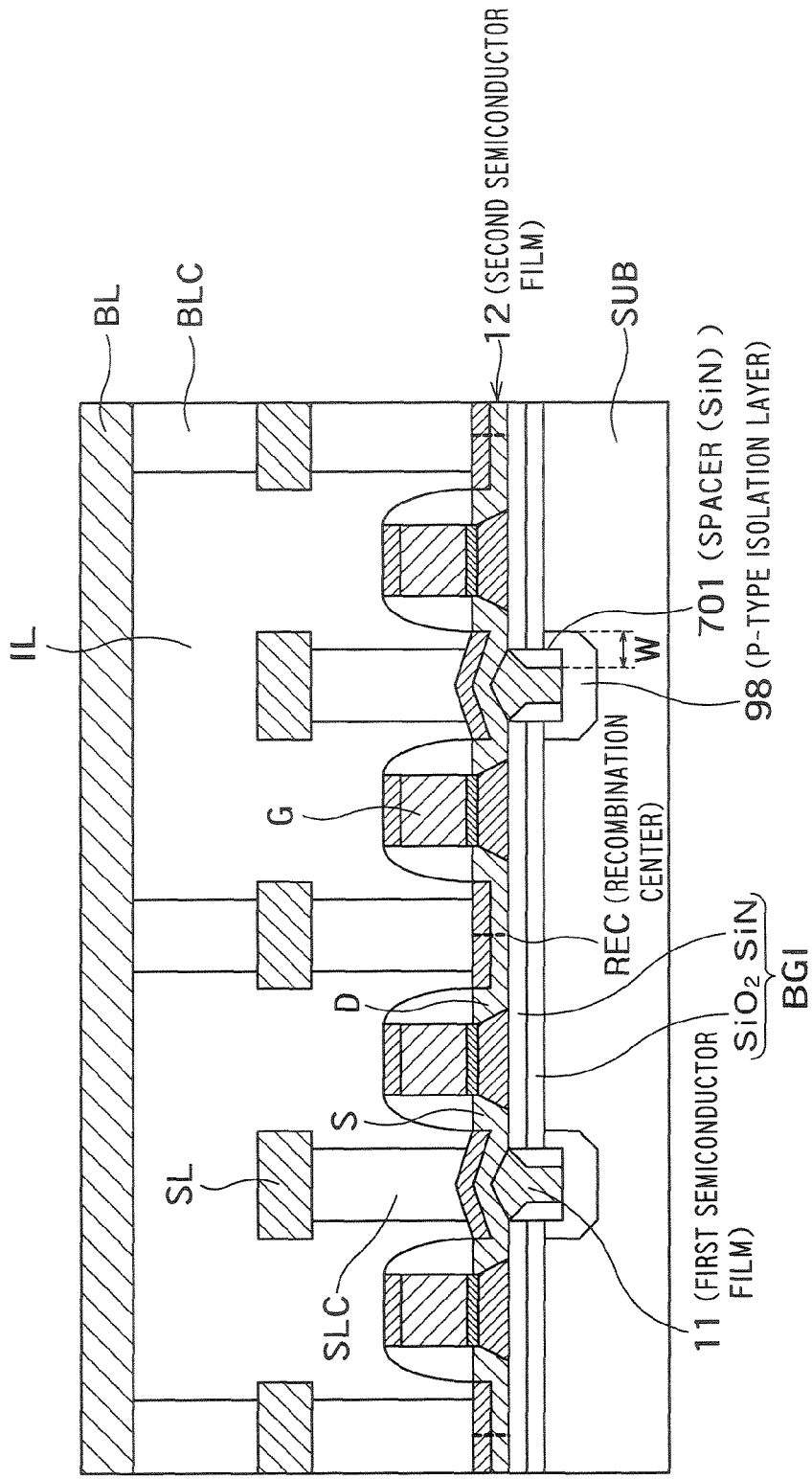
FIG. 47 is a cross-sectional view of an FBC memory device according to a seventh embodiment of the present invention.

FIG. 47 is a cross-sectional view of an FBC memory device according to a seventh embodiment of the present invention. The FBC memory device of the seventh embodiment includes a spacer 701 formed at the side surface of a first semiconductor layer 11 connecting a source layer S and a supporting substrate SUB. The spacer 701 is formed at the side surface of an opening provided at a back-gate insulation film BIG for a first semiconductor layer 11 to pass therethrough. Materials for the spacer 701 can be, e.g., a silicon oxide film or a silicon nitride film. The spacer 701 allows a width of the first semiconductor layer 11 to be smaller than the minimum space which can be formed by lithography. The N-type first semiconductor layer 11 is formed so as to be transversely apart from a body B by the thickness of the spacer 701. A P-type isolation layer 98 is then formed so as to be transversely apart from the body B by the thickness of the spacer 701. A width W from the end of the first semiconductor layer 11 to the end of the isolation layer 98 can be substantially the same as the width W shown in FIG. 35. The FBC memory device of the seventh embodiment accomplishes an increased difference in threshold voltage $\Delta V$th while suppressing punch-through between the source layer S and the supporting substrate SUB.

Figure 48B:
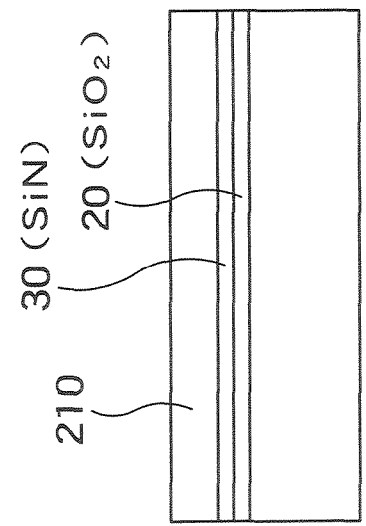
Figure 48A:
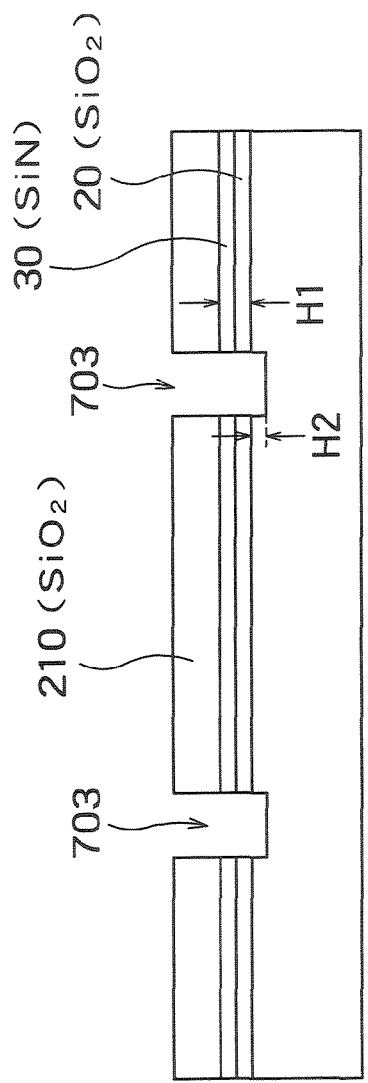

A manufacturing method of an FBC memory device according to the seventh embodiment will be described. An N-type impurity is ion-implanted in a supporting substrate SUB in a memory cell area, so that a plate is formed. For example, phosphorus having a concentration of $10^{18}$ cm$^{-3}$ is introduced. As shown in FIG. 48A, a mask formed of a silicon oxide film 20, a silicon nitride film 30, and a silicon oxide film 210 is formed on the supporting substrate SUB. The sum of thicknesses of the silicon oxide film 20 and the silicon nitride film 30 is indicated by H1. Utilizing photolithography and RIE, the mask material in a region where the source layer S is formed is removed. In the logic circuit area, the mask covers the supporting substrate SUB. By using RIE, a groove 703 with a depth H2 is formed in the supporting substrate SUB.

By ion implantation of boron, the isolation layer 98 is formed as shown in FIG. 49. To form a P-type diffusion layer at the side surface of the groove 703, boron can be ion-implanted from an oblique direction. The width W is thus assured easily. By performing a thermal process, the impurity (boron) is activated. A silicon nitride film is deposited on the supporting substrate SUB and subjected to anisotropic etching. The spacer 701 is formed at side surfaces of the isolation layer 98, the silicon oxide film 20, and the silicon nitride film 30 (back-gate insulation film BGI).

Figure 50B:
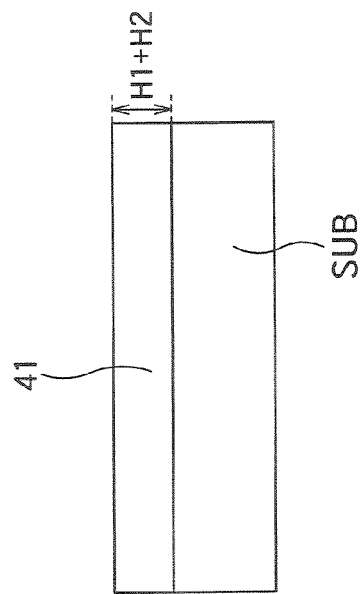
Figure 50A:
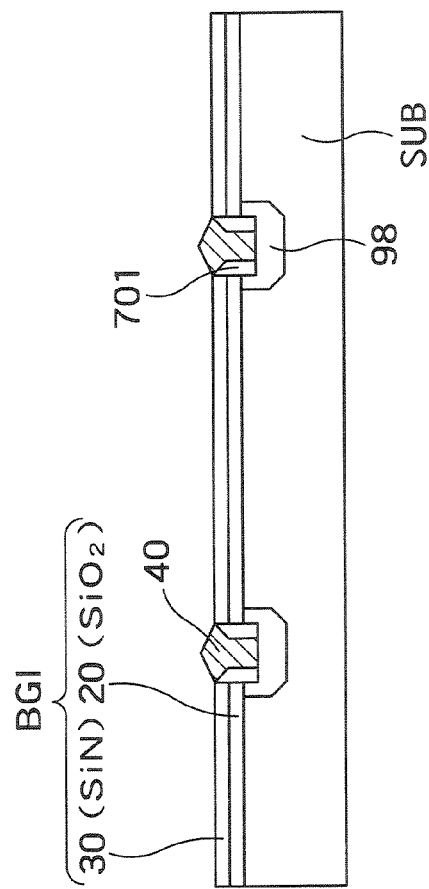

The silicon oxide film 210 is removed by hydrofluoric acid. Because the spacer 701 covers the sidewall (edge) of the back-gate insulation film BGI, the back-gate insulation film BGI is not etched. The silicon oxide film 20 and the silicon nitride film 30 in the logic circuit area are removed. As shown in FIG. 50, a first semiconductor layer 40, 41 is formed by selective epitaxial growth. The film thickness of the first semiconductor layer 40, 41 is H1+H2. The groove 703 having the depth H2 is formed in the supporting substrate SUB in the memory cell area (FIG. 48). The height of the surface of the silicon nitride film 30 in the memory area is lower than that of the surface of the semiconductor layer 41 by H2. The oxide film on the supporting substrate SUB is removed by hydrofluoric acid as a pre-process of selective epitaxial growth. Because the spacer 701 covers the sidewall of the back-gate insulation film BGI, the sidewall of the back-gate insulation film BGI is not etched. If etching for the sidewall of the back-gate insulation film BGI is prevented, the first semiconductor layer 40 is not formed in the vicinity of the body B. As a result, punch-through between the source S and the supporting substrate SUB is thus suppressed.

Figure 52:
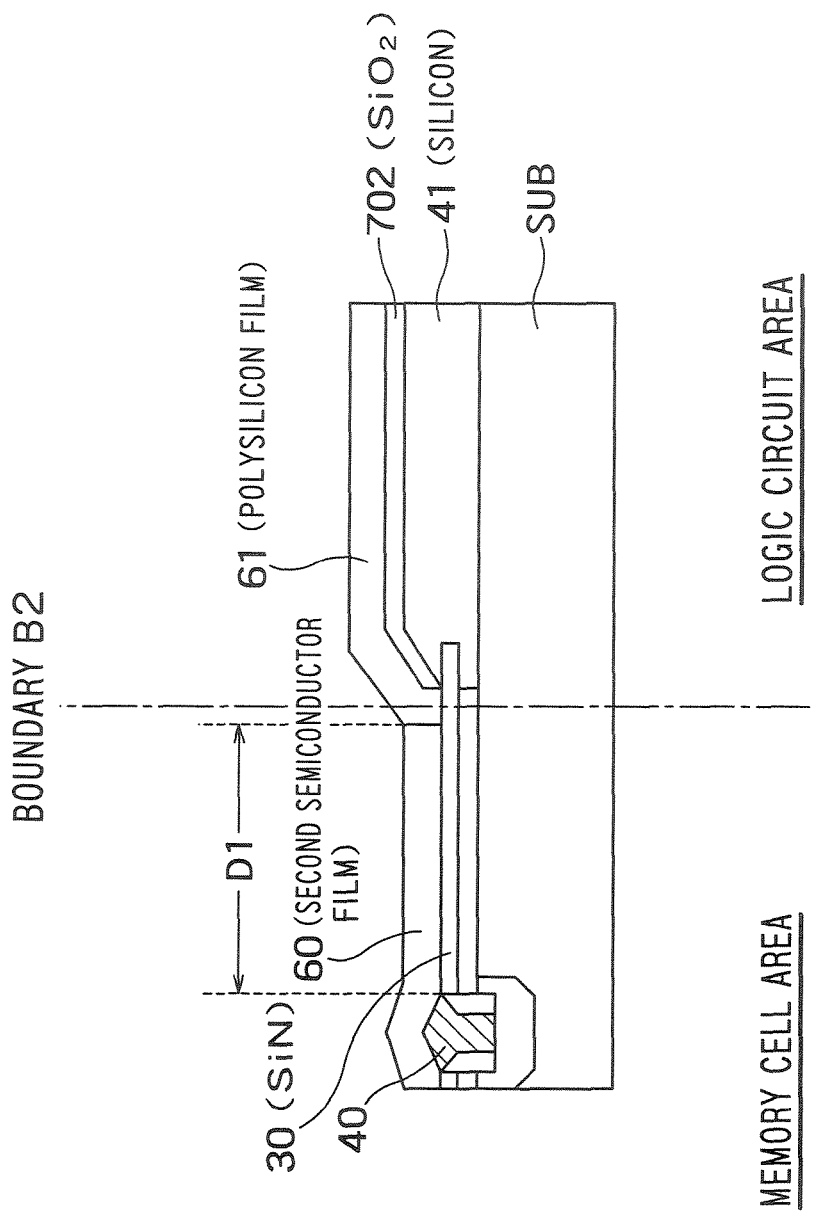
FIG. 52 is a cross-sectional view of the vicinity of the boundary B2.

A thermally oxidized film 702 is formed on the first semiconductor layer 40, and then the thermally oxidized film on the semiconductor layer 40 in the memory cell area is removed. As described with reference to FIGS. 12 and 13, a second semiconductor layer 60 is formed in the memory cell area. The structure shown in FIG. 51 is thus obtained. The thickness of the second semiconductor layer 60 is H4. The height of the second semiconductor layer 60 in the memory cell area is the same as that of the first semiconductor layer 41 in the logic circuit area. FIG. 52 is a cross-sectional view of the vicinity of the boundary B2. In the memory cell area, the second semiconductor layer 60 epitaxially grows from the first semiconductor layer 40 to be monocrystalline silicon. In the logic circuit area, a polysilicon 61 grows on the silicon oxide film 702. As shown in FIG. 52, the second semiconductor layer 60 is in contact with the polysilicon film 61 in the vicinity of the boundary B2. The distance from the contacting point to the first semiconductor layer 40 is indicated by D1. The polysilicon 61 is removed by an HCL gas.

As described with reference to FIGS. 42 to 46, an STI is formed and a gate, a source/drain layer, a contact, and a wiring are then formed. The structure shown in FIG. 47 is completed.

The above-described manufacturing method includes the step for forming the insulation films 20 and 30 with a first thickness H1 on the supporting substrate SUB, the step for forming the groove 703 in the insulation films 20 and 30 and the supporting substrate SUB in the source area of the memory cell, the step for forming the first semiconductor layer 40, 41 with a third thickness (H1+H2) in the groove 703 and the logic circuit area at the same time, and the step for forming the second semiconductor layer 60 with a fourth thickness H4 on the insulation films 20 and 30 in the memory cell area. The depth from the surface of the supporting substrate SUB is referred to as the second depth H2. The level of the active area in the memory cell area is higher than that of the surface of the supporting substrate SUB by the sum of the first thickness H1 and the fourth thickness H4. The height of the active area in the logic circuit area corresponds to the third thickness (H1+H2). By realizing H1+H4=H1+H2, the height of the memory cell area is made to be substantially the same as that of the logic circuit area. Since defocusing in lithography is prevented, the memory cell and the logic circuit can be formed precisely and easily. In the seventh embodiment, the third thickness is equal to the sum of the first thickness H1 and the second depth H2. The surface of the source region is substantially as high as the surface of the active area.

Because the spacer 701 covers the side surface of the groove 703 (side surface of back-gate insulation film BGI) in the step for forming the first semiconductor layer 40, the first semiconductor is not deposited on the side surface of the groove 703. According to this method, the memory cell area and the logic circuit area whose surfaces have substantially the same height are formed at low cost.

After the polysilicon 61 is selectively removed, a gap can be formed between the silicon 60 and the silicon 41 at the boundary B2. Alternatively, an overlapped portion of the silicon 60 and the silicon 41 can be formed. Whether the gap is formed or the overlapped portion is formed depends on misalignment of a resist pattern. When the boundary B2 is within the active area, a step can be formed at the gap or the overlapped portion. Due to this step, polysilicon to be etched in gate etching may remain.

To prevent formation of the step, even if misalignment of lithography occurs to some extent, i.e., even if D1 varies, the gap between the silicon 60 and the silicon 41 or the overlapped portion of the silicones is made to be included in the STI as the boundary B1 in FIG. 7. A deep trench for the STI must be formed, though the surface of the STI is flat and etching residue of the gate polysilicon is not generated. The STI in the memory cell area is shallow and an increase in fringe capacitance and a reduction in the sheet resistance of the plate are thus accomplished.

Although an N-type plate is provided in the seventh embodiment, effects of the seventh embodiment are not deteriorated even if a P-type plate is provided. In the case of the P-type plate, an N-type impurity is introduced in the isolation layer 98. The isolation layer 98 is connected to the source layer S. The isolation layer 98 plays the same role as the N-type diffusion layer 88 in the first embodiment. In the seventh embodiment, the drain layer D can be electrically connected to the supporting substrate SUB (plate) and the source layer S can be provided with the recombination center REC as in the second embodiment.

Eighth Embodiment

Figure 53:
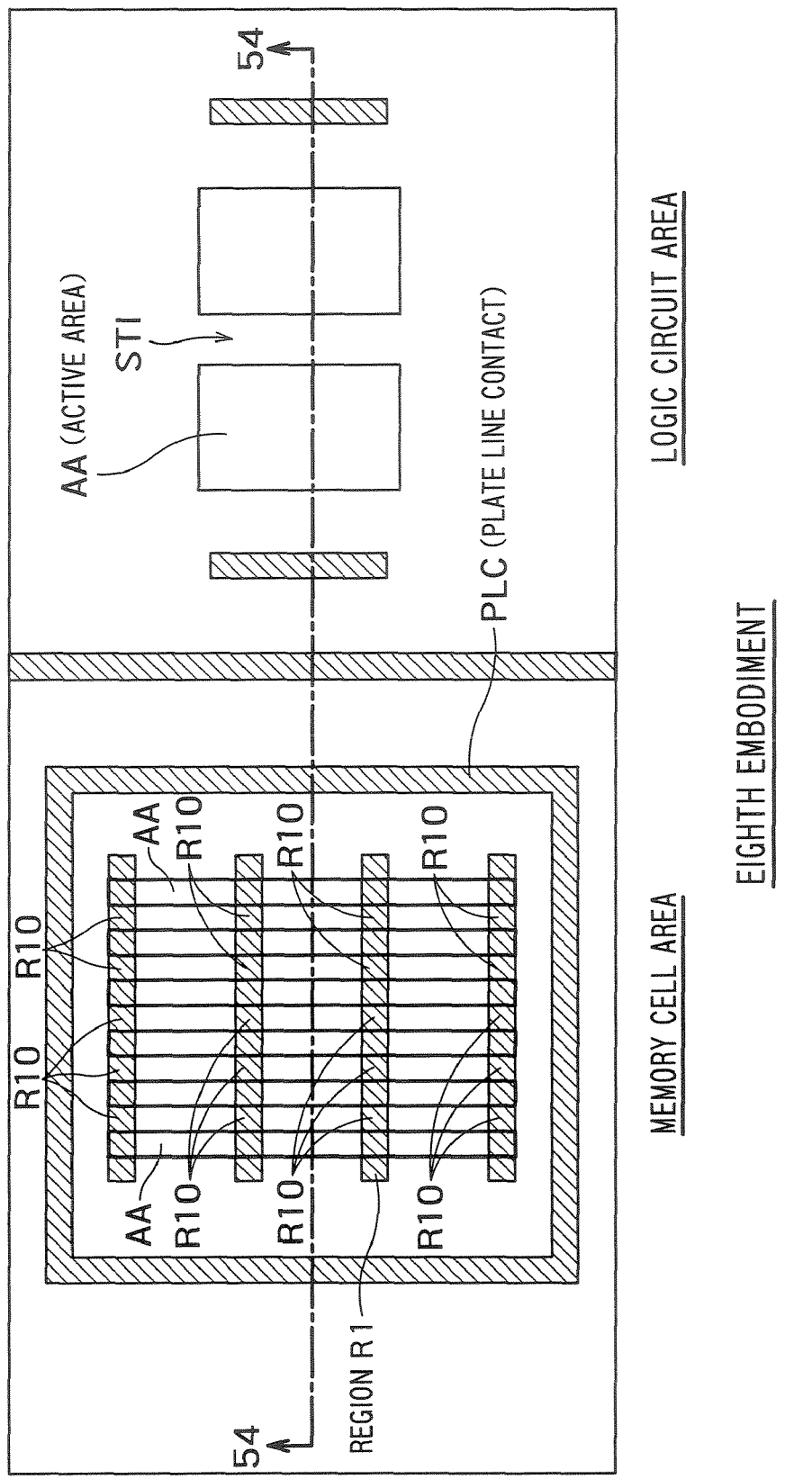
FIG. 53 is a plan view of a memory cell area, a plate line contact PLC, and a logic circuit area according to an eighth embodiment of the present invention.

FIG. 53 is a plan view of a memory cell area, a plate line contact PLC, and a logic circuit area according to an eighth embodiment of the present invention. The plate line contact PLC is formed in a ring shape so as to surround the memory cell area. The plate resistance from the plate line contact PLC to the respective memory cells is relatively low.

A region R1 indicates a region where a first semiconductor layer 11 connected to a source layer S is formed. In the first embodiment, the first semiconductor layer 11 is formed in an overlapped region of an active area AA and the region R1. In contrast, according to the eighth embodiment, the first semiconductor layer 11 is formed not in the overlapped region of the active area AA and the region R1 but in the region R10, the region adjacent to and sandwiched between the active areas AA (the source-layer-to-be) within the region R1

Figure 54:
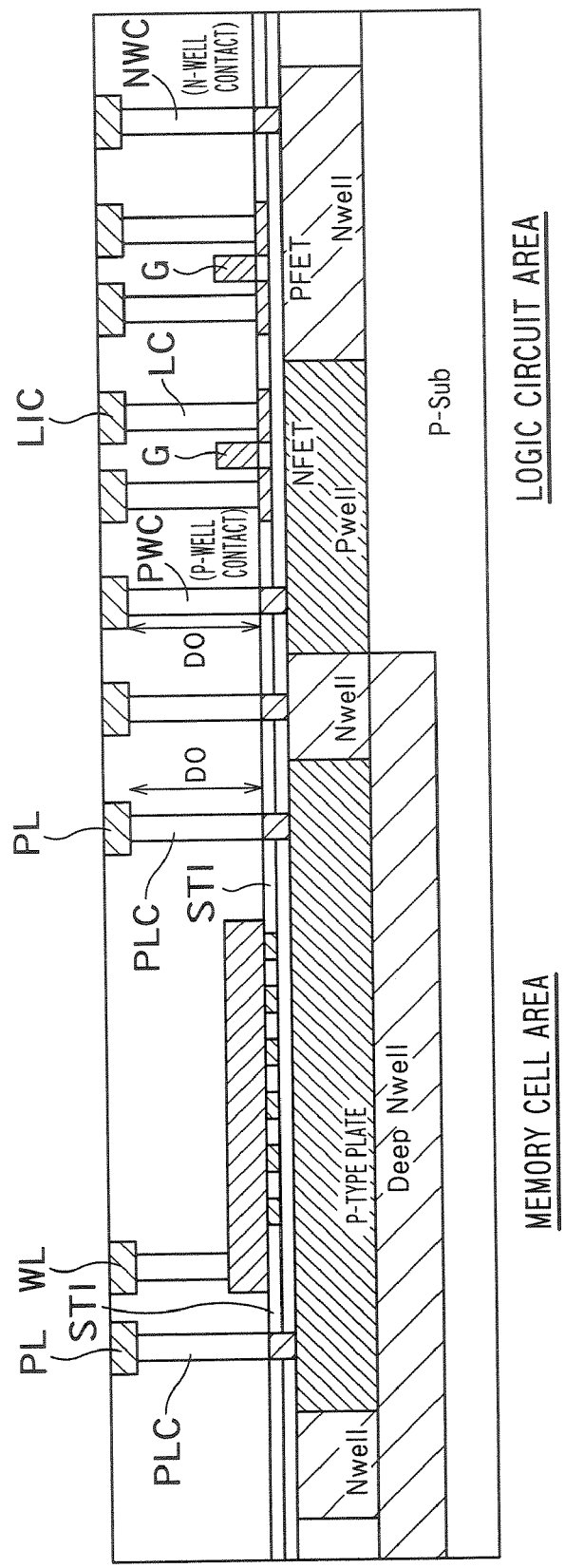
FIG. 54 is a cross-sectional view along the line 54-54 in FIG. 53.

FIG. 54 is a cross-sectional view along the line 54-54 in FIG. 53. Since the logic circuit of the eighth embodiment consists of transistors formed on an SOI layer, the depth of a source contact is substantially the same as that of a drain contact. As compared to the configuration shown in FIG. 8, the failure rate of the contact is decreased. The bottom surface between the plate line contact and the memory cell area, i.e., the bottom surface of an STI inside the ring-shaped plate line contact PLC is at higher level than the surface of a supporting substrate SUB. The resistance of a plate line PL is decreased as compared to the configuration shown in FIG. 8.

Figure 55:
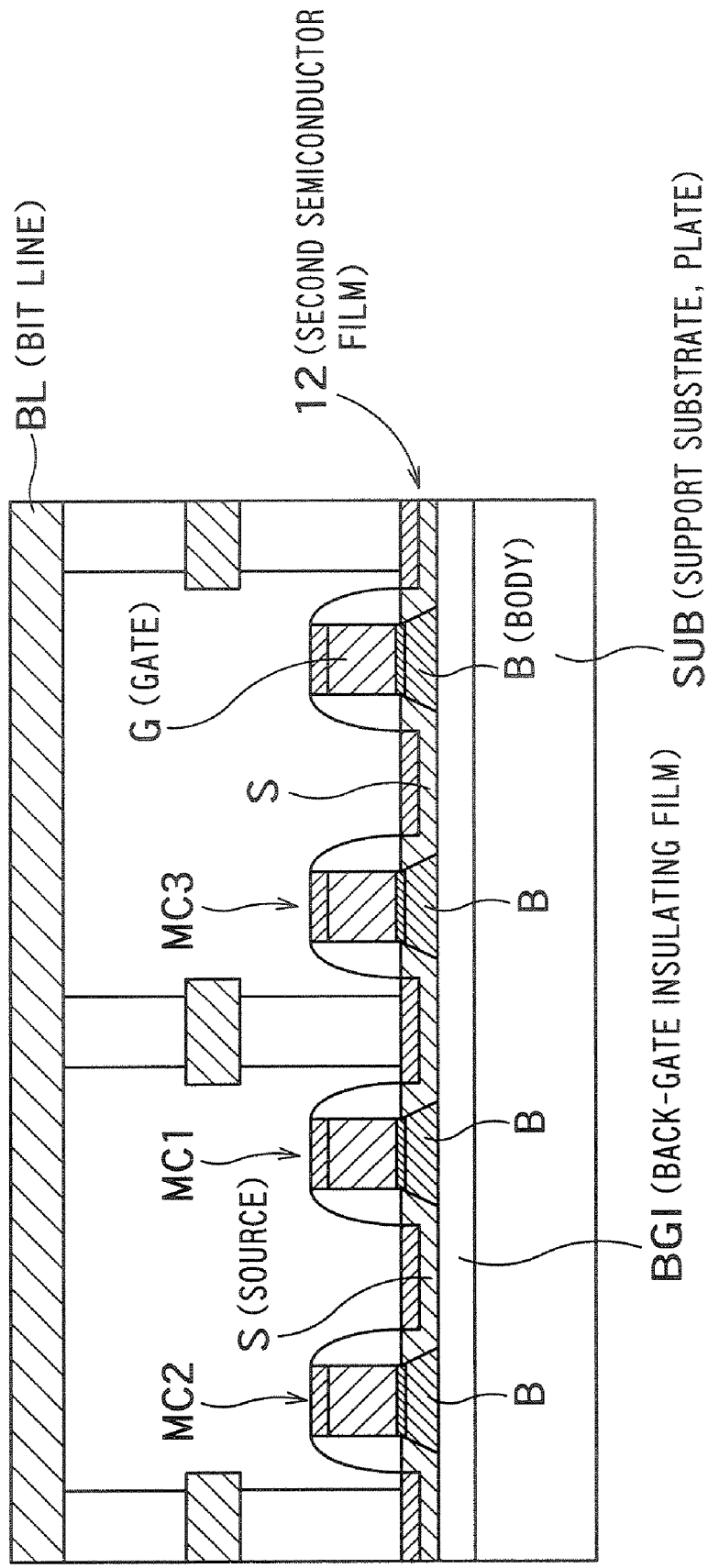
FIG. 55 corresponds to the cross-sectional view along the line 24-24 in FIG. 23.
Figure 56:
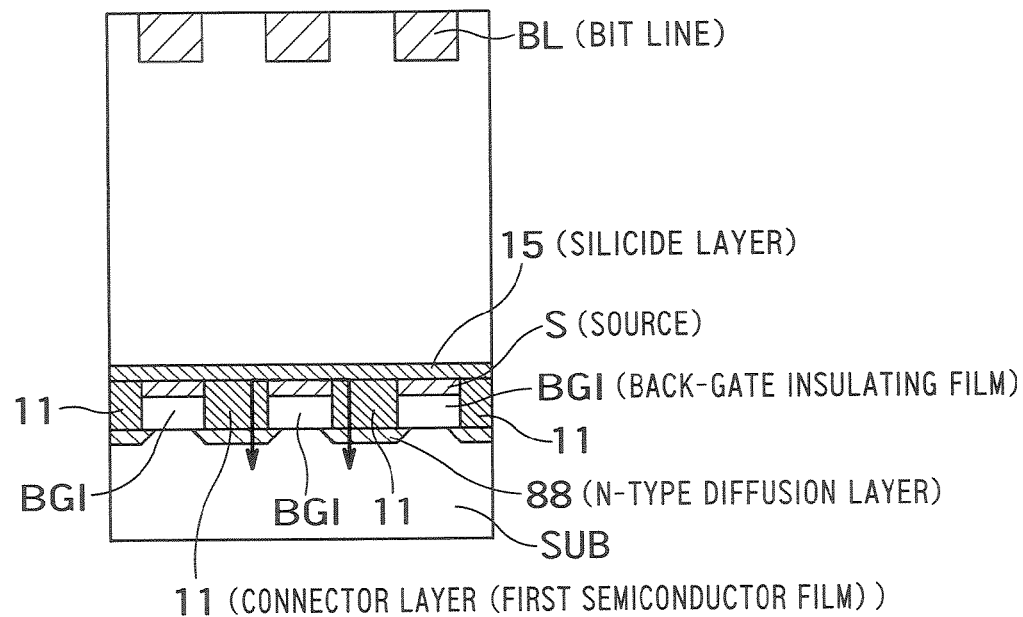
FIG. 56 is a cross-sectional view of the source layer S along a word line WL.
Figure 57:
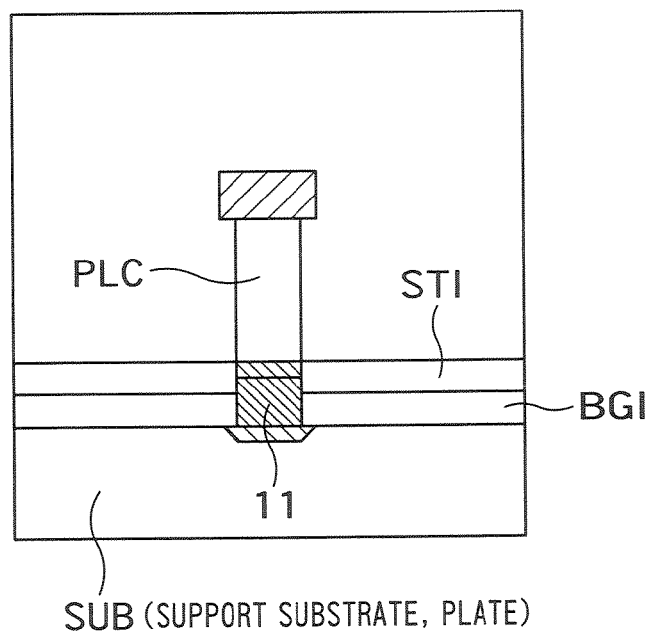
FIG. 57 is a cross-sectional view of the plate line contact area.

The layout of the memory cell area can be the same as the structure shown in FIG. 23. FIG. 55 corresponds to the cross-sectional view along the line 24-24 in FIG. 23. FIG. 56 is a cross-sectional view of the source layer S along a word line WL. FIG. 57 is a cross-sectional view of the plate line contact area.

In FIG. 56, a back-gate insulation film BGI is formed below a bit line BL. The connector layer 11 (first semiconductor layer) is formed at the right and left sides of the back-gate insulation film BGI along the word line WL in the cross-section of FIG. 56. The connector layer 11 is in contacts with a side surface of the source layer S. The side surface of the source layer S faces to an extending direction of the gate electrode (the word line WL). The connector layer 11 electrically connects the supporting substrate SUB and the source layer S. An N-type diffusion layer 88 is formed, in the cross-section along the source layer S, on the surface of the supporting substrate SUB under the connector layer 11. The diffusion layer 88 is electrically connected to the connector layer 11 and the source layer S. In the eighth embodiment, the connector layer 11 and the diffusion layer 88 are provided not just below the source layer S but at the right and left sides of the source layer S in the cross-section of the source layer S along the word line WL. The region where the connector layer 11 and the diffusion layer 88 are formed is the region R10 in FIG. 53.

The distance between the N-type diffusion layer 88 and the body region B is longer than the distance obtained when the N-type diffusion layer 88 is provided just below the source layer S (FIGS. 3 and 24). If the N-type diffusion layer 88 is too close to the body region B, a depletion layer is formed on the plate below the body region B when a gate G is driven. The depletion layer decreases the body-plate capacitance, which causes a decrease in the difference in threshold voltage ΔVth.

In the eighth embodiment, the distance between the N-type diffusion layer 88 and the body region B is relatively long and the aforementioned depletion layer close to the body is prevented from being formed. The eighth embodiment also provides the effect of the increased difference in threshold voltage at the time of the data reading described in the first embodiment.

As shown in FIG. 56, adjacent source layers are connected by a silicide layer 15 and function as a source line. The source line is extended to the outside of a memory cell array (not shown) and receives potential via a source line contact Since the source line contact is not necessary in the memory cell array in the eighth embodiment, the cell size is smaller. Although the bit line BL is formed of a second wiring layer in the eighth embodiment, the bit line can be formed of a first wiring layer.

According to the eighth embodiment, holes for a memory cell MC1 are prevented from passing through the source layer S and flowing into the next memory cell MC2. This is because, as indicated by the arrow in FIG. 56, the holes are flown via the connector layer 11 into the supporting substrate before reaching the memory cell MC2.

The first semiconductor layer 11 is formed below the plate line contact PLC so as to pass through the back-gate insulation film BGI and the STI as shown in FIG. 57. The first semiconductor layer 11 connects, in the plate line contact area, the supporting substrate SUB and the plate line contact PLC, and makes the depth of the plate line contact PLC substantially equal to the depth of a contact for a source/drain in the logic circuit area.

Figure 58B:
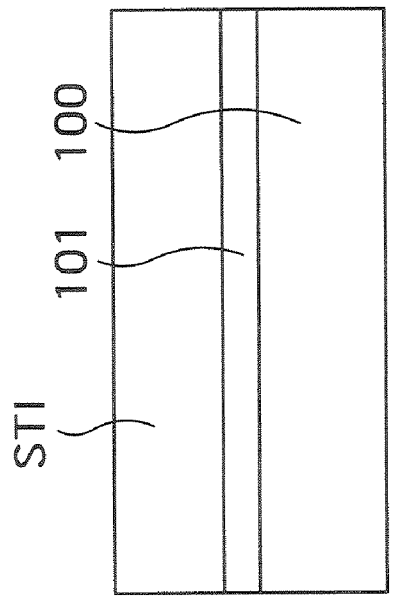
FIGS. 58A to 60B are cross-sectional views of a manufacturing method of an FBC memory device according to the eighth embodiment.
Figure 58A:
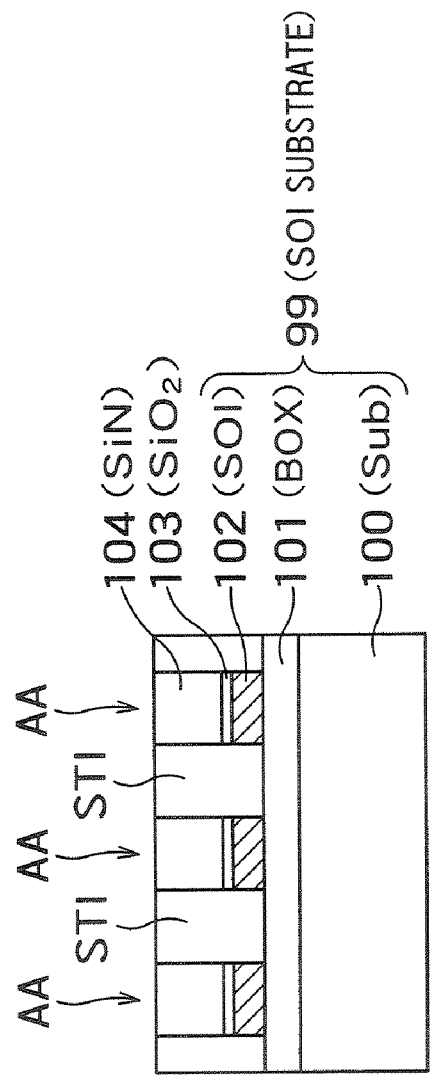
Figure 59B:
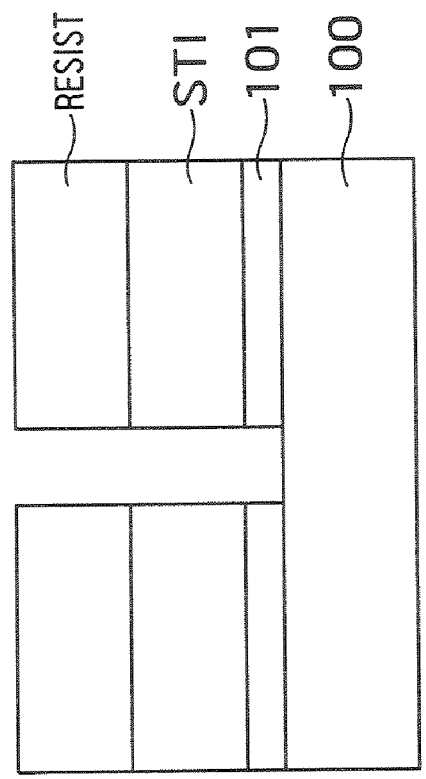
Figure 59A:
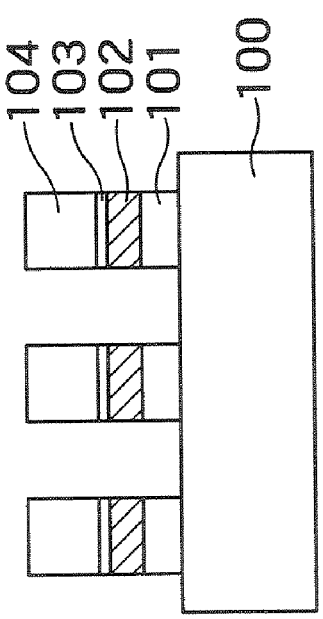
Figure 60B:
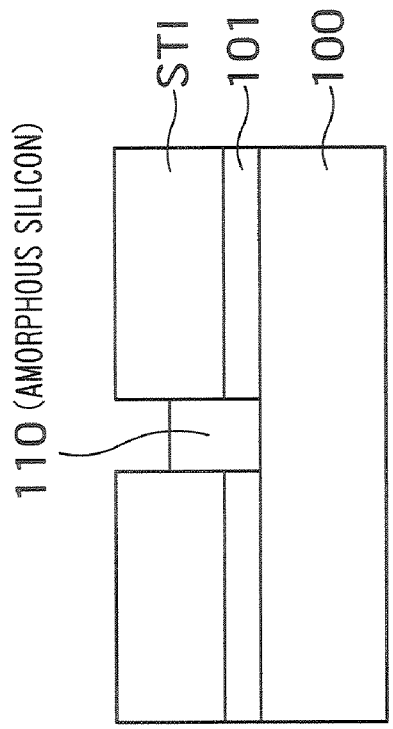

FIGS. 58A to 60B are cross-sectional views of a manufacturing method of an FBC memory device according to the eighth embodiment. FIGS. 58A, 59A, and 60A are cross-sections along a source line and FIGS. 58B, 59B, and 60B are cross-sections of a plate line contact PLC.

As shown in FIGS. 58A and 58B, an SOI substrate 99 is prepared. The SOI substrate 99 includes a buried oxide film (BOX) 101 having a thickness of about 50 nm and an SOI layer 102 having a thickness of about 50 nm. On the SOI layer 102, a silicon oxide film 103 having a thickness of about 2 nm and a silicon nitride film 104 having a thickness of about 200 nm are successively formed.

The resist pattern of the active area AA shown in FIG. 53 is formed. By RIE, the silicon nitride film 104, the silicon oxide film 103, and the SOI layer 102 are sequentially etched. After the resist pattern is removed, a silicon oxide film is deposited. This silicon oxide film is filled between the active areas AA. By using the silicon nitride film 104 as a stopper, the silicon oxide film is polished by CMP. An element isolation STI is thus formed between the active areas AA.

As shown in FIGS. 59A and 59B, a resist pattern is formed so that the region R1 shown in FIG. 53 is opened. The STI and the BOX layer 101 are subjected to anisotropic etching. The element isolation STI and the underlying BOX layer 101 in regions adjacent to and sandwiched between source-layers-to-be are removed. Namely, the silicon oxide film and the BOX layer 101 in the region R10 are removed.

Figure 60A:
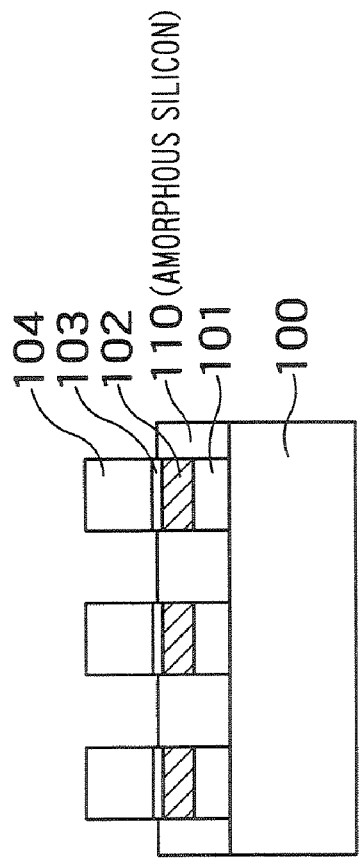

As shown in FIGS. 60A and 60B, an amorphous silicon 110 is deposited and etch back is performed using CDE. The height of the surface of the amorphous silicon 110 is made to be the same level as the height of the surface of the SOI layer. Annealing is then performed in a nitrogen atmosphere at about 600° C. for a few hours. The amorphous silicon 110 becomes monocrystalline silicon. The amorphous silicon 110 is buried in the opening formed by removing the element isolation STI and the BOX layer 101. The amorphous silicon 110 functions as a semiconductor layer connecting the supporting substrate 100 and the SOI layer 102.

The silicon oxide film 103 and the silicon nitride film 104 are removed. As described with reference to FIGS. 19 to 21, a gate insulation film and a gate electrode are formed on the SOI layer 102 and an impurity is introduced between adjacent gate electrodes, so that the source layer and the drain layer are formed in the SOI layer 102. Silicide is formed on the gate electrode, the source layer, and the drain layer. An interlayer insulation film, a contact plug, and a bit line are formed. In this way, the FBC memory device shown in FIGS. 55 to 57 is completed.

The monocrystalline silicon made by thermally processing the amorphous silicon 110 corresponds to the connector layer (first semiconductor layer) 11. The step of removing the element isolation material and the BOX layer in the region R10, and the step of filling the first semiconductor layer in an opening formed by the removal step can be performed after the step of forming the gate electrode. The source layer S is formed in the SOI layer 102. As shown in FIG. 56, the source layer S is connected via the connector layer 11 to the supporting substrate SUB. In the eighth embodiment, the supporting substrate SUB also serves as a plate.

Since the SOI substrate is used in the manufacturing method of the eighth embodiment, cost as low as in the manufacturing method of the first embodiment is not realized. In usual manufacturing methods utilizing SOI substrates, however, a step for forming a semiconductor layer for adjusting the depth of a contact to a supporting substrate SUB and a step for forming a semiconductor layer connecting a source layer S for a memory cell and the supporting substrate SUB are performed separately. In the conventional methods, to form the contact connecting to the supporting substrate SUB, a lithography step and an etching step must be added.

In the manufacturing method of the eighth embodiment, the step for forming the semiconductor layer for adjusting the depth of the contact to the supporting substrate SUB and the step for forming the semiconductor layer connecting the source layer S of the memory cell and the supporting substrate SUB are performed at the same time. The manufacturing method of the eighth embodiment suppresses an increase in costs in the manufacturing method utilizing SOI substrates.

Ninth Embodiment

Figure 61:
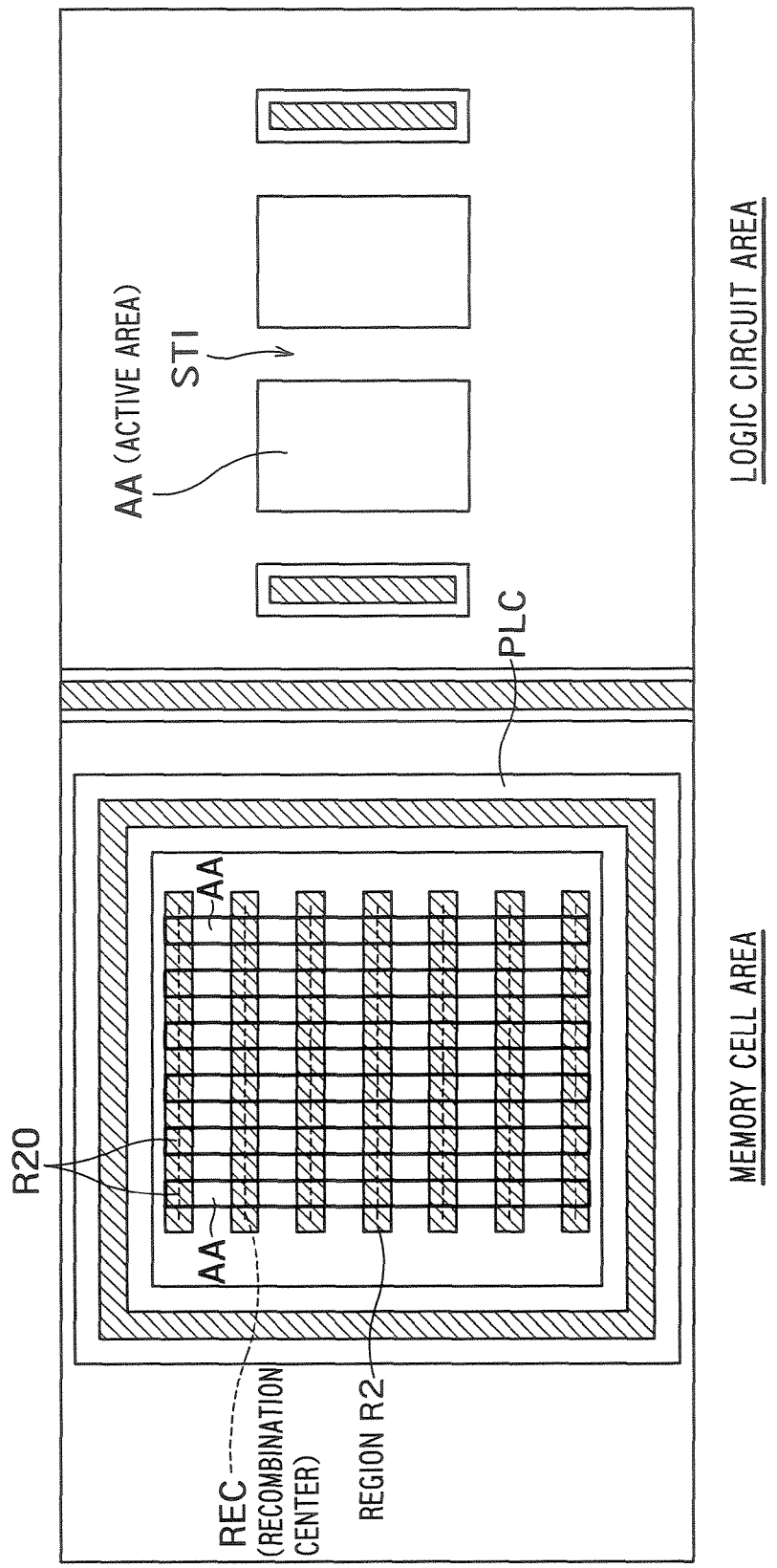
FIG. 61 is a plan view of a memory cell area, a plate line contact PLC, and a logic circuit area according to a ninth embodiment of the present invention.

FIG. 61 is a plan view of a memory cell area, a plate line contact PLC, and a logic circuit area according to a ninth embodiment of the present invention. The plate line contact PLC is formed in a ring shape so as to surround the memory cell area. The plate resistance from the plate line contact PLC to the respective memory cells is relatively low.

A region R2 indicates a region where a first semiconductor layer connected to a source layer S and a first semiconductor layer connected to a drain layer D are formed. In the ninth embodiment, a first semiconductor layer 11 is formed in an overlapped region R20 of the active area AA and the region R2.

Figure 62:
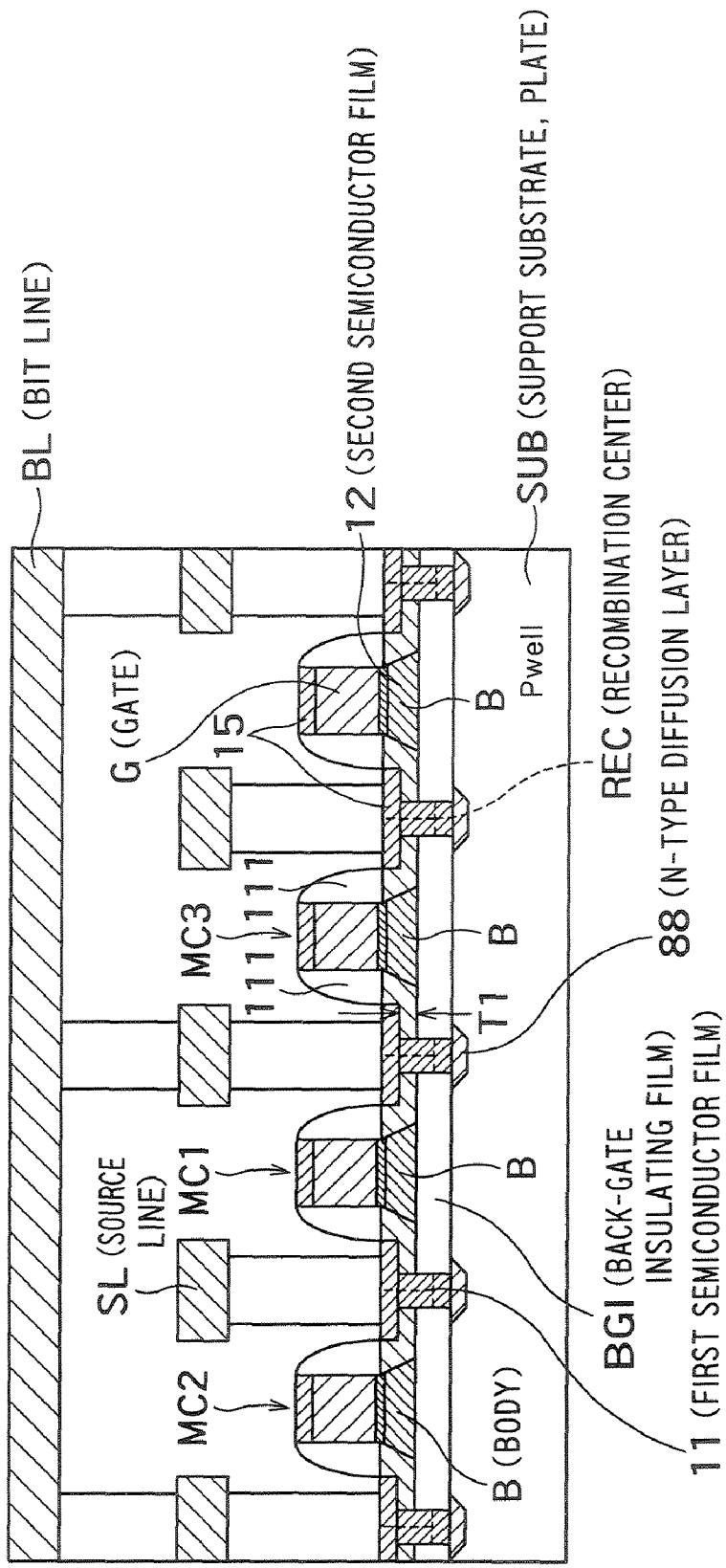
FIG. 62 is a cross-sectional view of the memory cell area of the ninth embodiment.

FIG. 62 is a cross-sectional view of the memory cell area of the ninth embodiment. The first semiconductor layer 11 is in contact with the source layer S and the drain layer D formed in the second semiconductor layer 12 at their side surfaces. In the ninth embodiment, the source layer S and the drain layer D are electrically connected to a supporting substrate SUB (plate) via a PN junction formed by an N-type diffusion layer 88 and a P-type supporting substrate SUB. Holes of a memory cell MC1 are prevented from flowing into adjacent memory cells MC2 and MC3. The difference in threshold voltage ΔVth is increased.

A longitudinally extending crystal misfit portion is provided substantially at the center of the first semiconductor layer 11. Although not shown in the drawing, suicide is thicker in the crystal misfit portion. At the time of forming silicide, metal atoms are diffused in the crystal misfit portion and the concentration of the metal atoms in the crystal misfit portion is increased. The crystal misfit portion, the metal atoms, and suicide act as a recombination center REC. Since the recombination center REC annihilates holes by recombination, flowing of the holes is prevented effectively.

High concentration N-type impurity is introduced in the region of the recombination center REC where metal atoms are diffused. An increase in reverse PN junction current between a source/drain and a P well is suppressed.

As shown in FIG. 62, the width of the first semiconductor layer 11 is narrower than that of a contact. The width of the N-type diffusion layer 88 is relatively narrow and the N-type diffusion layer 88 is placed at a longer distance from the body region B. As a result, a decrease in the difference in threshold voltage ΔVth at the time of data reading is prevented. Since the area of the N-type diffusion layer 88 is decreased, an increase in reverse PN junction current between the source/drain and the supporting substrate SUB is suppressed.

Figure 63:
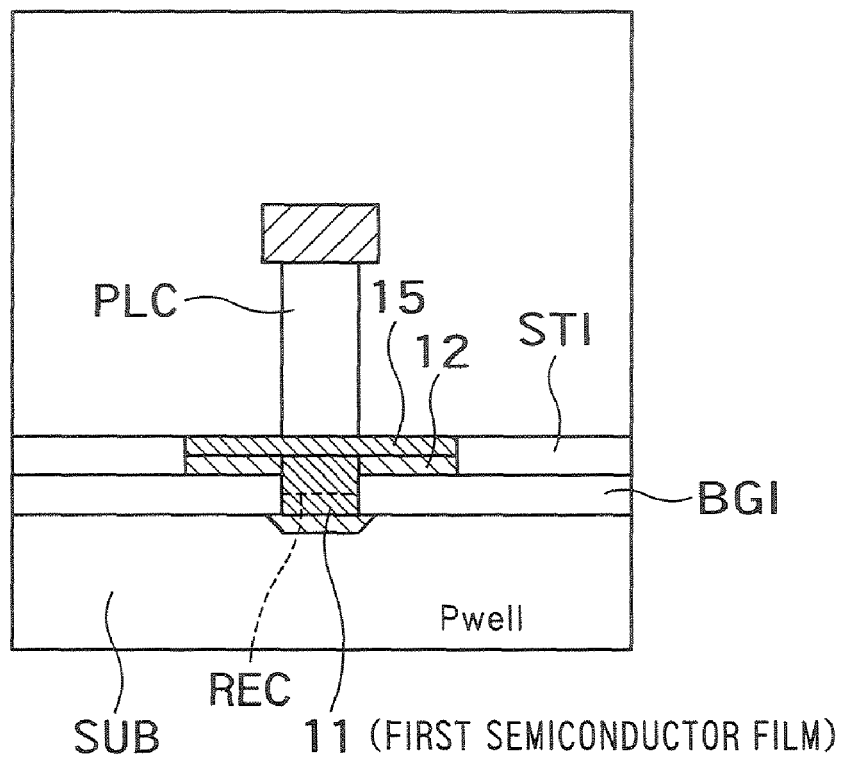
FIG. 63 is a cross-sectional view of the plate line contact PLC in the ninth embodiment.

FIG. 63 is a cross-sectional view of the plate line contact PLC in the ninth embodiment. The first semiconductor layer 11 passing through a back-gate insulation film BGI and an STI is provided below the plate line contact PLC. A second semiconductor layer 12 is provided on the back-gate insulation film BGI surrounding the first semiconductor layer 11.

The first semiconductor layer 11 is in contacts with the second semiconductor layer 12 at their side surfaces.

Figure 64B:
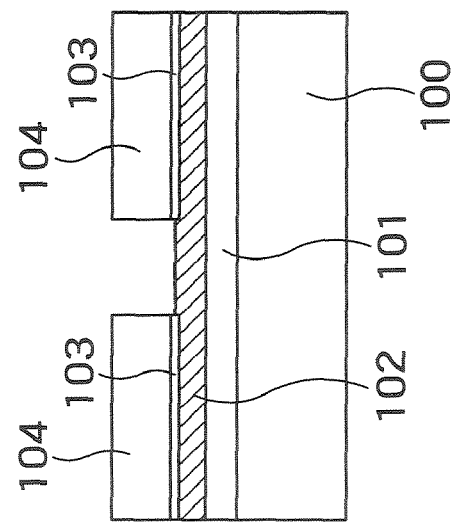
FIGS. 64A to 66B are cross-sectional views of a manufacturing method of an FBC memory device according to the ninth embodiment.
Figure 64A:
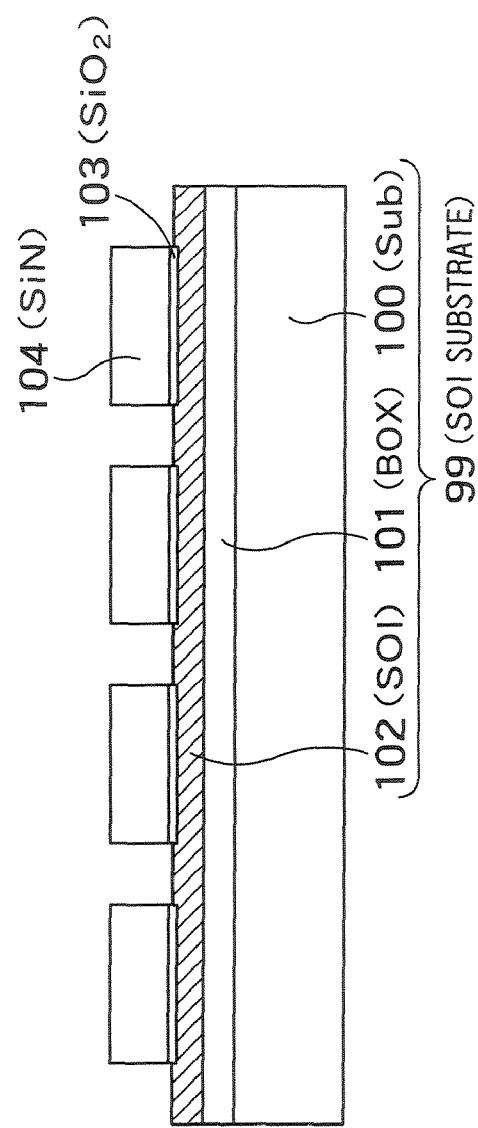
Figures 65A, 65B:
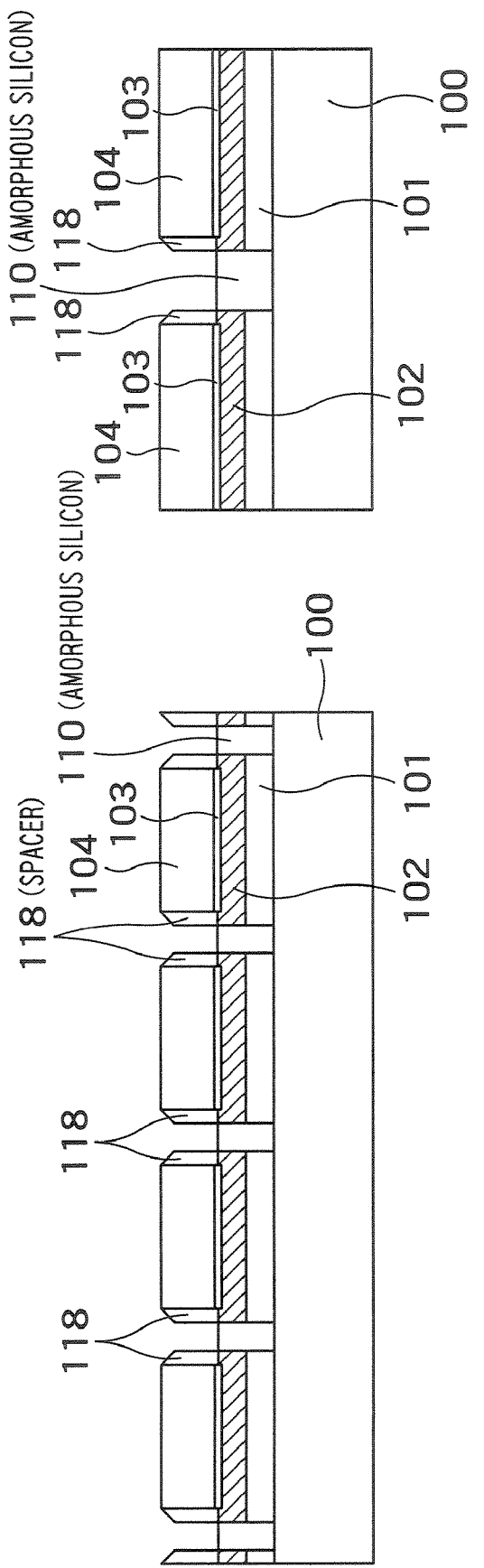
Figure 66B:
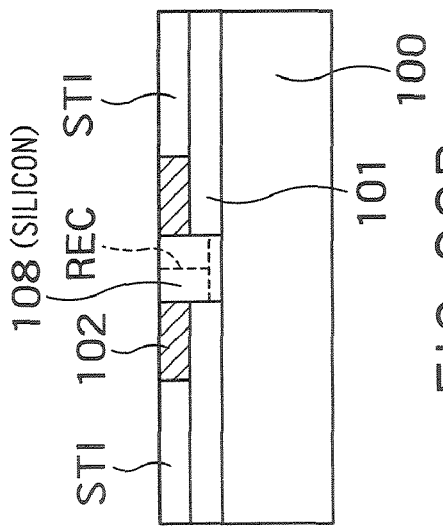

FIGS. 64A to 66B are cross-sectional views of a manufacturing method of an FBC memory device according to the ninth embodiment. FIGS. 64A, 65A, and 66A are cross-sections of the memory cell area. FIGS. 64B, 65B, and 66B are cross-sections of the plate line contact.

As shown in FIGS. 64A and 64B, an SOI substrate 99 is prepared. The SOI substrate 99 includes a buried oxide film (BOX) 101 having a thickness of about 50 nm and an SOI layer 102 having a thickness of about 50 nm. On the SOI layer 102, a silicon oxide film 103 having a thickness of about 2 nm and a silicon nitride film 104 having a thickness of about 200 nm are sequentially formed. A resist pattern is formed so that the region R2 shown in FIG. 61 is opened, and the silicon nitride film 104 and the silicon oxide film 103 are etched using RIE.

As shown in FIGS. 65A and 65B, a silicon nitride film is deposited and anisotropic etching is performed upon the silicon nitride film using RIE. A spacer 118 is thus formed at the side surface of the silicon nitride film 104, thereby forming a mask (118 and 104) having a groove narrower than the minimum spacing of the resist. By using the silicon nitride films 118 and 104 as the mask, the SOI layer 102 and the BOX layer 101 are subjected to anisotropic etching. The SOI 102 layer and the BOX layer 101 are thus removed in a region adjacent to which a source layer S and a drain layer D are to be formed. An amorphous silicon 110 is deposited and etched back to the same level as the height of the surface of the SOI layer 102. As a result, the amorphous silicon 110 is filled in the groove formed by etching the SOI layer 102 and the BOX layer 101.

Figure 66A:
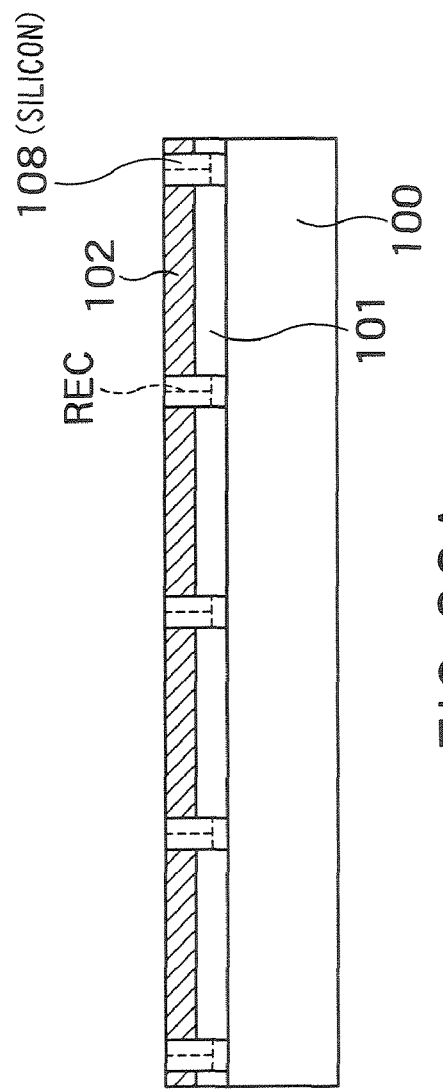

As shown in FIGS. 66A and 66B, the silicon oxide film 103 and the silicon nitride film 104 are removed. By solid phase epitaxial growth, the amorphous silicon 110 is transformed into a monocrystalline silicon 108. In the ninth embodiment, monocrystallization occurs from the supporting substrate SUB and the SOI layer 102. The recombination center REC is thus formed in a reverse T-shape as shown in FIGS. 66A and 66B. As shown in the plan view of FIG. 61, the recombination center REC is formed in the middle of the line-shaped region R2. After that, an STI is formed in an element isolation area other than the active area.

As described with reference to FIGS. 19 to 21, a gate insulation film, a gate electrode, silicide, an interlayer insulation film, a contact plug, and a bit line are formed. The FBC memory device shown in FIGS. 62 and 63 is thus completed.

First Modification of Ninth Embodiment

Figure 67:
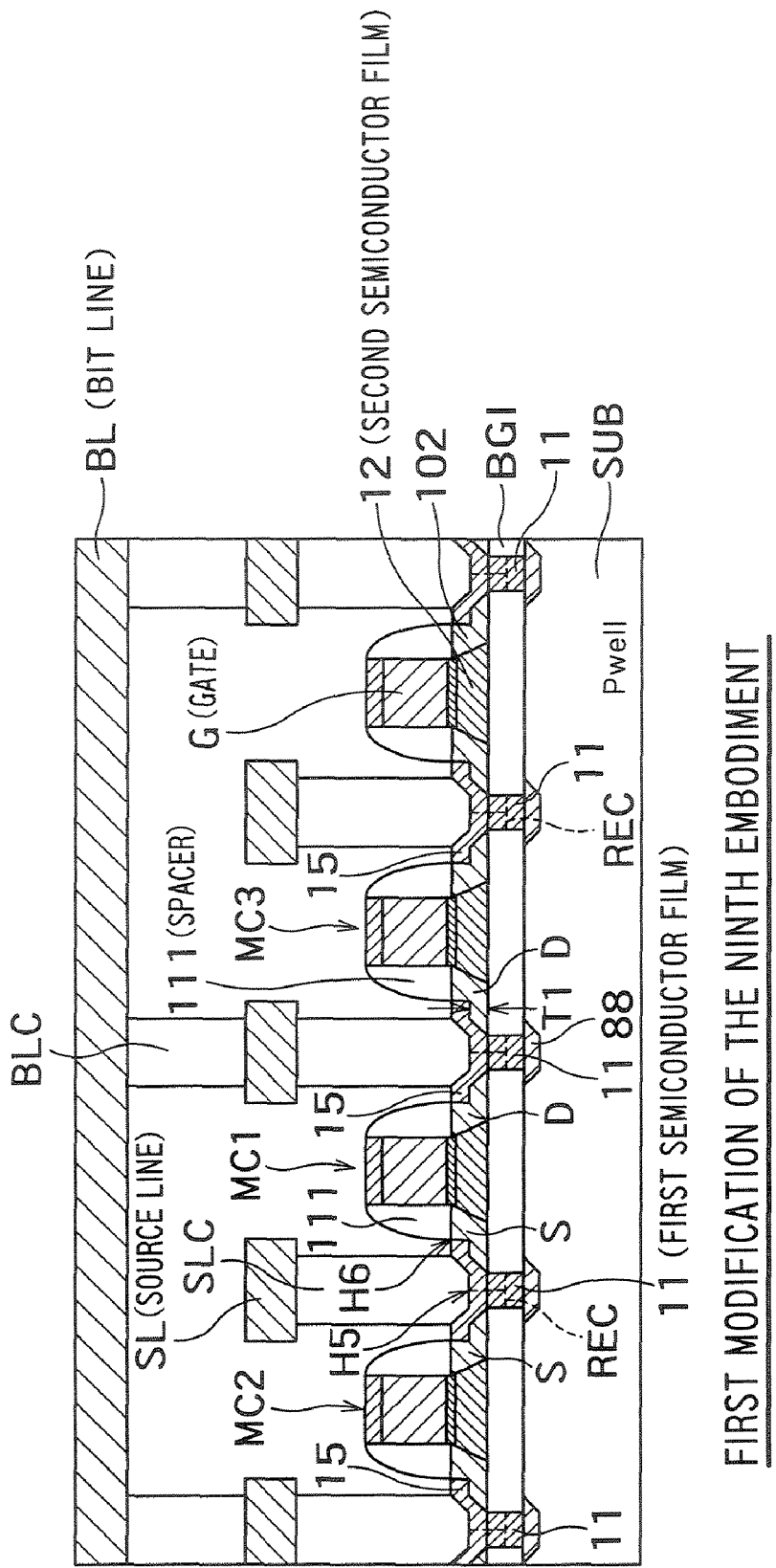
FIG. 67 is a cross-sectional view of a memory cell according to a first modification of the ninth embodiment.

FIG. 67 is a cross-sectional view of a memory cell according to the first modification of the ninth embodiment. In the first modification, the height (H5) of the top surface of a silicide 15 at the middle of a first semiconductor layer 11 is lower than the height (H6) of the top surface of the suicide 15 at the end of a spacer 111 (portion where the silicide 15 is in contacts with the spacer 111). Similarly, the height of the bottom surface of the suicide 15 at the middle of the first semiconductor layer 11 is lower than that of the bottom surface of the silicide 15 at the end of the spacer 111. A source line contact SLC and a bit line contact BLC are close to the first semiconductor layer 11. Respective intermediate portions of source and drain of adjacent memory cells are narrow. In other words, the source and the drain for the adjacent memory cells are separated by the silicide 15.

Holes generally flow in the bottom surface of the source/drain layer with low potential. The narrow intermediate portion of the source/drain layer as shown in FIG. 67 increases the possibility that the holes diffusing in the source/drain layer are annihilated by recombination. Flowing of the holes into adjacent memory cells is suppressed effectively.

As in FIGS. 62 and 67, at the end of the spacer 111, the SOI layer 102 with a film thickness T1 remains under the silicide layer 15. This increases the contact area of the silicide layer 15 and the SOI layer 102 (source/drain layer). As the contact area of the silicide layer 15 and the source/drain layer is increased, the parasitic resistance is decreased, so that drive current for transistors is increased.

If the concentration of metal atoms in the vicinity of the PN junction between the body and the source or between the body and the drain is increased, leakage current at the PN junction is increased and data retention time is shortened. Therefore, from a viewpoint of the data retention time, it is desirable to place metallic materials far from the body-to-source/drain junction as possible. At the end of the spacer 111, the SOI layer 102 with the film thickness T1 remains under the silicide layer 15. Metal atoms in the silicide layer 15 are difficult to diffuse in the PN junction. As a result, the leakage current at these PN junctions is suppressed. Use of the first semiconductor layer 11 for releasing electric charges to the substrate is also desirable from a viewpoint of the data retention time, since its top opening can be placed near the junction without degrading the data retention time.

The silicide layer 15 is thickened locally along a longitudinal crystal misfit portion. This increases the contact area between the silicide layer 15 and the SOI layer 102 and decreases the parasitic resistance. It is preferable because holes are less probable to diffuse into adjacent memory cells.

If a contact is deeper, the failure rate of the contact is generally increased. When the top surface of the silicide layer 15 on the first semiconductor layer 11 is lower than the top surface of the silicide layer 15 on the source/drain layer, and the width of the contacts SLC, BLC is narrower than that of the first semiconductor layer 11, the contacts SLC, BLC can be deep.

In the first modification, the width of the first semiconductor layer 11 is narrower than that of the contacts SLC, BLC. A relatively shallow area is formed in the contacts SLC, BLC and the failure rate is thus decreased. As the contact area between the contacts SLC, BLC and the silicide layer 15 is increased, the parasitic resistance of the contacts SLC, BLC is decreased.

FIGS. 68A to 69B are cross-sectional views of a manufacturing method of the first modification of the ninth embodiment. In this modification, manufacturing steps before the step shown in FIGS. 65A and 65B are performed in the same manner as in the ninth embodiment.

When the amorphous silicon 110 is etched back as shown in FIGS. 65A and 65B, the amorphous silicon 110 is etched so that its top surface is at a level lower than the top surface of the SOI layer 102 by T1. Structures shown in FIGS. 68A and 68B are thus obtained.

As shown in FIGS. 69A and 69B, the silicon oxide film 103 and the silicon nitride film 104 are removed. By solid phase epitaxial growth, the amorphous silicon 110 is transformed into the monocrystalline silicon 108.

A gate insulation film, a gate electrode, silicide, an interlayer insulation film, a contact, and a wiring are formed. The structure shown in FIG. 67 is completed.

Second Modification of Ninth Embodiment

Figure 70:
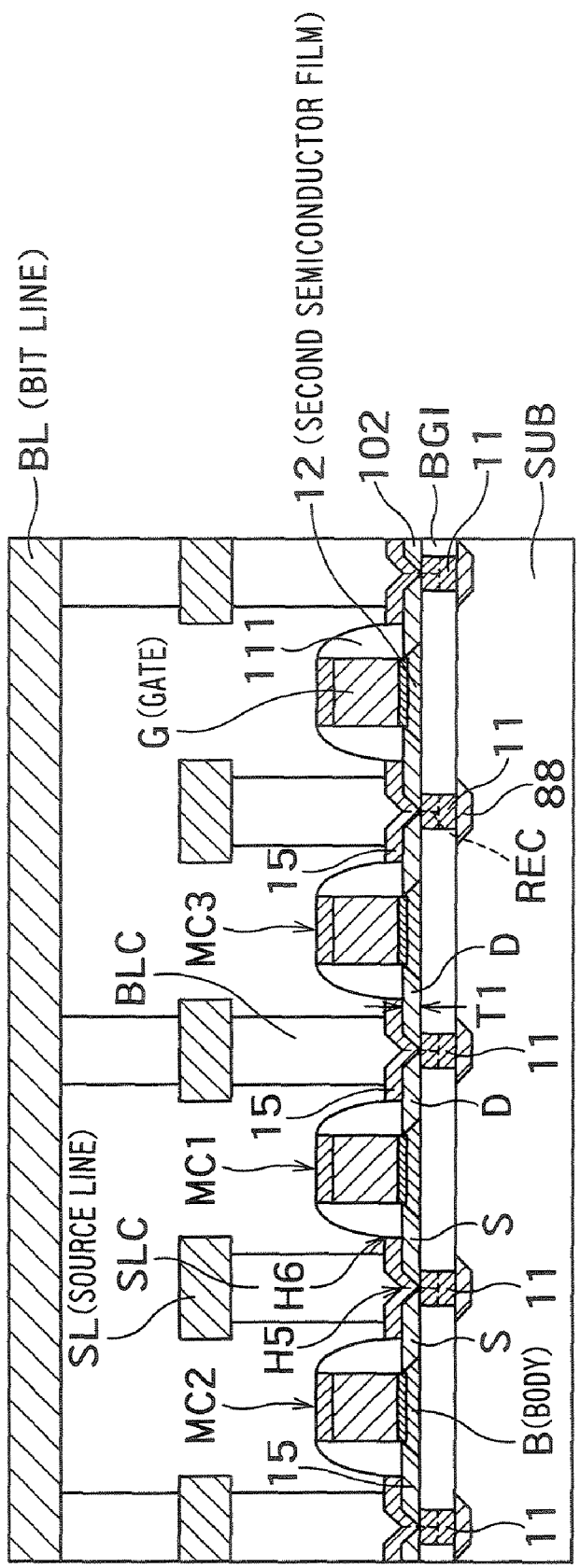
FIG. 70 is a cross-sectional view of a second modification of the ninth embodiment.

FIG. 70 is a cross-sectional view of the second modification of the ninth embodiment. A body B with a small film thickness generally provides the following advantages. The difference in threshold voltage ΔVth at the time of reading is increased. Writing time for data 1 is shortened. Leakage current at a PN junction is decreased and data retention time is extended.

In the second modification, while the silicon film thickness of the body B (film thickness of second semiconductor layer 12) is decreased, a selective epitaxial silicon layer is formed on a source/drain layer.

At the end of a spacer 111, the SOI layer 102 (source/drain layer) remains under a silicide layer 15, which increases the contact area between the suicide layer 15 and the source/drain layer and reduces the parasitic resistance of the source/drain layer. The height (H5) of the top surface of the suicide 15 at the middle of a first semiconductor layer 11 is lower than the height (H6) of the top surface of the silicide 15 at the end of the spacer 111 (contact portion of the silicide 15 and the spacer 111). The second modification provides the similar effects as those of the first modification.

The width of the region where the height of the top surface of the silicide 15 is H5 is narrower than that of the first modification. Since the contact area between the contact SLC, BLC and the silicide layer 15 is further increased, the parasitic resistance of the contact SLC, BLC is smaller than that of the first modification.

In a manufacturing method for the second modification, at the step shown in FIGS. 69A and 69B, the SOI layer 102 is etched so as to be thinner. After a gate electrode is formed, a selective epitaxial silicon layer is grown on the source/drain layer. The top surface of the selective epitaxial silicon layer formed on the first semiconductor layer 11 is lower than that of the selective epitaxial silicon layer in the source/drain region. The suicide layer 15 with a uniform film thickness is formed on the surface of the selective epitaxial silicon layer. Other steps in the second modification are the same as in the first modification.

In addition to the aforementioned effects, the first and second modifications have the effects of the ninth embodiment. In the modifications, an opening passing through the SOI layer 102 and the BOX layer 101 is formed in a line shape along the source line. The first semiconductor layer 11 is buried in the opening and an element isolation area STI is then formed. A recombination center REC is formed so as to be completely transverse a path of hole current between adjacent memory cells as in FIG. 61. By simply adjusting the height H5 of the top surface of the silicide 15, flowing of holes is controlled. Namely, the recombination center that is effective for suppressing bipolar disturb is formed without increasing costs.

Tenth Embodiment

Figure 71:
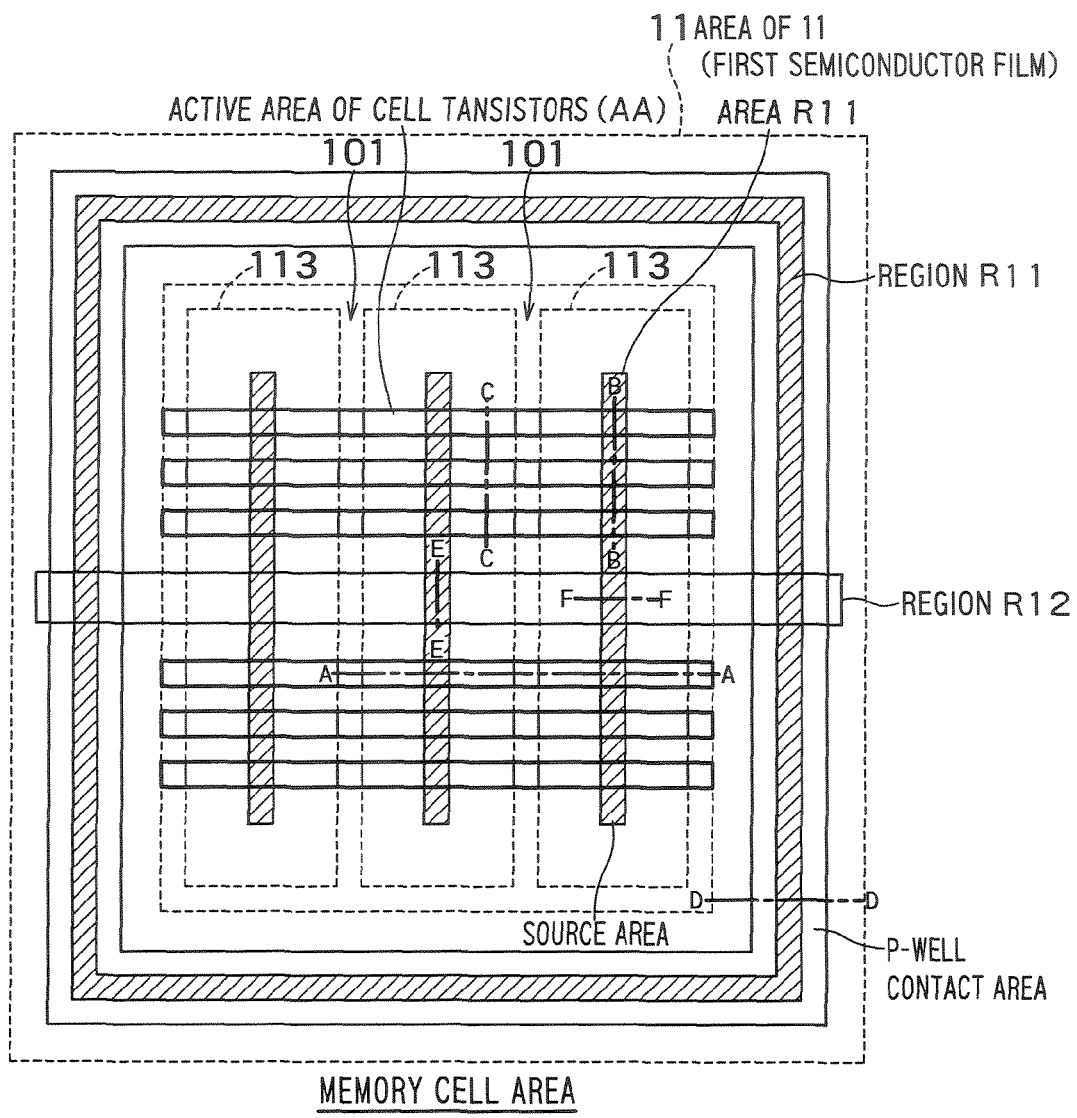
FIG. 71 is a plan view of an FBC memory device according to a tenth embodiment of the present invention

FIG. 71 is a plan view of an FBC memory device according to a tenth embodiment of the present invention. The planar structure of a MISFET in a logic circuit area can be the same as that of any other embodiments (e.g., FIG. 2).

FIG. 72A is a cross-sectional view of a memory cell area along the line A-A in FIG. 71. As shown in FIG. 72A, a memory cell of the tenth embodiment includes a supporting substrate SUB, a plate PT, a back-gate insulation film BGI (first insulation film), a BOX layer 101 (second insulation film), a first semiconductor layer 11, a drain layer D, a source layer S, a body region B, a gate insulation film GI, a gate electrode G (word line WL), a bit line BL, and a source line SL.

The supporting substrate SUB is made of semiconductor materials and is, e.g., a silicon substrate. The supporting substrate SUB is provided with a P-type well into which boron having a concentration of $1\times10^{18}$ cm$^{-3}$ is introduced. The first semiconductor layer 11 and the BOX layer 101 are provided on the supporting substrate SUB. The first semiconductor layer 11 connects the supporting substrate SUB and an SOI layer 102.

The first semiconductor layer 11 extends just under the body B, which is a difference between the tenth embodiment and the first to the ninth embodiments. In the first to ninth embodiments, the first semiconductor layer 11 serves as a connector for connecting the supporting substrate SUB and the SOI layer 102. In the tenth embodiment, the semiconductor layer 11 serves not only as the connector but also as the plate PT. The plate PT is connected to the P-well and obtains potential from the P-well. Alternatively, the plate PT can be extended outside a memory cell array. A contact is formed at the extended plate PT and potential is applied from the contact.

The back-gate insulation film BGI is formed on the top surface of the plate PT. The back-gate insulation film BGI is, e.g., a silicon oxide film having a thickness of about 8 nm.

An N-type diffusion layer 88 is formed in the surface of the plate PT. One end of the back-gate insulation film BGI is inside the N-type diffusion layer 88. The N-type diffusion layer 88 is connected to the source layer S. The source layer S is thus connected to the supporting substrate SUB via a PN junction between the diffusion layer 88 and the plate PT. As shown in FIG. 5B, the difference in threshold voltage ΔVth between data "0" and data "1" is increased. As the source layer S is connected to the supporting substrate SUB, bipolar disturb is suppressed.

The source layer S, the drain layer D, and the body B are provided on the back-gate insulation film BGI. The drain layer D is electrically insulated from the plate PT. As the film thickness of the back-gate insulation film BGI is thinner, discrimination between data "0" and data "1" is easier and data retention time is longer. This is because thinner back-gate insulation film BGI increases a body-plate capacitance. The BOX layer 101 that is thicker than the back-gate insulation film BGI is placed under the drain layer D. The parasitic capacitance of the bit line BL is decreased and a memory device with high speed and low power consumption is accomplished.

A silicide layer 15 is provided on respective surfaces of the source layer S and the drain layer D. Thicknesses of the source layer S and the drain layer D can be thicker than that of the body B using a selective epitaxial silicon layer in order to reduce resistances of the source layer S and the drain layer D.

As in the first embodiment, the P-type impurity concentration of the plate PT is increased to $10^{18}$ cm$^{-3}$ or higher, while the P-type impurity concentration of the body B is decreased to $10^{18}$ cm$^{-3}$ or lower. Using the above-mentioned concentration, the PN junction current between the body B and the source/drain layer is suppressed and the data retention time is extended. At the same time, depletion on the surface of the plate PT is suppressed, so that the difference in threshold voltage ΔVth in a data reading operation is increased.

FIG. 72B corresponds to the cross-sectional view of the logic transistor (SOI transistor) along the line 4-4 in FIG. 2. As an SOI transistor of the tenth embodiment has thicker BOX layer 101 under the drain layer D as compared to the eighth embodiment, the parasitic capacitance between the supporting substrate SUB and the SOI transistor is decreased. This increases the operational speed of the logic circuit and reduces power consumption.

Figure 73:
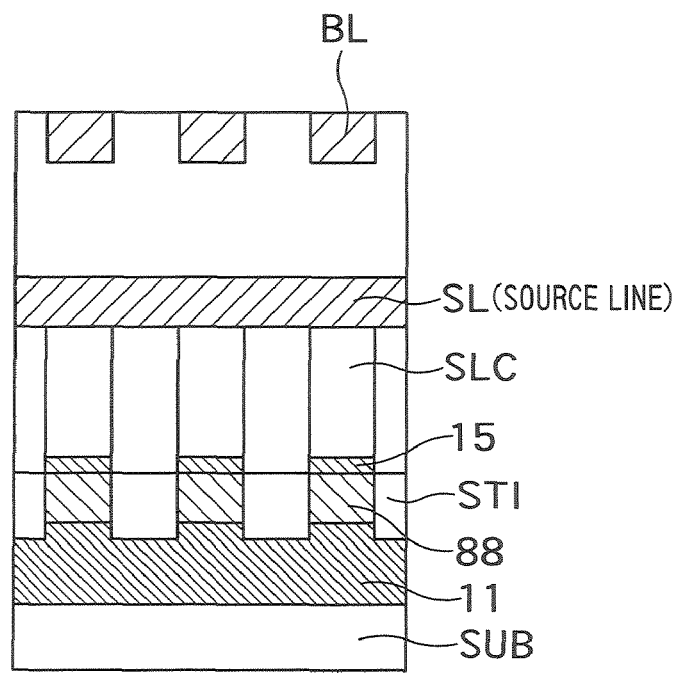
FIG. 73 is a cross-sectional view of the source layer S along the line B-B in FIG. 71.

FIG. 73 is a cross-sectional view of the source layer S along the line B-B in FIG. 71. The source line SL is connected to the P-type well (supporting substrate SUB) via the source line contact SLC, the silicide layer 15, the diffusion layer 88, and the first semiconductor layer 11.

Figure 74:
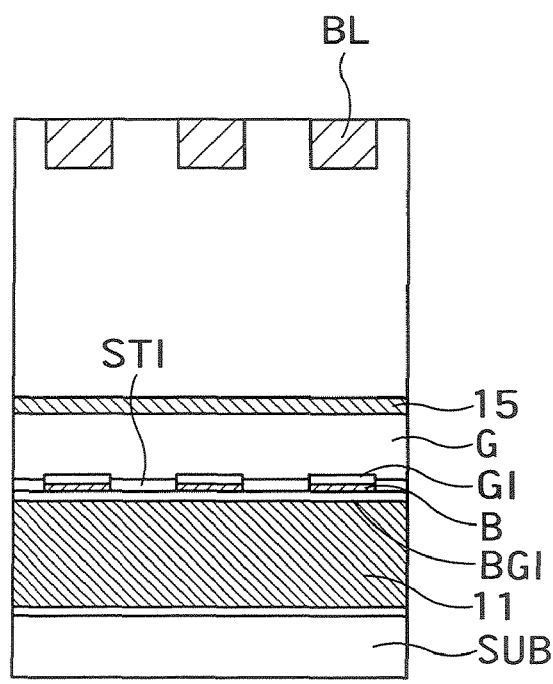
FIG. 74 is a cross-sectional view of the gate electrode G and the body region B along the line C-C in FIG. 71.

FIG. 74 is a cross-sectional view of the gate electrode G and the body region B along the line C-C in FIG. 71. The gate electrode G is provided above the body B with the gate insulation film GI interposed therebetween. The first semiconductor layer 11 is provided below the body B with the back-gate insulation film BGI interposed therebetween.

Figure 75:
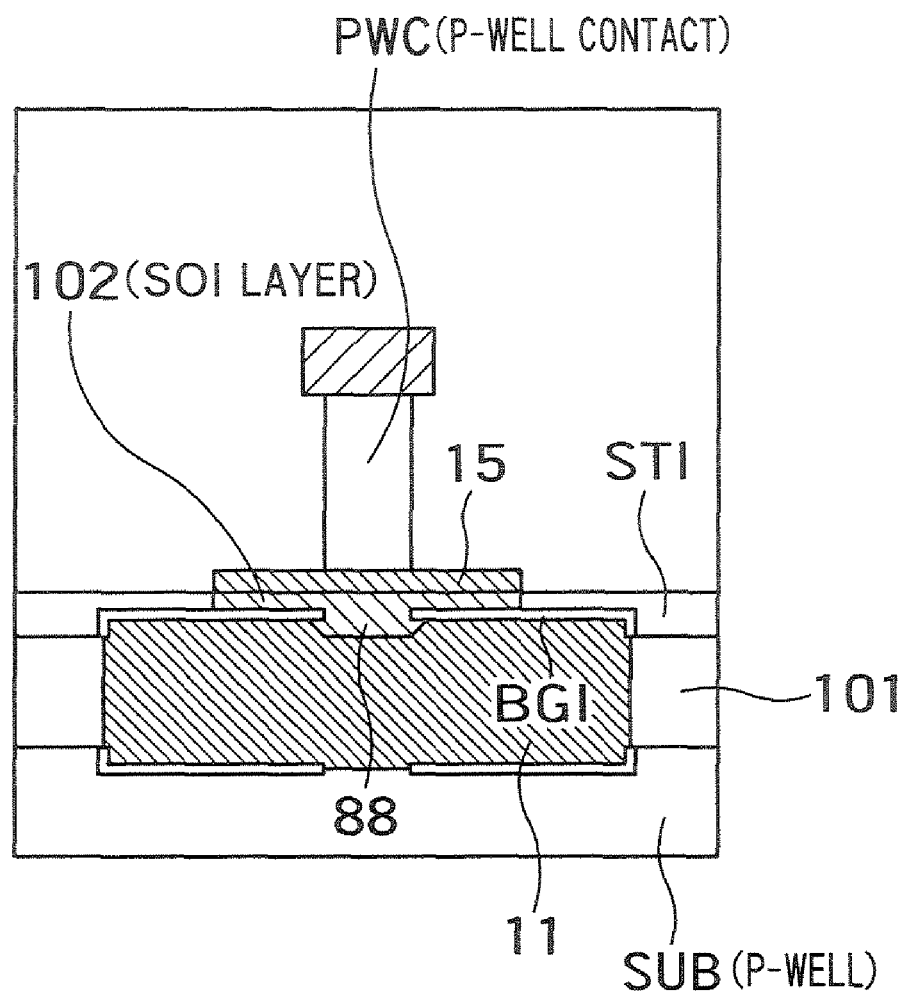
FIG. 75 is a cross-sectional view of a P-type well contact PWC along the line D-D in FIG. 71.

FIG. 75 is a cross-sectional view of a P-type well contact PWC along the line D-D in FIG. 71. The P-type well contact PWC is connected to the P-type well via the silicide layer 15, the SOI layer 102, the N-type diffusion layer 88, and the first semiconductor layer 11. High concentration P-type impurity is introduced in the SOI layer 102.

FIGS. 76A to 83B are cross-sectional views of a manufacturing method of an FBC memory device of the tenth embodiment. Drawings A shown in FIGS. 76 to 83 correspond to cross-sections along the line A-A in FIG. 71. Drawings B shown in FIGS. 76 to 83 correspond to cross-sections along the line E-E in FIG. 71.

As in the manufacturing method of the eighth embodiment, an SOI substrate 99 is prepared. A silicon oxide film 103 and a silicon nitride film 104 are formed on an SOI layer 102. A resist pattern is formed so that a line-shaped region R11 along the source line shown in FIG. 71 is opened. By RIE, the silicon nitride film 104, the silicon oxide film 103, and the SOI layer 102 are etched. A trench 112 shown in FIGS. 76A and 76B is formed so as to pass through the silicon nitride film 104, the silicon oxide film 103, and the SOI layer 102.

Figures 77A, 77B:
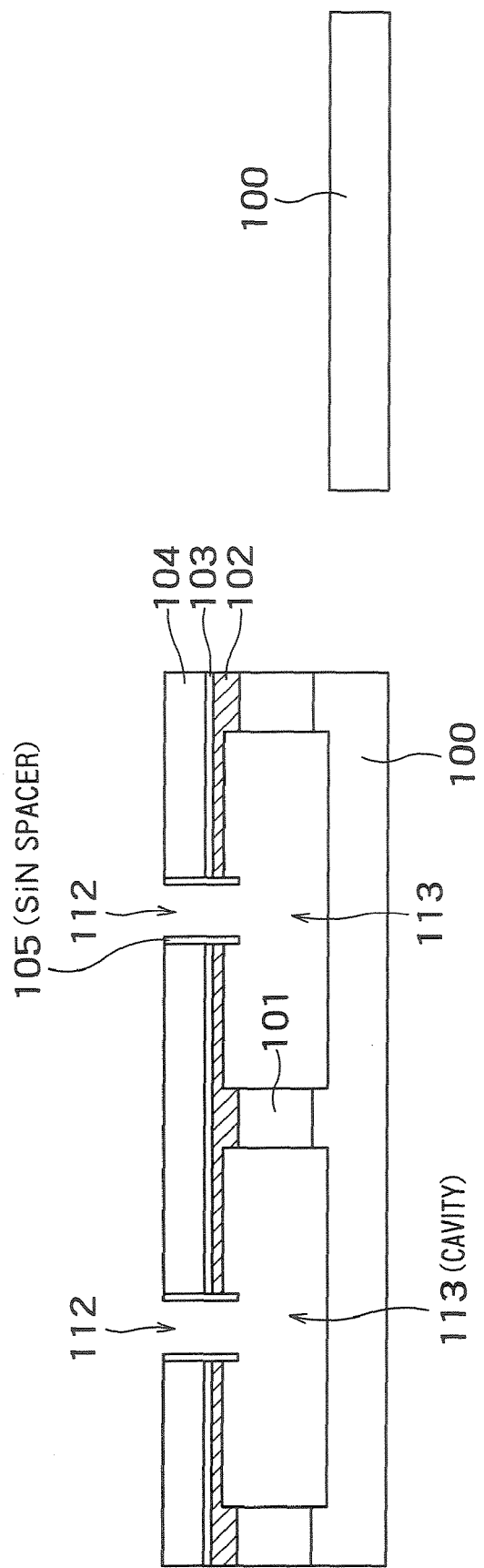

As shown in FIGS. 77A and 77B, a silicon nitride film having a thickness of about 20 nm is deposited and anisotropically etched by RIE. A spacer 105 is formed at the side surface of the trench 112. By wet etching with $NH_4F$, the BOX layer 101 is isotropically etched via the trench 112. A cavity 113 is formed under the SOI layer 102. A region where the cavity 113 is formed is indicated by the broken line in FIG. 71. The pillar of the BOX layer 101 remains under a region where the drain D is formed. The SOI layer 102 is isotropically etched if necessary. For example, the SOI layer 102 is oxidized and the silicon oxide film is removed by wet etching. Alternatively, the bottom surface of the SOI layer 102 is etched by CDE. This etching results in, e.g., about 25 nm-thick SOI layer 102 in the region where the body B is formed. The body B having thinner film thickness improves characteristics of the memory cell, as described above.

Meanwhile, the SOI layer (not shown) in the logic circuit area is not etched. While the SOI layer in the logic circuit area is relatively thick, only the SOI layer in the memory cell area is etched to be thin. According to this manufacturing method, the SOI layers in the memory cell area and the logic circuit area have optimum film thicknesses without new lithography step. The height of the surface of the SOI layer in the memory cell area is made to be the same level as that of the surface of the SOI layer in the logic circuit area. Problems about deterioration of focus margin in the lithography step are avoided.

As shown in FIGS. 78A and 78B, the spacer 105 is then removed and the back-gate insulation film BGI and the silicon oxide film 106 with a thickness of about 8 nm are formed at the inner surface of the cavity 113 by thermal oxidization. A resist pattern covering the region R12 shown in FIG. 71 is formed and the back-gate insulation film BGI is then removed by RIE. As shown in FIG. 78A, the silicon oxide film 106 on the bottom of the cavity 113 is removed along the opening of the trench 112.

As shown in FIG. 78B, the silicon oxide film 106 in an overlapped region of the region R11 and the region R12 remains on the supporting substrate SUB, in order that epitaxial silicon is filled in the cavity 113 in the next selective epitaxial step.

Figures 79A, 79B:
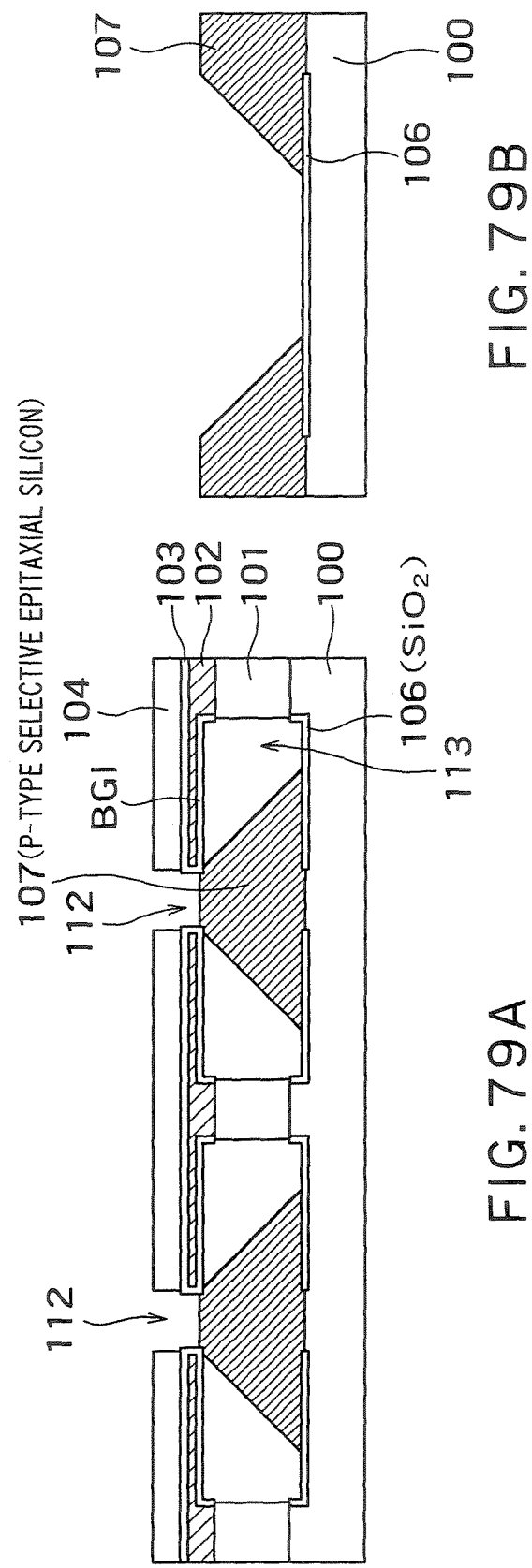

As shown in FIGS. 79A and 79B, a selective epitaxial silicon layer 107 is then formed by selective epitaxial growth. The silicon layer 107 functions as the first semiconductor layer 11. In the selective epitaxial growth, the silicon layer 107 is grown from the surface of the supporting substrate SUB just below the trench 112. The silicon layer 107 is also formed on the silicon oxide film 106 by lateral over growth. As the selective epitaxial growth proceeds, the opening of the trench 112 seems to be closed in FIG. 79A. As the silicon oxide film 106 remains in the region R12 in FIG. 71, however, the trench 112 in the region R12 is not closed. Via the trench 112 in the region R12, the cavity 113 is communicated with and opened to the outside from which gas is supplied.

As shown in FIGS. 80A and 80B, when the trench 112 in the region R12 is closed by the silicon layer 107, the lateral over growth ends. The silicon layer 107 contains, e.g., a P-type impurity having a concentration of $10^{18}$ cm$^{-3}$ or more.

By using the silicon nitride film 104 as a stopper, the silicon layer 107 is polished by CMR Etch back is performed so that the surface of the silicon layer 107 is lower than that of the back-gate insulation film BGI. The back-gate oxide film BGI formed at the side surface of the SOI layer 102 is removed. Structures shown in FIGS. 81A and 81B are obtained.

As shown in FIGS. 82A and 82B, a selective epitaxial silicon layer 114 is formed within the trench 112. Crystal growth of the silicon layer 114 occurs from the side surface of the SOI layer 102 and the top surface of the silicon layer 107. A recombination center REC is formed in the silicon layer 114. The silicon layer 114 is etched back so that the height of end of the silicon layer 114 is the same level as that of the surface of the SOI layer 102. The silicon oxide film 103 and the silicon nitride film 104 are removed. As shown in FIG. 83A, the plate PT (107) and the back-gate insulation film BGI are formed.

Figure 83B:
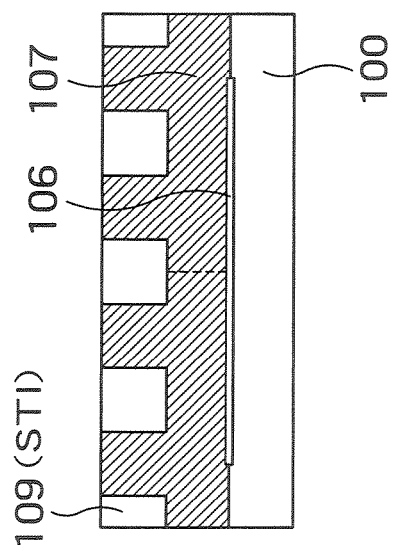
Figure 83A:
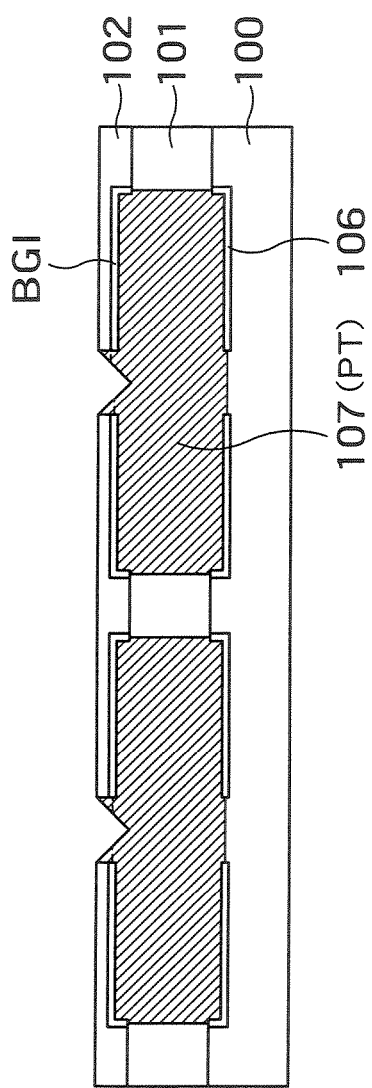

As shown in FIG. 83B, an STI 109 is formed in a non-active area. A P-type impurity is introduced in the body B (SOI layer 102) and the supporting substrate in the memory cell The impurity concentration of the body B is e.g., about $10^{18}$ cm$^{-3}$ or less. The P-type impurity is appropriately introduced in the body region of an NMOS transistor constituting the logic circuit. If the thickness of the BOX layer is equal to or more than 150 nm, wells need not be formed in the logic circuit area.

As described with reference to FIGS. 19 to 21, a gate insulation film, a gate electrode, an interlayer insulation film, a contact plug, and a bit line are formed. The FBC memory device shown in FIGS. 71 to 74 is completed.

According to the manufacturing method of the tenth embodiment, the P-type impurity concentration of the first semiconductor layer 11 is determined independently of that of the body B. The tenth embodiment accomplishes memory cells with high performance.

The silicon layer 107 functions as the plate PT, a connector layer for connecting the source layer S and the supporting substrate SUB in the memory cell, and a connector layer for adjusting the depth of supporting substrate contacts.

The tenth embodiment is utilized for an SOI substrate with thick BOX layer. While the parasitic capacitance of a logic circuit and a bit line is suppressed, thin back-gate insulation film is formed in a memory cell area. As a result, an FBC memory device with high performance is manufactured without increasing manufacturing costs.

Eleventh Embodiment

Figure 84:
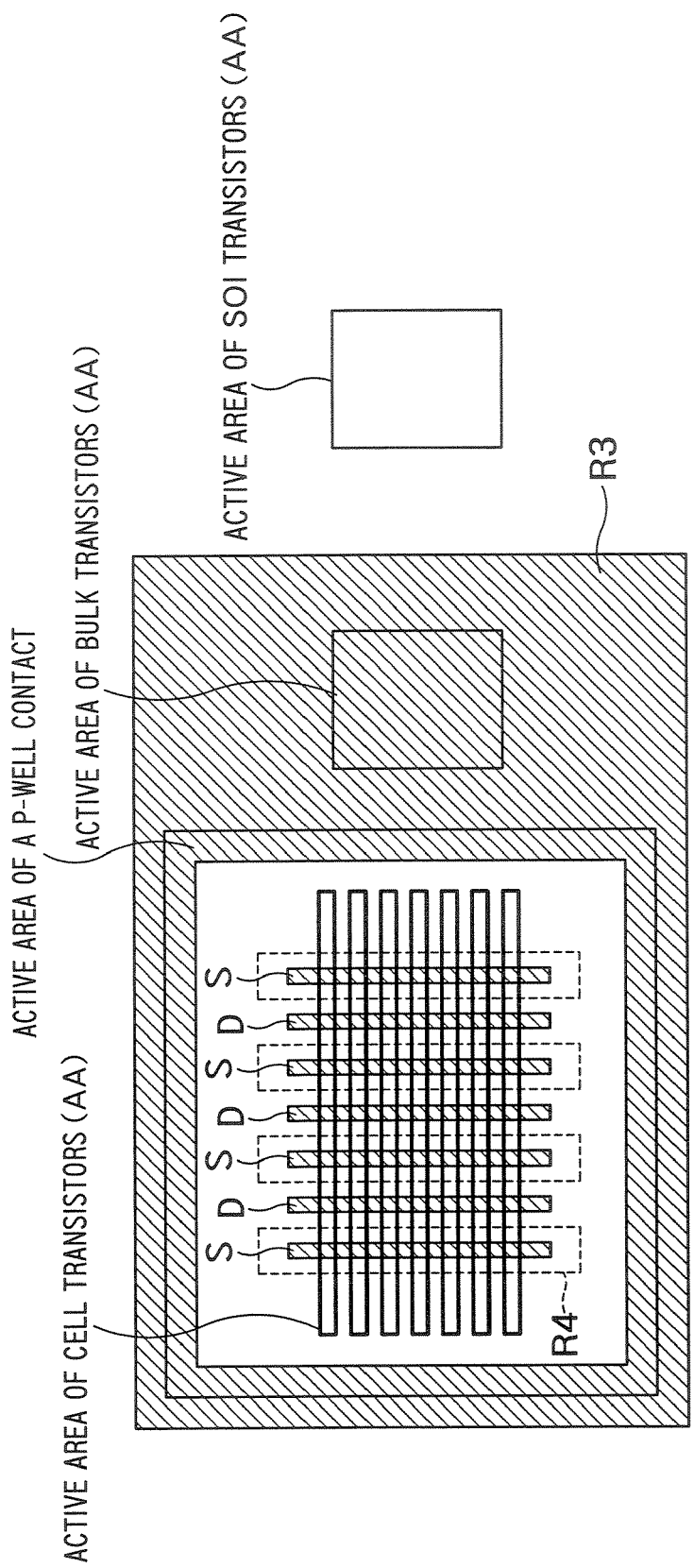
FIG. 84 is a plan view of an FBC memory device according to an eleventh embodiment of the present invention.

FIG. 84 is a plan view of an FBC memory device according to an eleventh embodiment of the present invention. In the eleventh embodiment, a logic circuit includes the SOI transistor shown in FIG. 72B and the bulk transistor shown in FIG. 4. The SOI transistor and the bulk transistor can be formed on silicon layers with different crystal orientations for improving mobility. According to the eleventh embodiment, a plate line contact PLC, a source/drain contact of the bulk transistor, and a well contact of the bulk transistor are formed at the same height level as in the configuration shown in FIG. 36. The failure rate of these contacts is decreased.

Figure 85:
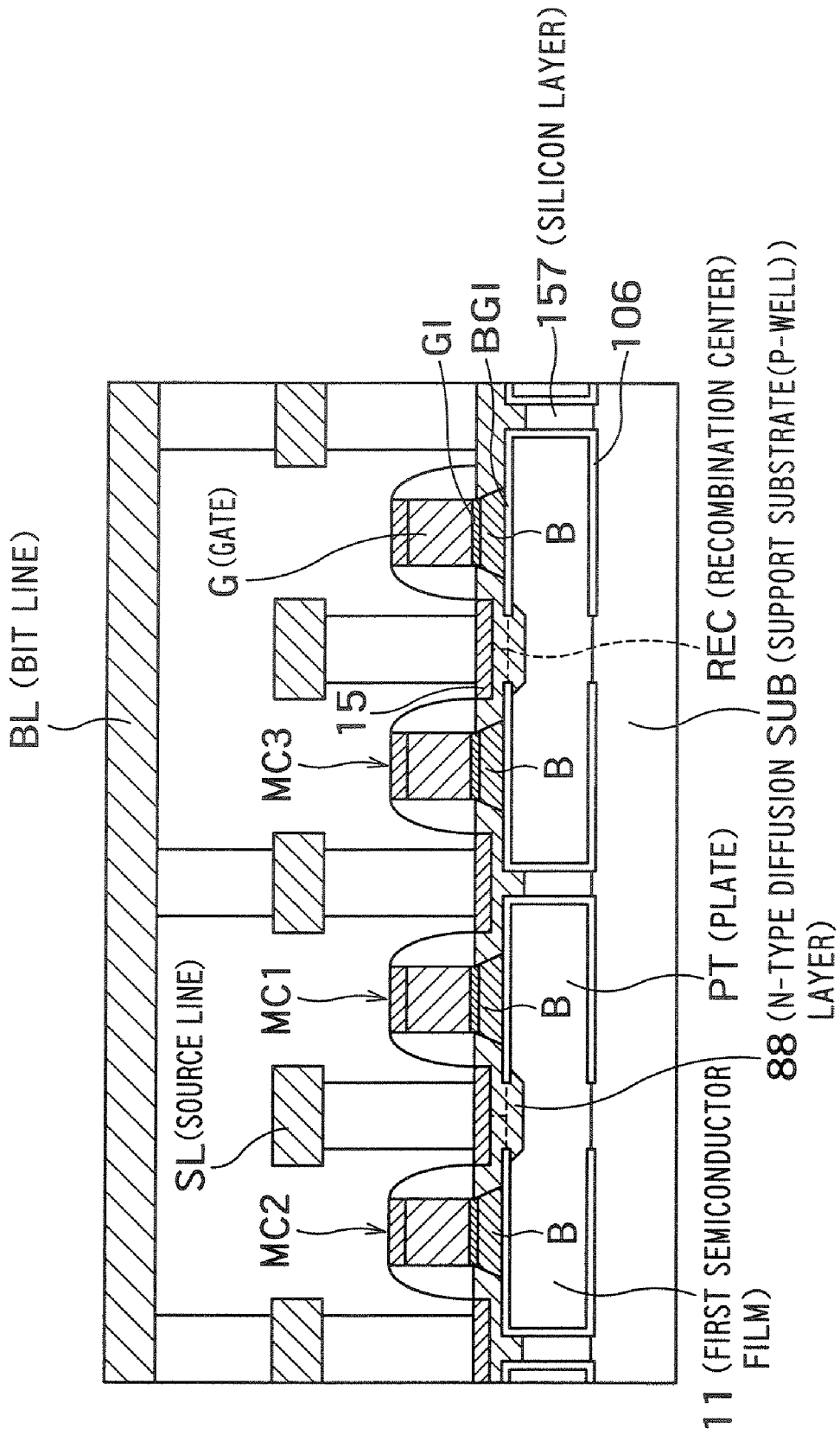
FIG. 85 is a cross-sectional view of the FBC memory device of the eleventh embodiment.

FIG. 85 is a cross-sectional view of the FBC memory device of the eleventh embodiment. A memory cell of the eleventh embodiment is different from the memory cell of the tenth embodiment in that both a source layer S and a drain layer D are connected via a PN junction to a supporting substrate SUB. According to the eleventh embodiment, bipolar disturb is further suppressed.

FIGS. 86A to 93B are cross-sectional views of a manufacturing method of an FBC memory device according to the eleventh embodiment. Drawings A of FIGS. 86 to 93 are cross-sections of a memory cell area. Drawings B of FIGS. 86 to 93 are cross-sections of a logic circuit area (region where a bulk transistor is formed).

As shown in FIGS. 86A and 86B, an SOI substrate 99 is prepared. The SOI substrate 99 includes a buried oxide film (BOX) 101 having a thickness of about 150 nm and an SOI layer 102 having a thickness of about 50 nm. On the SOI layer 102, a silicon oxide film 103 having a thickness of about 2 nm and a silicon nitride film 104 having a thickness of about 200 nm are sequentially formed. A resist pattern is formed so that the region R3 shown in FIG. 84 is opened. The silicon nitride film 104 and the silicon oxide film 103 are then etched by using RIE.

Figures 87A, 87B:
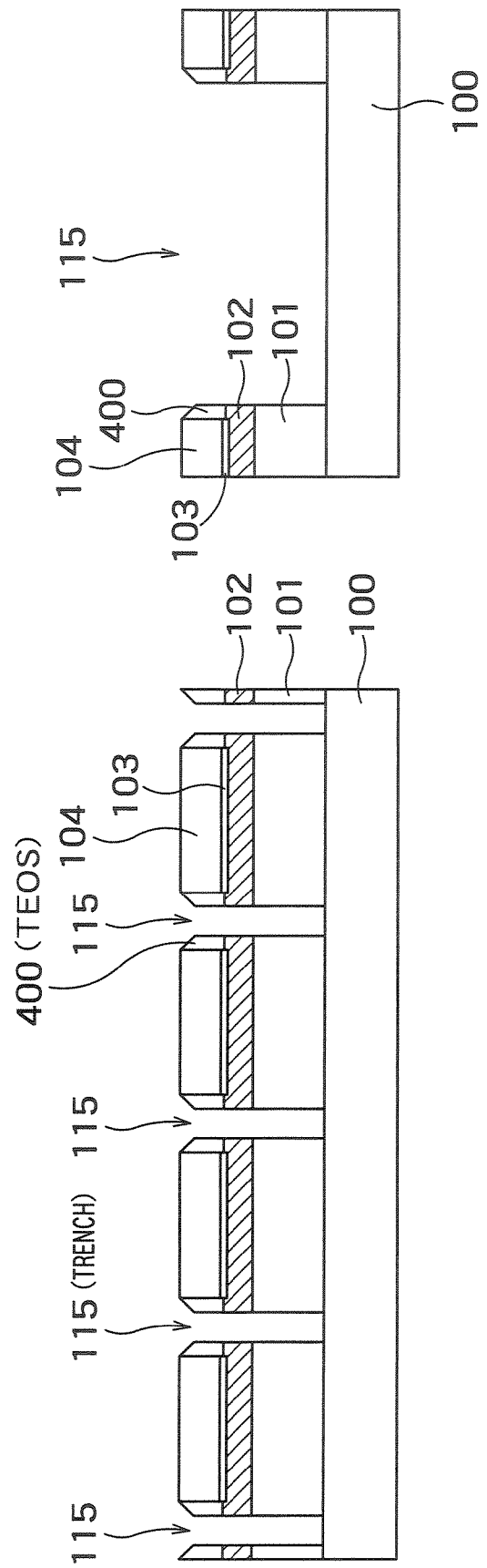

As shown in FIGS. 87A and 87B, a TEOS spacer 400 is formed at the sidewall of the silicon nitride film 104. By using the silicon nitride film 104 and the spacer 400 as a mask, the SOI layer 102 and the BOX layer 101 are anisotropically etched by RIE. A trench 115 is formed in a region where a source/drain is formed. The trench 115 can be formed so as to be narrower than the minimum space in lithography.

As shown in FIGS. 88A and 88B, a silicon oxide film 401 is formed at the side surface of the SOI layer 102. A selective epitaxial silicon layer 157 is then formed. The silicon layer 157 functions as a drain connector. The top surface of the silicon layer 157 is slightly lower than that of the SOI layer 102.

The spacer 400 and the silicon oxide film 401 are removed and selective epitaxial growth is performed again. A silicon layer 402 is deposited to the same level as the top surface of the silicon nitride film 104. The height of the silicon layer 402 is set to be equal to the height of an SiN film. An amorphous silicon 403 and a silicon nitride film 404 are deposited. Structures shown in FIGS. 89A and 89B are thus obtained.

A resist pattern is formed so that the region R4 (source region) in FIG. 84 is opened. The silicon nitride film 404, the amorphous silicon 403, and the silicon layer 402 are etched by RIE. A trench 116 is thus formed as shown in FIGS. 90A and 90B.

Figure 91B:
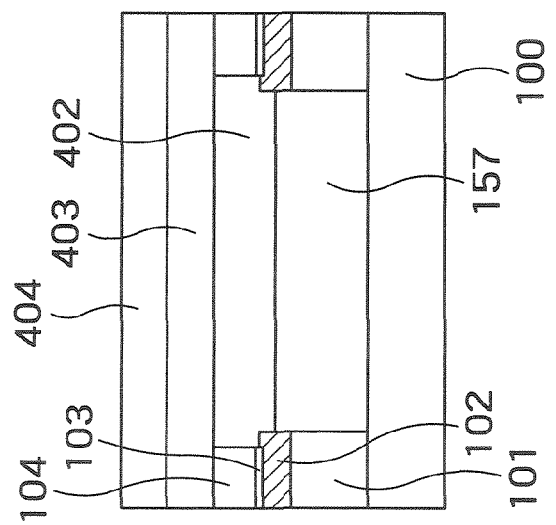
Figure 91A:
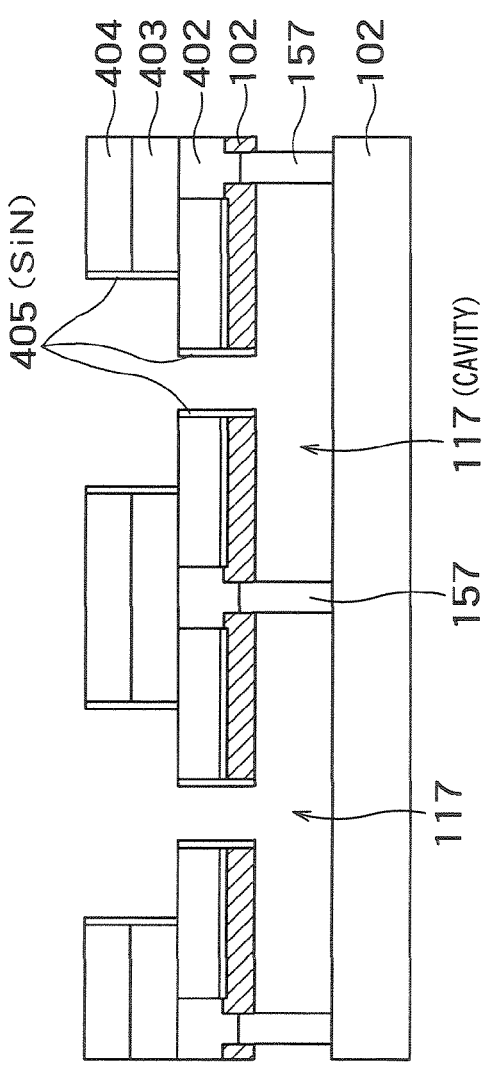

As shown in FIGS. 91A and 91B, an SiN spacer 405 is formed at the side surface of the trench 116. The silicon layer 157 in the source region is etched by RIE. The BOX layer 101 is etched by wet etching. A cavity 117 is thus formed under the SOI layer 102 (body).

As described with reference to FIGS. 78 to 81, a back-gate insulation film BGI, a silicon oxide film 106, and a selective epitaxial silicon layer 107 are formed. An amorphous silicon 408 is deposited. Structures shown in FIGS. 92A and 92B are thus obtained.

Figure 93B:
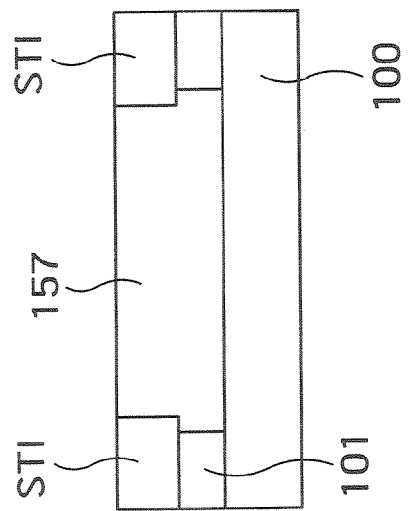
Figure 93A:
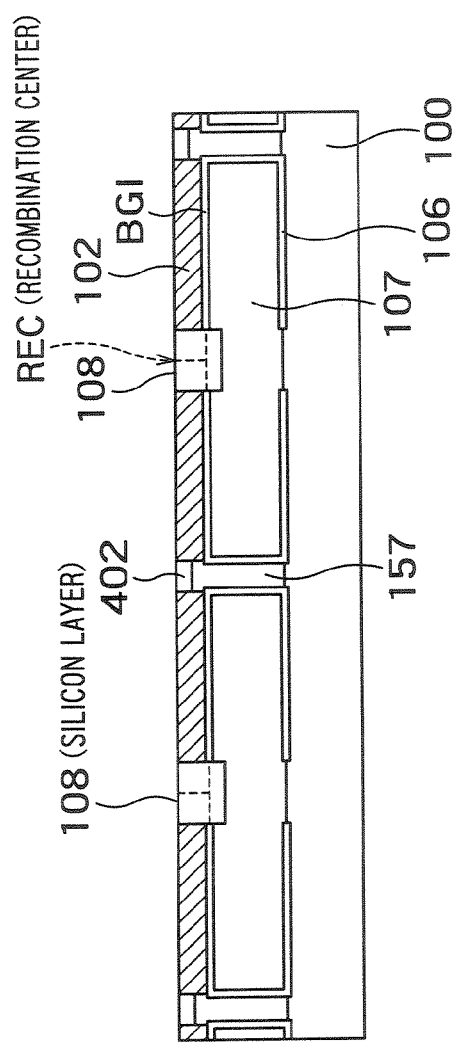

As shown in FIGS. 93A and 93B, the amorphous silicon 408 is polished by CMP, so that the surface of the SOI layer 102 is exposed.

As shown in FIGS. 93A and 93B, an element isolation STI is formed. Boron is introduced in the SOI layer 102 and the supporting substrate SUB. The amorphous silicon buried in the source region is transformed into a silicon layer 108 by thermal processing.

As described with reference to FIGS. 19 to 21, a gate insulation film, a gate electrode, silicide, an interlayer insulation film, a contact plug, and a bit line are formed. The FBC memory device shown in FIGS. 84 and 85 is thus completed.

Twelfth Embodiment

Figure 94:
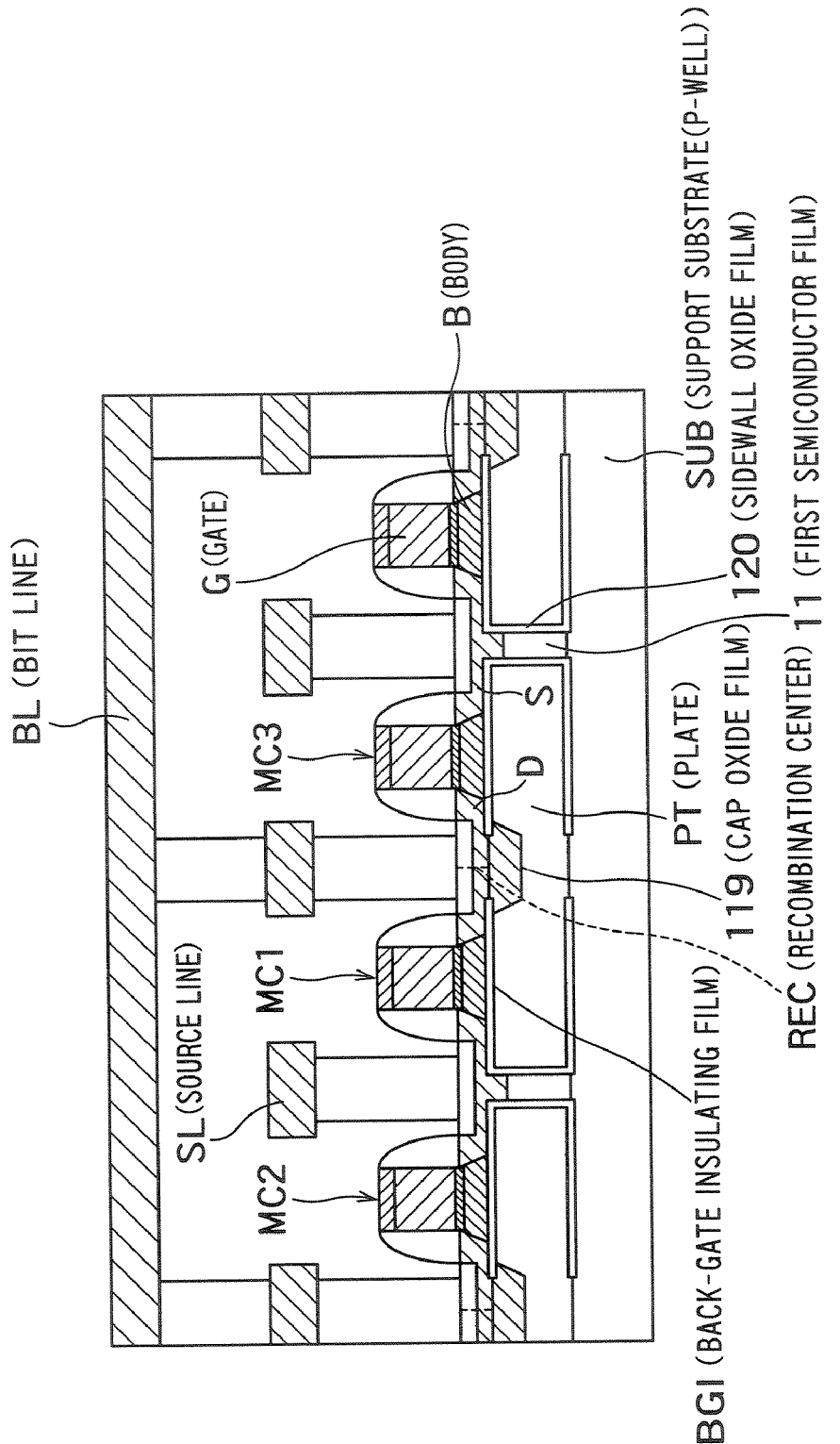
FIG. 94 is a cross-sectional view of an FBC memory device according to a twelfth embodiment of the present invention.

FIG. 94 is a cross-sectional view of an FBC memory device according to a twelfth embodiment of the present invention. In the twelfth embodiment, a source layer S is electrically connected to a supporting substrate SUB via a first semiconductor layer 11. The first semiconductor layer 11 functions as a connector layer for the source layer S. Due to this structure, bipolar disturb via the source layer S is suppressed.

A plate PT is separated from a drain layer D by a cap oxide film 119. The plate PT does not act as a connector for the drain layer D. Because the plate PT and the drain layer D are separated from each other, electrons are not supplied by the gated diode in the above-described way. Even if the P-type impurity concentration of the plate PT is increased, leakage current is not generated between the drain layer D and the plate PT.

The first semiconductor layer 11 is separated from the plate PT by a sidewall oxide film 120. Even if the P-type impurity concentration of the plate PT is increased, leakage current between the source layer S and the plate PT is not increased. The P-type impurity concentration of the plate PT is, e.g., about $10^{19}$ cm$^{-3}$ in order to increase the difference in threshold voltage $\Delta$Vth.

The plate PT can be of N-type in the twelfth embodiment. Even if an N-type plate PT is used, because of the sidewall oxide film 120 and the cap oxide film 119, a P-type isolation layer needs not be formed.

The cap oxide film 119 is thicker than a back-gate oxide film, which reduces a bit line capacitance. As a recombination center REC is provided at the center of the drain layer D, bipolar disturb via the drain layer D is suppressed.

FIGS. 95A to 98B are cross-sectional views of a manufacturing method of the twelfth embodiment. Steps shown in FIGS. 86A to 91B are performed. While the resist pattern is formed so that the source region (region R4 in FIG. 84) is opened in the step shown in FIGS. 90A and 90B, a resist pattern is formed so that a drain region is opened instead in the twelfth embodiment.

Figure 95B:
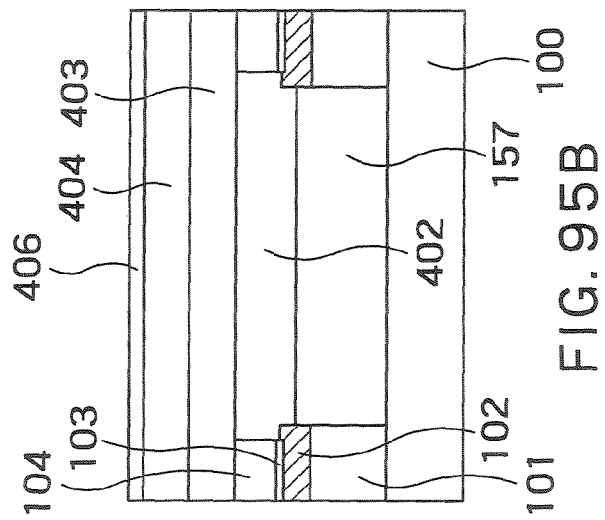
Figure 95A:
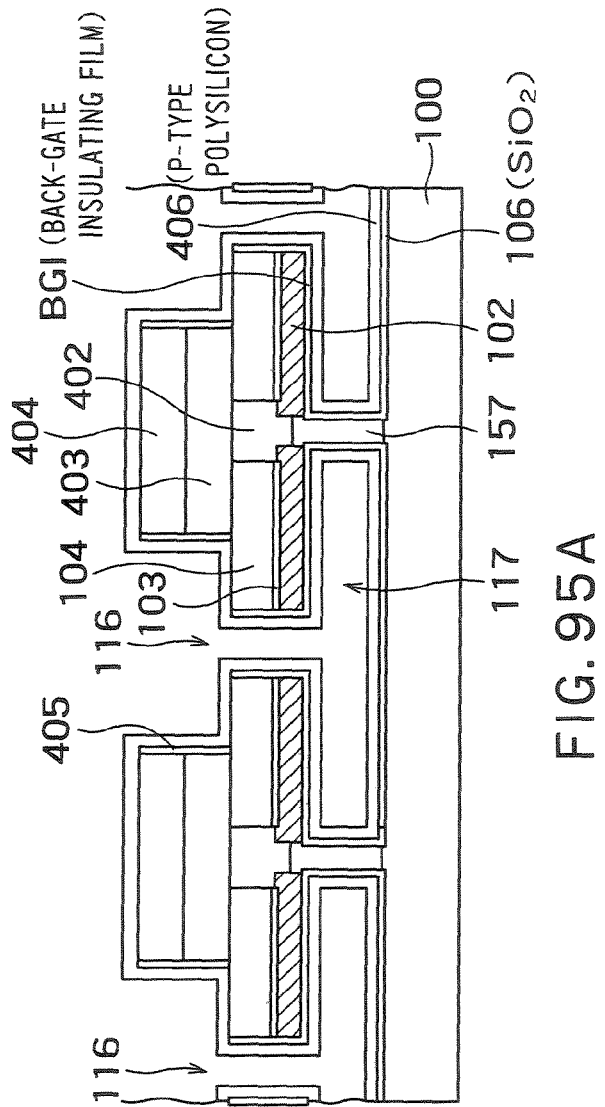

As shown in FIGS. 95A and 95B, a back-gate oxide film 106 is formed and a P-type polysilicon 406 is deposited thereon. The film thickness of the P-type polysilicon 406 is set to be less than ½ of the opening diameter of a trench 116 in order that its opening is not closed completely.

Figures 96A, 96B:
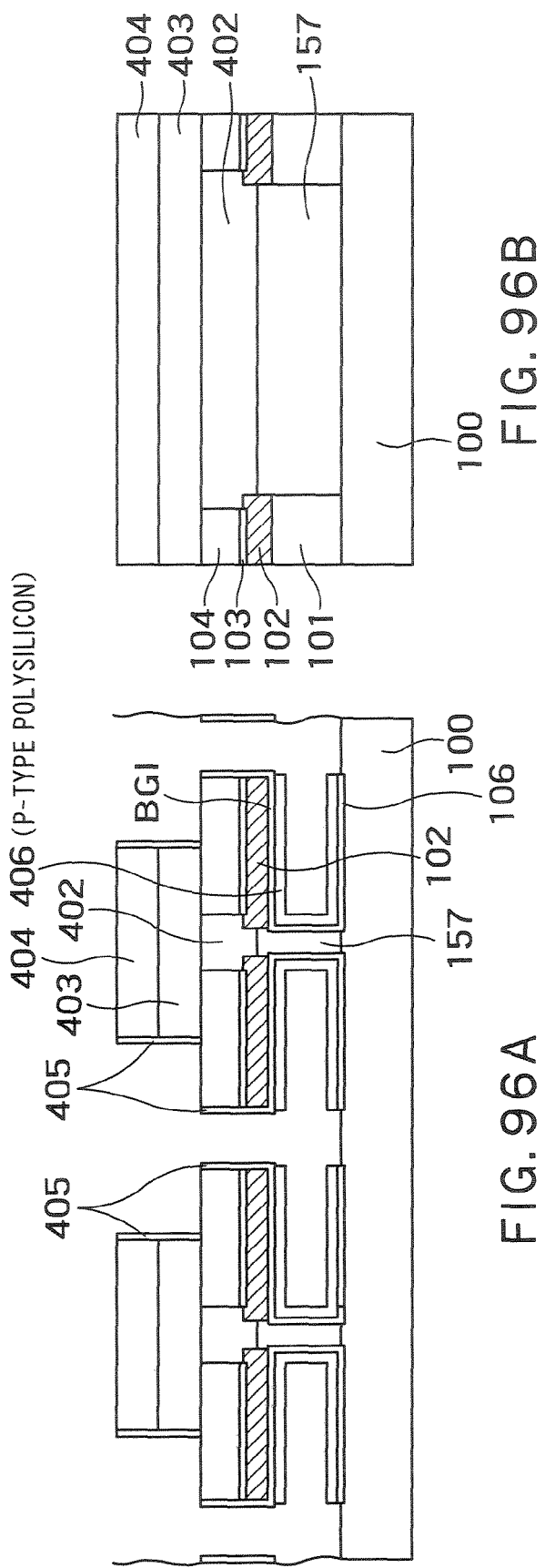

As shown in FIGS. 96A and 96B, the P-type polysilicon 406 is etched back by RIE. The back-gate oxide film 106 is removed by RIE.

As shown in FIGS. 97A and 97B, the P-type polysilicon 406 is deposited again. The polysilicon 406 is etched back by RIE so that its surface is lower than the back-gate oxide film 106.

As shown in FIGS. 98A and 98B, a cap oxide film 407 is formed by thermal oxidization. An SiN spacer 405 at the side surface of an SOI layer is removed and an amorphous silicon 408 is then deposited. The step shown in FIG. 92A and the subsequent steps in the eleventh embodiment are performed, so that the FBC memory device shown in FIG. 94 is completed.

Figure 99:
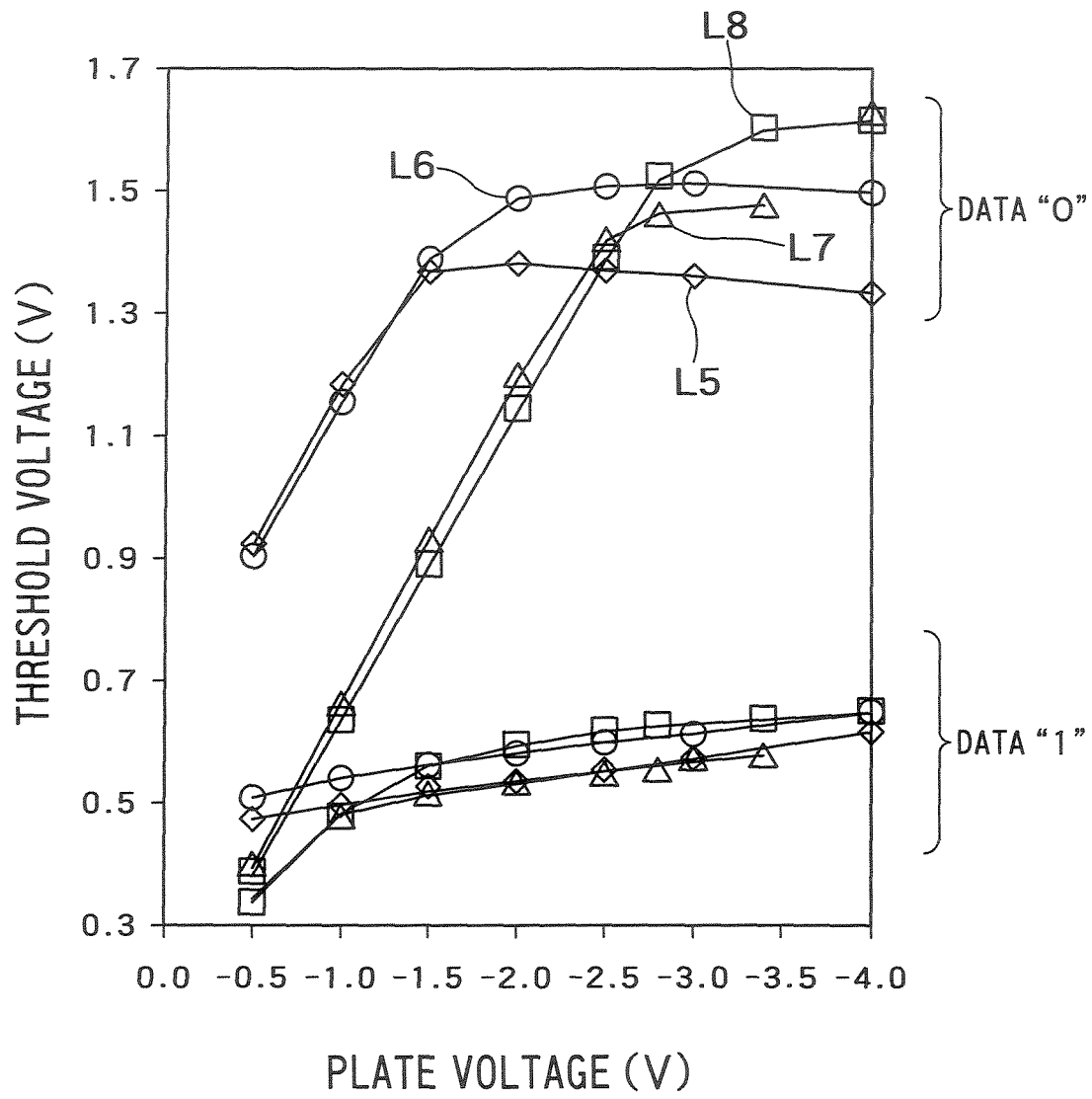
FIG. 99 is the simulated result of the relationship between a threshold voltage and a plate voltage in a data reading operation.

FIG. 99 is the simulation result of the relationship between a threshold voltage and a plate voltage (substrate voltage) in a data reading operation. Film thicknesses of an SOI layer, a back-gate insulation film, and a gate insulation film, a gate length, and the impurity concentration of a channel are the same as in the simulation in the first embodiment shown in FIG. 5B.

The line L5 indicates the result of a conventional technique that the P-type impurity concentration of a plate PT is $1 \times 10^{19}$ $cm^{-3}$. When the P-type impurity concentration of the plate is high, an inversion layer is not formed at the surface of the supporting substrate. As the result of simulation, for a plate voltage of −1.5V, ΔVth exhibits its maximum value of 0.853V.

The line L6 indicates the simulated result of a memory cell MC that the P-type impurity concentration of the plate PT is $1 \times 10^{19}$ $cm^{-3}$ according to the twelfth embodiment. The memory cell MC has the first semiconductor layer 11 connecting the source S and the supporting substrate SUB. The sidewall insulation film 120 separates the first semiconductor layer 11 from the plate PT. The cap oxide film 119 is provided under the drain D. The drain is separated from the plate PT. As the result of simulation, for a plate voltage of −2V, ΔVth exhibits its maximum value of 0.909V.

The line L7 indicates the result of another conventional technique where the N-type impurity concentration of the plate PT is $8 \times 10^{17}$ $cm^{-3}$. In this case, the surface of the supporting substrate SUB is in an accumulation state, and hence, low N-type impurity concentration does not deteriorate the difference in threshold voltage ΔVth. In this structure, when the plate voltage is −2.8V, ΔVth exhibits its maximum of 0.908V. In contrast, in the structure that the source layer S is connected via the P-type isolation layer 98 to the supporting substrate SUB as in the fifth embodiment shown in FIG. 35, the maximum difference in threshold voltage ΔVth is 0.969V.

The line L8 is the simulated result of a memory cell MC with an N-type plate PT according to the twelfth embodiment. The N-type impurity concentration of the plate PT is $8 \times 10^{17}$ $cm^{-3}$. The memory cell MC has the first semiconductor layer 11 connecting the source S and the supporting substrate SUB. The sidewall insulation film 120 separates the first semiconductor layer 11 and the N-type plate PT. The cap oxide film 119 is provided under the drain D. The drain is thus separated from the N-type plate PT. As the result of simulation, for a plate voltage of −4V, the maximum difference in threshold voltage ΔVth is 0.967V.

In calculation for the N-type plate, the word line voltage of 2V is applied at the time of writing shown in FIG. 5C, so that high threshold voltage of data "0", e.g. 1.7V or higher, has no difficulty in reading/writing operation.

Thirteenth Embodiment

Figures 100A, 100B:
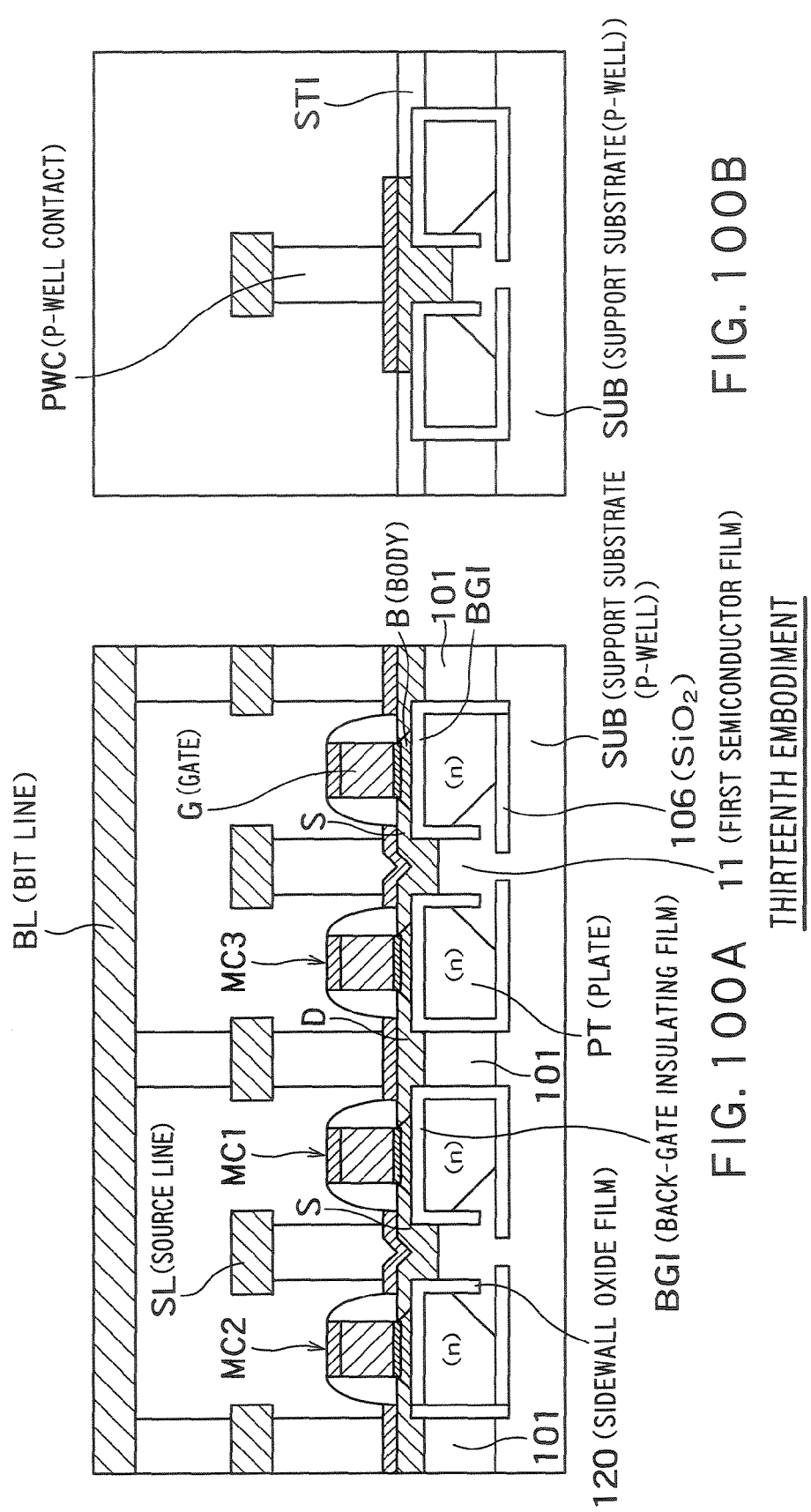
FIGS. 100A and 100B are cross-sectional views of an FBC memory device according to a thirteenth embodiment of the present invention.

FIGS. 100A and 100B are cross-sectional views of an FBC memory device according to a thirteenth embodiment of the present invention. In the thirteenth embodiment, a plate PT is surrounded by a back-gate insulation film BGI, a silicon oxide film 106, and a sidewall insulation film 120. A part of the plate PT is separated from a first semiconductor layer 11 via a PN junction. The plate PT just under a body B is made of an N-type semiconductor. In order to separate the N-type semiconductor in the surface of the plate PT from a source layer S, the sidewall insulation film 120 is formed at the side surface of the first semiconductor layer 11. The back-gate insulation film BGI, the silicon oxide film 106, and the sidewall insulation film 120 are made of the same materials. The source layer S is connected to the first semiconductor layer 11. The first semiconductor layer 11 functions as a connector for connecting the source layer S to a P-type well (supporting substrate SUB).

FIG. 100B is a cross-sectional view of a P well contact area. The P well contact PWC is provided to apply potential to the P-type well formed in the supporting substrate SUB. Lower potential than that of the source layer S is applied to the P-type well. Reverse bias is applied to a PN junction formed between the source layer S of the memory cell and the first semiconductor layer 11.

Figure 101:
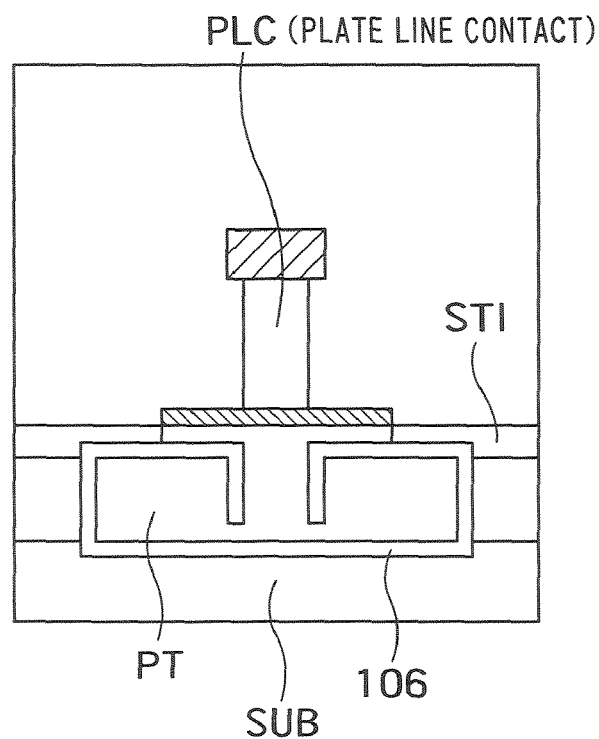
FIGS. 101 and 102 are cross-sectional views of a region of a plate line contact PLC.
Figure 102:
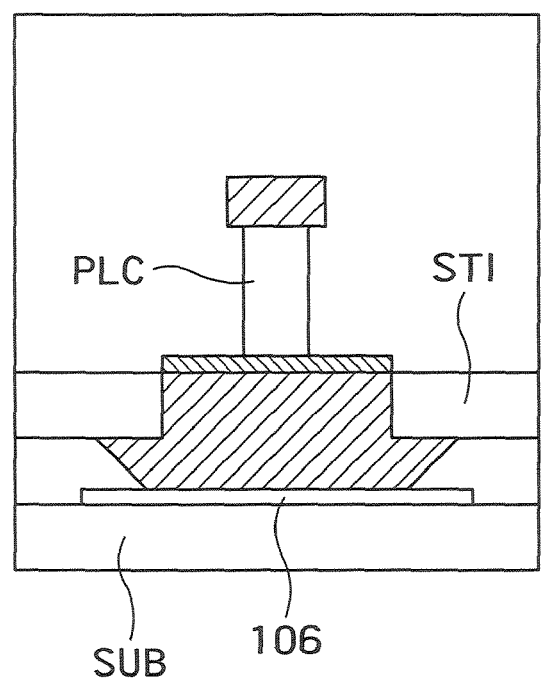

FIGS. 101 and 102 are cross-sectional views of a region of a plate line contact PLC. The plate line contact PLC is provided to apply potential to the plate PT. The potential of the plate PT can be the same as that of the P-type well or can be higher than that of the P-type well.

FIGS. 103A to 109B are cross-sectional views of a manufacturing method of an FBC memory device according to the thirteenth embodiment. As in the manufacturing method of the tenth embodiment, an SOI substrate 99 is prepared, and a silicon oxide film 103 and a silicon nitride film 104 are formed on an SOI layer 102. A trench 121 is formed in a region where a source layer S is formed. The silicon nitride film 104, the silicon oxide film 103, and the SOI layer 102 in the source region are etched by RIE. The top of the BOX layer 101 is also removed. The trench 121 is formed so as to pass through the silicon nitride film 104, the silicon oxide film 103 and the SOI layer 102 to the middle of the BOX layer 101.

Figures 104A, 104B:
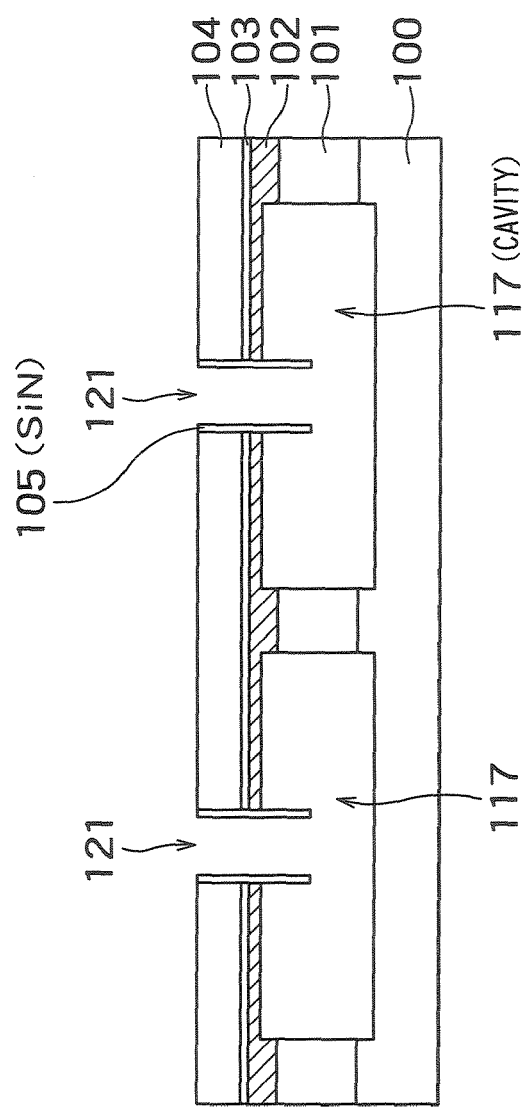

As shown in FIGS. 104A and 104B, an SiN spacer 105 is formed at the side surface of the trench 121. The BOX layer 101 is isotropically etched using the trench 121. A cavity 117 is thus formed under a region where a body B is formed.

As shown in FIGS. 105A and 105B, a silicon oxide film 200 is deposited on the inner surface of the cavity 117 by CVD. The film thickness of the silicon oxide film 200 is e.g., about 8 nm. The silicon oxide film 200 is made into a back-gate insulation film BGI, a sidewall insulation film 120, and a silicon oxide film 106.

Figures 106A, 106B:
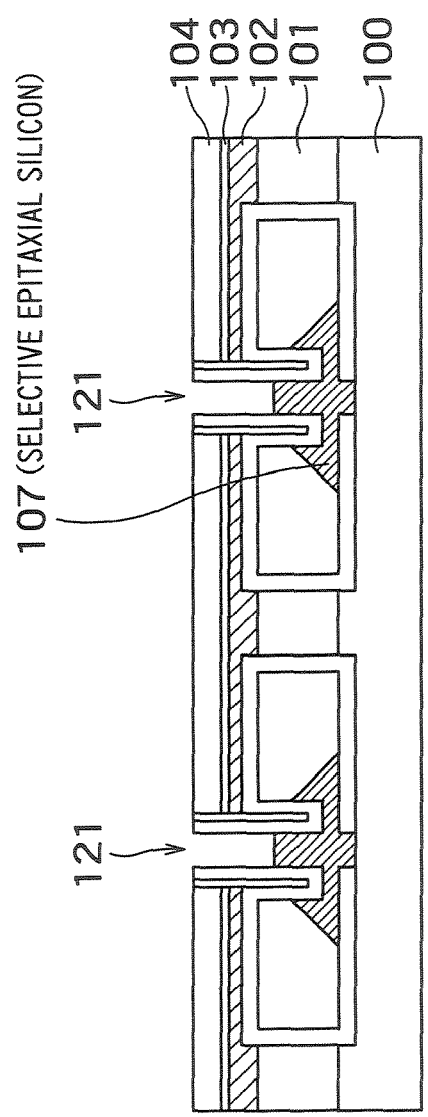

As shown in FIGS. 106A and 106B, a selective epitaxial silicon layer 107 is formed as in the tenth embodiment. As shown in FIGS. 107A and 107B, an N-type polysilicon 201 is deposited. The N-type polysilicon 201 is, e.g., phosphorus-doped polysilicon or arsenic-doped polysilicon.

The N-type polysilicon 201 is etched back so that its surface is lower than that of the back-gate oxide film BGI. The silicon oxide film 106 and the spacer 105 deposited on the side surface of the trench 121 are removed, so that the side surface of the SOI layer 102 is exposed as shown in FIGS. 108A and 108B.

As in the eighth embodiment, a silicon layer 108 is formed. As shown in FIGS. 109A and 109B, the SOI layer 102 and the selective epitaxial silicon layer 107 are connected.

As described with reference to FIGS. 19 to 21, a gate insulation film, a gate electrode, silicide, an interlayer insulation film, a contact plug, and a bit line are formed. The FBC memory device shown in FIGS. 100A and 100B is completed.

Fourteenth Embodiment

Figure 110B:
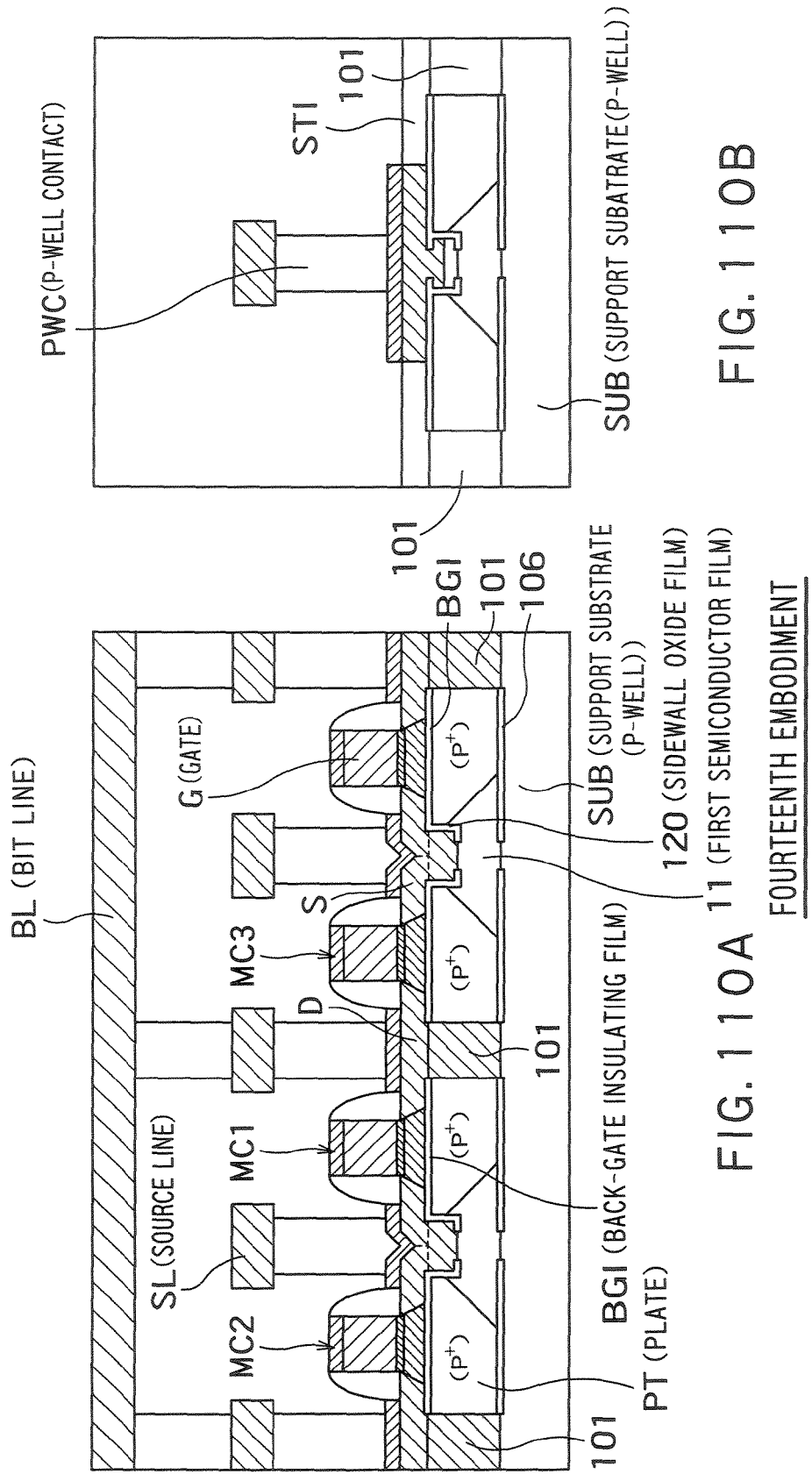
Figures 111A, 111B:
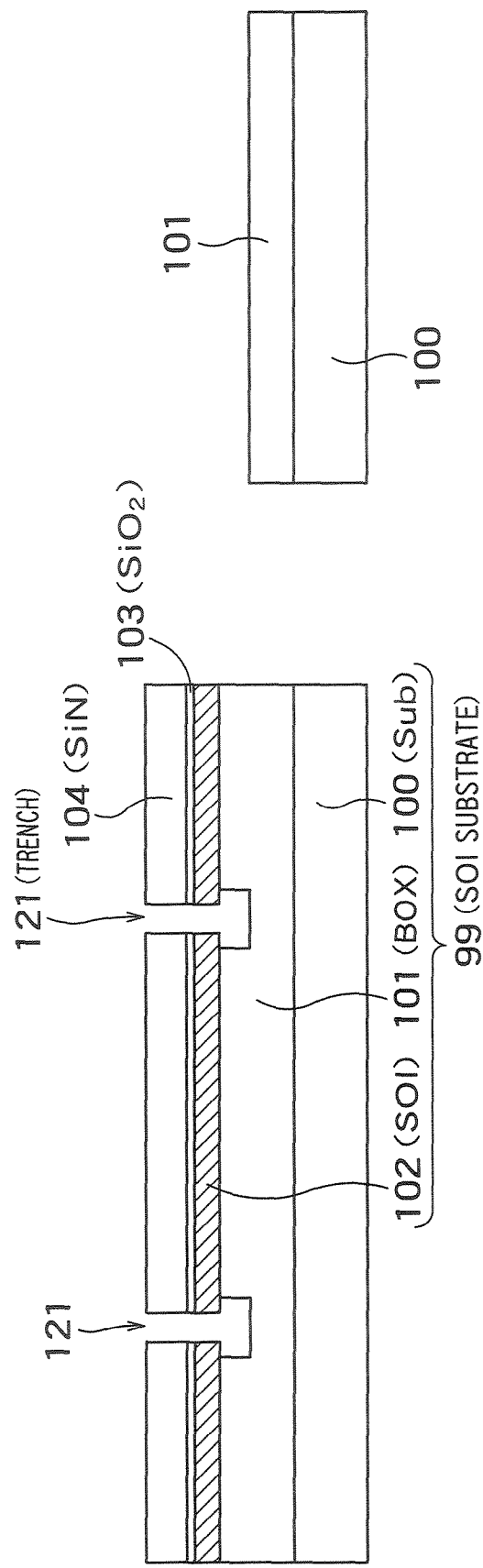

FIGS. 110A and 110B are cross-sectional views of an FBC memory device according to a fourteenth embodiment of the present invention. In the fourteenth embodiment, the surface of a plate PT just under a body B is a P-type semiconductor. The P-type impurity concentration of the plate PT is equal to or higher than $10^{19}$ cm$^{-3}$ in order to increase the difference in threshold voltage ΔVth for FBC memories.

An N-type source layer S is connected to a connector layer 11. The N-type impurity concentration of the source layer S is equal to or higher than $10^{20}$ cm$^{-3}$. A sidewall insulation film 120 is formed so that the plate PT in high concentration P-type region is not directly connected to the source layer S in high concentration N-type region. In the fourteenth embodiment, the sidewall insulation film 120 is made of materials different from those of a back-gate insulation film BGI. The P-type impurity concentration of the first semiconductor layer 11 is equal to or lower than about $10^{18}$ cm$^{-3}$. The first semiconductor layer 11 functions as a connector between the source layer S and a P-type well. As the impurity concentration of the first semiconductor layer 11 is made to be lower than that of the plate PT, an increase in leakage current at a PN junction between the source layer S and the P-type well is suppressed. According to the fourteenth embodiment, the leakage current between the source and the supporting substrate can be suppressed while the difference in threshold voltage ΔVth for memory cells is increased.

FIGS. 111A to 114B are cross-sectional views of a manufacturing method of an FBC memory device of the fourteenth embodiment. As in the manufacturing method of the tenth embodiment, an SOI substrate 99 is prepared. On an SOI layer 102, a silicon oxide film 103 and a silicon nitride film 104 are formed. The silicon nitride film 104, the silicon oxide film 103, and the SOI layer 102 in a source region are etched by RIE. A trench 121 is thus formed in the region where the source layer S is formed. The width of the trench 121 is formed to be narrower than the minimum spacing in photolithography by using a spacer (not shown). The top of the BOX layer 101 is isotropically etched. The trench 122 is thus formed so as to pass through the silicon nitride film 104, the silicon oxide film 103, and the SOI layer 102 to the middle of the BOX layer 101.

As shown in FIGS. 112A and 112B, an SiN spacer 105 is formed at the side surface of the trench 121. The BOX layer 101 is isotropically etched using the trench 121. A cavity 117 is thus formed under a region where a body B is formed.

A silicon oxide film 106 and a back-gate insulation film BGI are formed at the inner surface of the cavity 117 by thermal oxidation. The film thickness of the silicon oxide film 106 is about 8 nm.

As shown in FIGS. 113A and 113B, selective epitaxial silicon layers 107 and 300 are formed as in the tenth embodiment. The silicon layer 107 is undoped silicon into which impurities are not introduced. The silicon layer 300 is doped silicon into which boron having a concentration of $10^{19}$ cm$^{-3}$ or higher is introduced. The silicon layer 300 is etched back so that its surface is at lower level than that of the back-gate insulation film BGI.

The back-gate insulation film 106 and the SiN spacer 105 formed at the side surface of the SOI layer 102 are removed. A silicon layer 108 is formed as in the eighth embodiment. As shown in FIGS. 114A and 114B, the SOI layer 102 is connected to the silicon layer 107. As described with reference to FIGS. 19 to 21, an STI, a gate insulation film, a gate electrode, silicide, an interlayer insulation film, a contact plug, and a bit line are formed. The FBC memory device shown in FIGS. 110A and 110B is completed.

The invention claimed is:

1. A semiconductor memory device, comprising:
   a supporting substrate including semiconductor materials;
   an insulation film provided above the supporting substrate;
   a first semiconductor layer penetrating the insulation film;
   a second semiconductor layer provided on the insulation film, the second semiconductor layer including a drain diffusion layer, a source diffusion layer and a body region provided between the drain and the source diffusion layers, the body region being in an electrically floating state and accumulating or releasing electric charges for storing data;
   a gate insulation film provided on the body region; and
   a gate electrode provided on the gate insulation film,
   wherein the first semiconductor layer electrically connects the source diffusion layer to the supporting substrate to release electric charges from the source diffusion layer, and the drain diffusion layer is provided on the insulation film and electrically insulated from the supporting substrate.

2. The semiconductor memory device according to claim 1, further comprising:
   a spacer formed at a side surface of an opening formed in the insulation film.

3. The semiconductor memory device according to claim 1, further comprising:
   an element isolation to isolate a plurality of memory transistors, each memory transistor including the drain diffusion layer, the source diffusion layer and the body region, wherein a bottom surface of the element isolation is provided at a higher level than a surface of the supporting substrate.

4. The semiconductor memory device according to claim 1, further comprising:
   an additional diffusion layer formed in the supporting substrate and connected to the first semiconductor layer, the additional diffusion layer having a conductivity type opposite to that of the source diffusion layer.

5. The semiconductor memory device according to claim 4, wherein the drain diffusion layer and the source diffusion layer are provided in a same plane parallel to the supporting substrate.

6. The semiconductor memory device according to claim 4, further comprising:
   a contact that applies a voltage to the additional diffusion layer in a periphery of an array of memory transistors, each memory transistor having the drain and the source diffusion layers, the first semiconductor layer connecting the source diffusion layer to the supporting substrate, the body, and the gate electrode; and
   a semiconductor portion formed between the contact and the supporting substrate penetrating the insulation film, a top surface of the semiconductor portion being provided at a same level as a top surface of the first semiconductor layer.

7. The semiconductor memory device according to claim 1, wherein the first semiconductor layer is in contact with a side surface of the source diffusion layer, the side surface of the source diffusion layer facing to an extending direction of the gate electrode.

8. A semiconductor memory device, comprising:
- a supporting substrate including semiconductor materials;
- an insulation film provided above the supporting substrate;
- a plate including semiconductor materials and provided between the supporting substrate and the insulation film;
- a first semiconductor layer penetrating the plate;
- a second semiconductor layer provided on the insulation film, the second semiconductor layer including a drain diffusion layer, a source diffusion layer and a body region provided between the drain and the source diffusion layers, the body region being in an electrically floating state and accumulating or releasing electric charges for storing data;
- a gate insulation film provided on the body region; and
- a gate electrode provided on the gate insulation film, wherein the first semiconductor layer electrically connects the source diffusion layer to the supporting substrate to release electric charges from the source diffusion layer, and the drain diffusion layer is provided on the insulation film and electrically insulated from the supporting substrate.

9. The semiconductor memory device according to claim 8, further comprising:
- a spacer formed at a side surface of an opening formed in the insulation film.

* * * * *